United States Patent
Nagasaka et al.

(10) Patent No.: US 8,698,998 B2
(45) Date of Patent: Apr. 15, 2014

(54) EXPOSURE APPARATUS, METHOD FOR CLEANING MEMBER THEREOF, MAINTENANCE METHOD FOR EXPOSURE APPARATUS, MAINTENANCE DEVICE, AND METHOD FOR PRODUCING DEVICE

(75) Inventors: Hiroyuki Nagasaka, Kumagaya (JP); Kenichi Shiraishi, Saitama (JP); Soichi Owa, Kumagaya (JP); Shigeru Hirukawa, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/822,964

(22) Filed: Jul. 11, 2007

(65) Prior Publication Data

US 2007/0258072 A1    Nov. 8, 2007

Related U.S. Application Data

(62) Division of application No. 11/630,110, filed as application No. PCT/JP2005/011305 on Jun. 21, 2005.

(30) Foreign Application Priority Data

Jun. 21, 2004 (JP) ................. 2004-182343
Aug. 17, 2004 (JP) ................. 2004-237343
Nov. 11, 2004 (JP) ................. 2004-327787

(51) Int. Cl.
*G03B 27/52* (2006.01)
*G03B 27/42* (2006.01)
*G03B 27/54* (2006.01)
*G03B 27/32* (2006.01)
*G03F 7/20* (2006.01)

(52) U.S. Cl.
CPC ............ *G03F 7/70925* (2013.01); *G03F 7/707* (2013.01); *G03F 7/70341* (2013.01)

USPC .................... 355/30; 355/53; 355/67; 355/77

(58) Field of Classification Search
CPC .. G03F 7/707; G03F 7/70925; G03F 7/70341
USPC ............ 355/30, 53, 67, 71, 72, 77; 356/237.4
See application file for complete search history.

(56) References Cited

U.S. PATENT DOCUMENTS 4,346,164 A    8/1982  Tabarelli et al.
4,480,910 A    11/1984 Takanashi et al.
(Continued)

FOREIGN PATENT DOCUMENTS

DE    221563 A1    4/1985
DE    224448 A1    7/1985
(Continued)

OTHER PUBLICATIONS

Mar. 23, 2010 Office Action issued in U.S. Appl. No. 11/630,110.
(Continued)

*Primary Examiner* — Steven H Whitesell Gordon
(74) *Attorney, Agent, or Firm* — Oliff PLC

(57) ABSTRACT

An exposure apparatus EXS forms an immersion area AR2 of a liquid LQ on the side of the image plane of a projection optical system PL and performs exposure of a substrate P via the projection optical system PL and the liquid LQ of the immersion region AR2. The exposure apparatus EXS has an optical cleaning unit (80) which irradiates a predetermined irradiation light Lu, having an optical cleaning effect, onto, for example, the upper surface (31) of the substrate stage PST which makes contact with the liquid LQ for forming the immersion area AR2. Thus, it is possible to prevent deterioration of the exposure accuracy and measurement accuracy due to pollution of the member in contact with the liquid in the immersion region.

29 Claims, 16 Drawing Sheets

(56) References Cited

U.S. PATENT DOCUMENTS

| | | | |
|---|---|---|---|
| RE32,795 E | 12/1988 | Matsuura et al. | |
| 4,825,453 A | 4/1989 | Kembo et al. | |
| 5,493,403 A | 2/1996 | Nishi | |
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukuda et al. | |
| 5,825,043 A | 10/1998 | Suwa | |
| 5,874,820 A | 2/1999 | Lee | |
| 6,268,904 B1 | 7/2001 | Mori et al. | |
| 6,307,620 B1 * | 10/2001 | Takabayashi et al. | 355/72 |
| 6,392,738 B1 * | 5/2002 | van de Pasch et al. | 355/30 |
| 6,496,257 B1 | 12/2002 | Taniguchi et al. | |
| 6,778,257 B2 | 8/2004 | Bleeker et al. | |
| 6,867,844 B2 | 3/2005 | Vogel et al. | |
| 6,952,253 B2 | 10/2005 | Lof et al. | |
| 7,075,616 B2 | 7/2006 | Derksen et al. | |
| 7,199,858 B2 * | 4/2007 | Lof et al. | 355/30 |
| 7,224,427 B2 | 5/2007 | Chang et al. | |
| 7,317,504 B2 | 1/2008 | De Smit et al. | |
| 7,423,731 B2 | 9/2008 | Tanitsu et al. | |
| 7,450,217 B2 * | 11/2008 | Boogaard et al. | 355/53 |
| 7,599,545 B2 | 10/2009 | Shibata et al. | |
| 7,798,159 B2 | 9/2010 | Palfy et al. | |
| 2001/0043320 A1 * | 11/2001 | Kato et al. | 355/67 |
| 2003/0011763 A1 | 1/2003 | Taniguchi et al. | |
| 2003/0066975 A1 * | 4/2003 | Okada | 250/492.2 |
| 2003/0147058 A1 | 8/2003 | Murakami et al. | |
| 2004/0021061 A1 * | 2/2004 | Bijkerk | 250/214 R |
| 2004/0165159 A1 | 8/2004 | Lof et al. | |
| 2004/0211920 A1 * | 10/2004 | Derksen et al. | 250/492.1 |
| 2005/0024609 A1 | 2/2005 | De Smit et al. | |
| 2005/0025108 A1 | 2/2005 | Dillinger et al. | |
| 2005/0134815 A1 * | 6/2005 | Van Santen et al. | 355/30 |
| 2005/0205108 A1 | 9/2005 | Chang et al. | |
| 2006/0028626 A1 | 2/2006 | Chang et al. | |
| 2006/0028628 A1 | 2/2006 | Lin et al. | |
| 2006/0077367 A1 | 4/2006 | Kobayashi et al. | |
| 2006/0132731 A1 | 6/2006 | Jansen et al. | |
| 2006/0152696 A1 | 7/2006 | Boogaard et al. | |
| 2007/0127001 A1 | 6/2007 | Van Der Hoeven | |
| 2009/0027636 A1 | 1/2009 | Leenders et al. | |

FOREIGN PATENT DOCUMENTS

| | | |
|---|---|---|
| EP | 1 329 773 A2 | 7/2003 |
| EP | 1 420 299 A2 | 5/2004 |
| EP | 1 586 386 | 10/2005 |
| EP | 1 672 682 A1 | 6/2006 |
| JP | A 57-117238 | 7/1982 |
| JP | A 58-202448 | 11/1983 |
| JP | A 59-019912 | 2/1984 |
| JP | A 62-065326 | 3/1987 |
| JP | A 62-183522 | 8/1987 |
| JP | A 63-157419 | 6/1988 |
| JP | A-10-303114 | 11/1988 |
| JP | A 04-65603 | 3/1992 |
| JP | A 04-305915 | 10/1992 |
| JP | A 04-305917 | 10/1992 |
| JP | A 05-62877 | 3/1993 |
| JP | A 06-53120 | 2/1994 |
| JP | A 06-124873 | 5/1994 |
| JP | A 06-188169 | 7/1994 |
| JP | A 07-176468 | 7/1995 |
| JP | A 07-220990 | 8/1995 |
| JP | A 08-37149 | 2/1996 |
| JP | A-H8-115868 | 5/1996 |
| JP | A 08-166475 | 6/1996 |
| JP | A 08-316125 | 11/1996 |
| JP | A 08-330224 | 12/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-16816 | 1/1999 |
| JP | A-H-11-052102 | 2/1999 |
| JP | A-11-135400 | 5/1999 |
| JP | A 11-135400 | 5/1999 |
| JP | A-11-162831 | 6/1999 |
| JP | A 11-176727 | 7/1999 |
| JP | A 2000-058436 | 9/1999 |
| JP | A-11-283903 | 10/1999 |
| JP | A 2000-505958 | 5/2000 |
| JP | A-2001-170495 | 6/2001 |
| JP | 2001291855 A * | 10/2001 |
| JP | A 2002-14005 | 1/2002 |
| JP | A-2004-289128 | 10/2004 |
| JP | A-2005-005713 | 1/2005 |
| JP | A 2005-072404 | 3/2005 |
| JP | A 2005-079222 | 3/2005 |
| WO | WO 99/49504 A1 | 9/1999 |
| WO | WO 01/35168 | 5/2001 |
| WO | WO 2004/019128 | 3/2004 |
| WO | WO 2004/050266 | 6/2004 |
| WO | WO 2004/051717 | 6/2004 |
| WO | WO 2004/093130 A2 | 10/2004 |
| WO | WO 2004/105107 A1 | 12/2004 |
| WO | WO 2005/036623 A1 | 4/2005 |

OTHER PUBLICATIONS

U.S. Appl. No. 12/656,456, filed Jan. 29, 2010.
Dec. 10, 2009 Office Action in U.S. Appl. No. 11/630,110.
Sep. 30, 2009 Office Action in U.S. Appl. No. 12/155,742.
Oct. 14, 2005 International Search Report issued in PCT/JP2005/011305.
Notice of Reasons for Rejection issued in Japanese Patent Application No. 2005-77601 dated Aug. 3, 2010 (with translation).
Sep. 28, 2010 Office Action issued in U.S. Appl. No. 12/155,742.
Nov. 18, 2010 Office Action issued in U.S. Appl. No. 11/630,110.
Jun. 7, 2011 Office Action issued in U.S. Appl. No. 11/630,110.
Jun. 12, 2009 Supplemental Search Report issued in European Application No. 05753447.1.
May 4, 2011 Office Action issued in U.S. Appl. No. 12/656,456.
Nov. 25, 2011 Office Action issued in U.S. Appl. No. 12/453,269.
Dec. 1, 2011 Office Action issued in U.S. Appl. No. 12/656,456.
Dec. 23, 2011 Office Action issued in U.S. Appl. No. 11/630,110.
Sep. 10, 2012 Office Action issued in U.S. Appl. No. 11/630,110.
Aug. 31, 2012 Office Action issued in European Patent Application No. 05753447.1.
Sep. 12, 2012 Office Action issued in U.S. Appl. No. 12/656,456.
Dec. 4, 2012 Office Action issued in Japanese Patent Application No. 2010-225187 w/translation.
Apr. 26, 2013 Office Action issued in U.S. Appl. No. 12/656,456.
Apr. 26, 2013 Office Action issued in U.S. Appl. No, 11/630,110.
Nov. 22, 2013 Office Action issued in U.S. Appl. No. 12/656,456.
Nov. 22, 2013 Office Action issued in U.S. Appl. No. 11/630,110.

* cited by examiner

Fig. 14
(A)
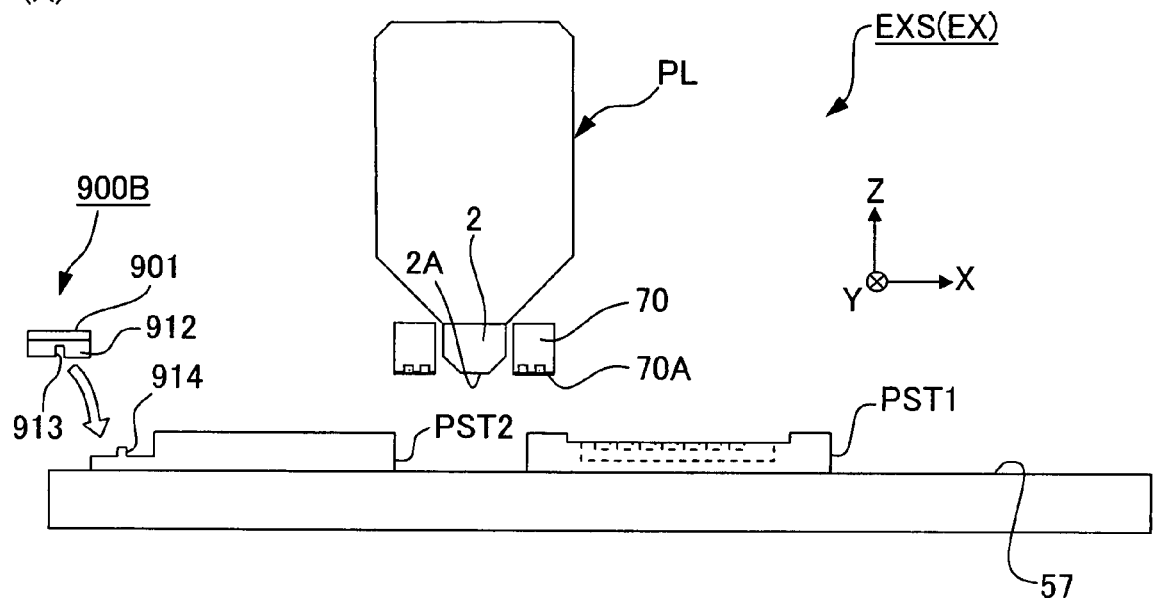
(B)
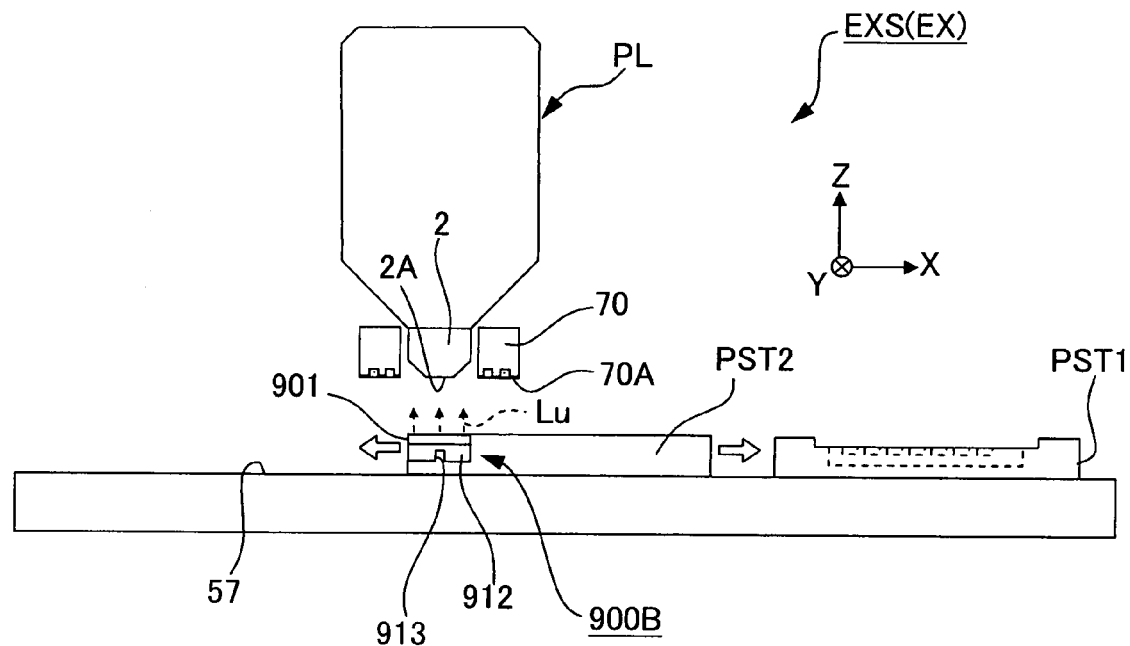

EXPOSURE APPARATUS, METHOD FOR CLEANING MEMBER THEREOF, MAINTENANCE METHOD FOR EXPOSURE APPARATUS, MAINTENANCE DEVICE, AND METHOD FOR PRODUCING DEVICE

This is a Division of application Ser. No. 11/630,110 filed Dec. 20, 2006, which in turn is a National Phase of Application No. PCT/JP2005/011305, which claims the benefit of Japanese Patent Application Nos. 2004-182343 filed Jun. 21, 2004, 2004-237343 filed Aug. 17, 2004 and 2004-327787 filed Nov. 11, 2004. The disclosure of the prior applications is hereby incorporated by reference herein in its entirety.

TECHNICAL FIELD

The present invention relates to an exposure apparatus which exposes a substrate through a liquid, a method for cleaning a predetermined member which constructs the exposure apparatus, a maintenance method for the exposure apparatus, a maintenance device, and a method for producing a device.

BACKGROUND ART

Semiconductor devices and liquid crystal display devices are produced by the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used is shorter, the resolution of the projection optical system becomes higher. As the numerical aperture of the projection optical system is larger, the resolution of the projection optical system is becomes higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and $k_1$ and $k_2$ represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the focus margin is insufficient during the exposure operation. In view of the above, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to form a liquid immersion area so that the resolution is improved and the depth of focus is magnified about n times by utilizing the fact that the wavelength of the exposure light beam in the liquid is 1/n as compared with that in the air (n represents the refractive index of the liquid, which is about 1.2 to 1.6 in ordinary cases).

However, the following possibility arises when the liquid immersion area of the liquid is formed on the substrate. That is, any impurity generated, for example, from the surface of the substrate, may enter into and contaminate the liquid of the liquid immersion area. If the liquid immersion area of the liquid, which contains the impurity, is moved on the substrate stage, there is such a possibility that the upper surface of the substrate stage (including the upper surface of the measuring section provided on the substrate stage) may be polluted with the impurity. If the upper surface of the substrate stage is polluted with the impurity, there is such a possibility that the contact angle of the upper surface of the substrate stage with respect to the liquid may be changed.

Further, the following possibility arises. That is, not only the upper surface of the substrate stage but also various members including, for example, the projection optical system to make contact with the liquid of the liquid immersion area and the nozzle member for forming the liquid immersion area may be polluted.

DISCLOSURE OF THE INVENTION

Problem to Be Solved by the Invention

The present invention has been made taking the circumstances as described above into consideration, an object of which is to provide an exposure apparatus which makes it possible to avoid any deterioration of the performance even when the liquid immersion method is applied, and a method for producing a device based on the use of the exposure apparatus. In particular, the present invention has been made in order to provide an exposure apparatus which makes it possible to avoid any deterioration of the performance which would be otherwise caused by the pollution of any member to make contact with a liquid of a liquid immersion area, and a method for producing a device based on the use of the exposure apparatus. Another object of the present invention is to provide a maintenance method and a maintenance device which make it possible to avoid any deterioration of the performance of the exposure apparatus based on the use of the liquid immersion method. Still another object of the present invention is to provide a method for conveniently washing or cleaning a member which makes contact with the liquid of the liquid immersion area.

Means for Solving the Problem and Effect of the Invention

In order to achieve the objects as described above, the present invention adopts the following constructions.

According to a first aspect of the present invention, there is provided an exposure apparatus which exposes a substrate through a liquid; the exposure apparatus comprising a projection optical system, a liquid immersion area of the liquid being formed on a side of an image plane of the projection optical system; and an optical cleaning device (optical cleaning unit) which radiates a predetermined radiation light beam having an optical cleaning effect onto a member which makes contact with the liquid for forming the liquid immersion area.

According to the first aspect of the present invention, the optical cleaning is performed such that the radiation light beam, which has the optical cleaning effect, is radiated by using the optical cleaning device onto the member which makes contact with the liquid forming the liquid immersion area. Accordingly, it is possible to remove any pollutant from the member.

According to a second aspect of the present invention, there is provided an exposure apparatus which exposes a substrate through a liquid; the exposure apparatus comprising a projection optical system, an optical path space on a side of an image plane of the projection optical system being filled with the liquid; a nozzle member which fills the optical path space with the liquid; and a vibration mechanism which vibrates at least a part of the nozzle member to remove a pollution matter adhered to the nozzle member.

According to the second aspect of the present invention, the pollution matter, which is adhered to the nozzle member, can be removed by vibrating the nozzle member with the vibration mechanism.

According to a third aspect of the present invention, there is provided a method for producing a device, comprising using the exposure apparatus as defined in any one of the aspects described above.

According to the third aspect of the present invention, it is possible to obtain the high exposure accuracy and the high measurement accuracy. Therefore, it is possible to produce the device having the desired performance.

According to a fourth aspect of the present invention, there is provided a maintenance method for an exposure apparatus which is a liquid immersion exposure apparatus for exposing a substrate by radiating an exposure light beam onto the substrate through a liquid while filling an optical path space for the exposure light beam with the liquid; the maintenance method comprising radiating a predetermined radiation light beam having an optical cleaning effect onto a member which makes contact with the liquid in the exposure apparatus.

According to the fourth aspect of the present invention, the optical cleaning is performed such that the radiation light beam, which has the optical cleaning effect, is radiated onto the member which makes contact with the liquid. Accordingly, it is possible to remove any pollutant from the member. Therefore, it is possible to avoid the deterioration of the performance of the exposure apparatus.

According to a fifth aspect of the present invention, there is provided a maintenance device for an exposure apparatus which is a liquid immersion exposure apparatus which exposes a substrate by radiating an exposure light beam onto the substrate through a liquid while filling an optical path space for the exposure light beam with the liquid; the maintenance device comprising a light-emitting section which generates a predetermined radiation light beam; having an optical cleaning effect, with respect to a member which makes contact with the liquid in the exposure apparatus.

According to the fifth aspect of the present invention, the optical cleaning is performed such that the radiation light beam, which has the optical cleaning effect, is radiated by using the maintenance device onto the member which makes contact with the liquid. Accordingly, it is possible to remove any pollutant from the member. Therefore, it is possible to avoid the deterioration of the performance of the exposure apparatus.

According to a sixth aspect of the present invention, there is provided a method for cleaning a member which constructs an exposure apparatus for exposing a substrate; the exposure apparatus being a liquid immersion exposure apparatus which exposes the substrate through a liquid of a liquid immersion area formed at least on the substrate; and the member being a member which makes contact with the liquid forming the liquid immersion area; the cleaning method comprising radiating a predetermined light beam onto the member.

According to the sixth aspect of the present invention, the optical cleaning is performed such that the predetermined light beam is radiated onto the member which makes contact with the liquid forming the liquid immersion area in the liquid immersion exposure apparatus. Accordingly, it is possible to remove any pollutant from the member with ease, and it is possible to reduce the influence of the impurity and/or the pollutant in the liquid immersion exposure. The maintenance is easily performed in relation to the cleaning method of the present invention, when the cleaning method can be carried out without detaching the member from the exposure apparatus. Any influence is hardly exerted on the throughput of the exposure apparatus.

According to a seventh aspect of the present invention, there is provided an exposure method for exposing a substrate, comprising optically cleaning the member by the cleaning method of the present invention; and exposing the substrate through a liquid. According to an eighth aspect of the present invention, there is also provided a method for producing a device, comprising exposing a substrate by the exposure method of the present invention; developing the exposed substrate; and processing the developed substrate.

BRIEF DESCRIPTION OF THE DRAWINGS

FIGS. 14(A) and 14(B) show a maintenance device according to an eleventh embodiment.

LEGENDS OF REFERENCE NUMERALS

2: optical element, 12: supply port, 22: recovery port, 31: upper surface, 57: stage base (base member), 70: nozzle member, 80: optical cleaning device (optical cleaning unit), 82: light source, 84 (84A, 84B): detector, 86: optical system, 87: gas supply system, 88: gas recovery system, 90: detection unit (detection device), 125: air-conditioned space, 300: reference member (measuring member), 400, 500, 600: optical measuring section, 700: optical member, 800: vibration mechanism, 900: maintenance device, 901: light-emitting section, AR1: projection area, AR2: liquid immersion area, CONT: control unit (control device), EL: exposure light beam, EX: exposure apparatus body EXS: exposure apparatus, KC: air-conditioning system, LQ: liquid, Lu: radiation light beam (ultraviolet light beam), P: substrate, PH: substrate holder, PL: projection optical system, PST (PST1): substrate stage, PST2: measuring stage.

BEST MODE FOR CARRYING OUT THE INVENTION

Embodiments of the exposure apparatus according to the present invention will be explained below with reference to the drawings. However, the present invention is not limited thereto.

First Embodiment

Figure 1:
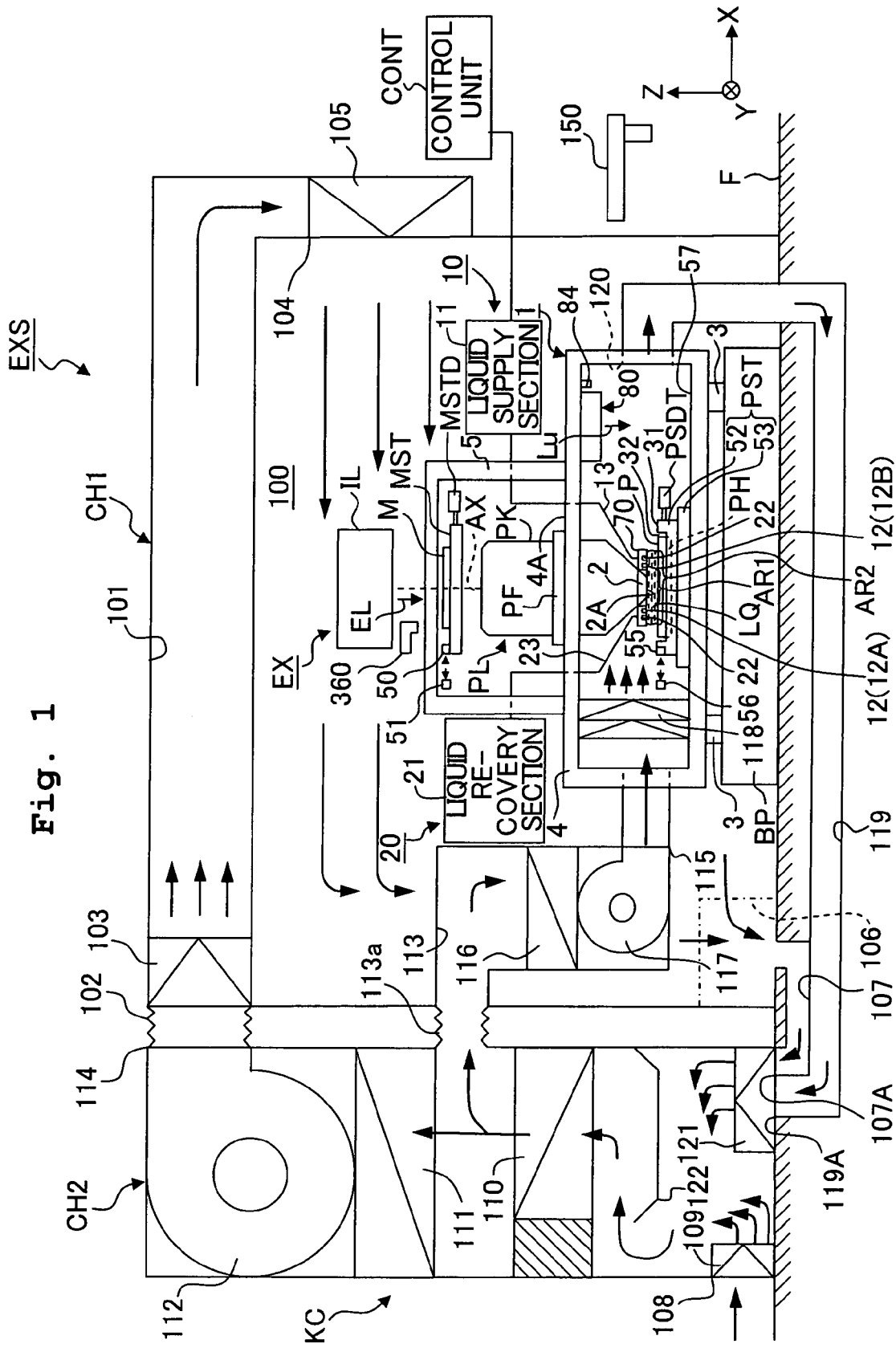
FIG. 1 shows a schematic arrangement illustrating an exposure apparatus according to a first embodiment.
Figure 2:
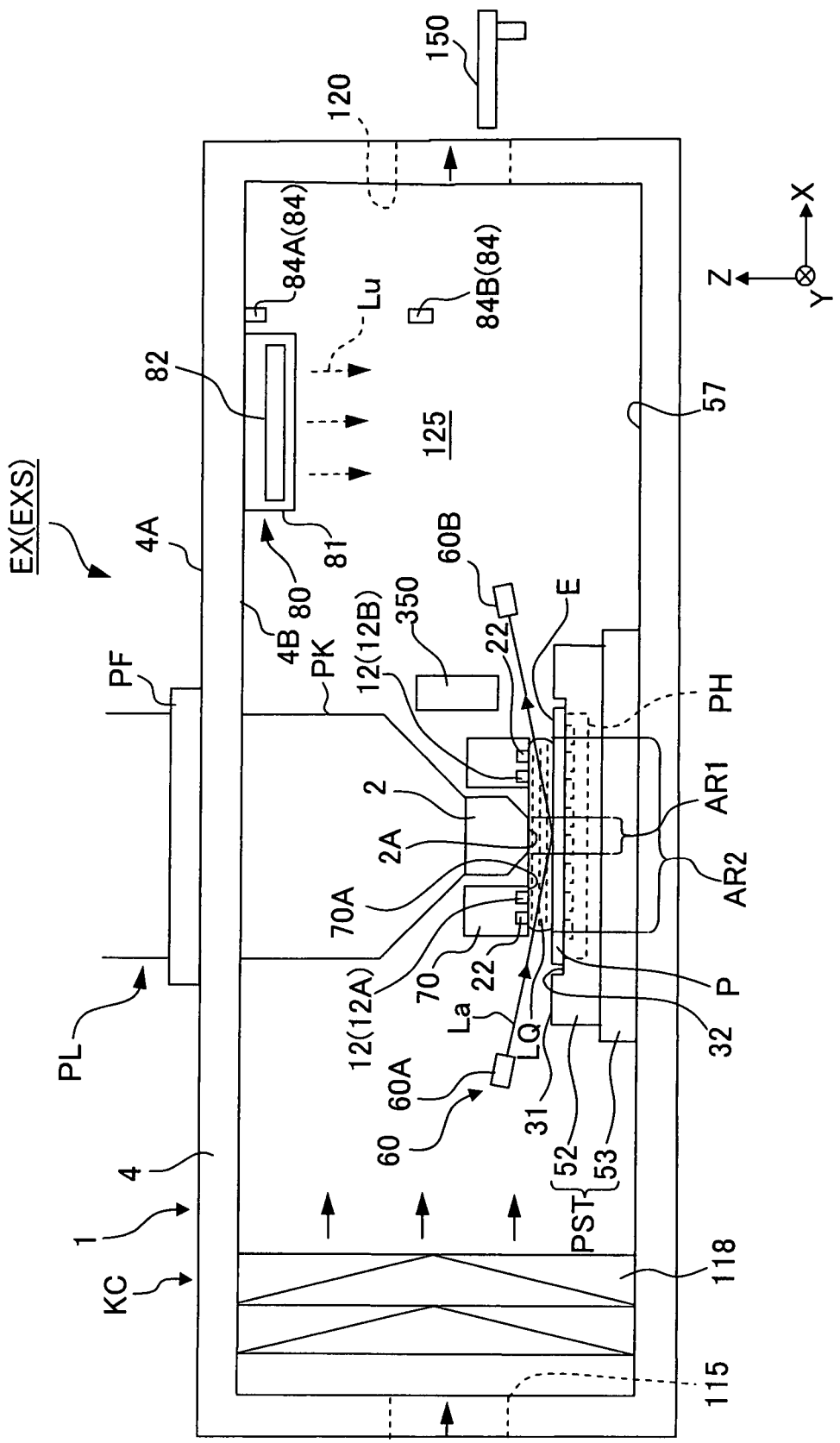
FIG. 2 shows a magnified view illustrating main components shown in FIG. 1.

FIG. 1 shows a schematic arrangement illustrating a first embodiment of an exposure apparatus of the present invention, and FIG. 2 shows a magnified view illustrating main components shown in FIG. 1. With reference to FIG. 1, the exposure apparatus EXS includes a body chamber (chamber for exposure apparatus body) CH1 which is installed on a floor surface F in a clean room, and a machine chamber CH2 which is arranged adjacently to the body chamber CH1. An exposure chamber 100, which is provided in the body chamber CH1, is air-conditioned by an air-conditioning system KC. The internal environment (for example, cleanness, temperature, pressure) is maintained to be substantially constant. In this embodiment, the exposure chamber 100 is filled with the clean air. An exposure apparatus body (body of exposure apparatus) EX is accommodated in the exposure chamber 100. The exposure chamber 100 is connected to an outlet 114 of a gas flow passage provided in the machine chamber CH2, via a connecting section 102 and a gas feed flow passage 101 provided in the body chamber CH1.

The exposure apparatus body EX, which is accommodated in the exposure chamber 100, includes a mask stage MST which supports a mask M, a substrate stage PST which supports a substrate P, an illumination optical system IL which illuminates, with an exposure light beam EL, the mask M supported by the mask stage MST, a projection optical system PL which performs projection exposure for the substrate P supported by the substrate stage PST with an image of a pattern of the mask M illuminated with the exposure light beam EL, and an optical or photo cleaning unit 80 which radiates a predetermined radiation light beam Lu having the optical or photo cleaning effect. In this embodiment, the optical cleaning unit 80 radiates an ultraviolet light beam (UV light beam). The overall operation of the exposure apparatus EXS (exposure apparatus body EX) is integrally controlled by a control unit (control device) CONT. The term "optical or photo cleaning effect" means the fact that a member is cleaned or washed by radiating a predetermined light beam onto the member, which includes the following operations or procedures. That is, a surface of the member is cleaned such that the impurity or the pollutant such as any organic substance or carbon, which is adhered (adsorbed) or generated on the surface of the member, is removed, decomposed, or modified by radiating, onto the member, for example, the light beam having a predetermined wavelength, especially the ultraviolet light beam or the vacuum ultraviolet light beam having a wavelength shorter than the above. Further, the surface of the member is cleaned such that the impurity or the pollutant such as any organic substance or carbon, which is disposed (present) on the surface of the member, is removed, decomposed, or modified by allowing the oxygen contained in the gas disposed in the vicinity of the member to absorb the light beam having a predetermined wavelength, especially the ultraviolet light beam or the vacuum ultraviolet light beam having a wavelength shorter than the above so that the excited state is provided to cause the chemical change into ozone or the like in which the oxidizing power is increased. It is considered that the impurity and the pollutant, which are disposed on the surface of the member, are introduced, for example, from the photoresist coated onto the substrate P, the liquid, the surrounding gas, and the operator.

The exposure apparatus EXS includes a substrate transport system 150 which is provided at a position adjacent to the exposure chamber 100 and which loads and unloads the substrate P with respect to the substrate stage PST. The substrate transport system 150 is accommodated in an unillustrated substrate transport system-accommodating chamber. Similarly, although not shown, a mask transport system-accommodating chamber, which accommodates a mask transport system for loading and unloading the mask M with respect to the mask stage MST, is provided at a position adjacent to the exposure chamber 100. The substrate transport system-accommodating chamber and the mask transport system-accommodating chamber are provided on the side opposite to the machine chamber CH2 with respect to the exposure chamber 100. The internal environments are maintained, by the air-conditioning system KC, to be substantially constant for the substrate transport system-accommodating chamber and the mask transport system-accommodating chamber respectively, in the same manner as for the exposure chamber 100.

The exposure apparatus EXS (exposure apparatus body EX) of the embodiment of the present invention is the liquid immersion exposure apparatus in which the liquid immersion method is applied in order that the exposure wavelength is substantially shortened to improve the resolution and the depth of focus is substantially widened. The exposure apparatus EXS includes a liquid supply mechanism 10 which supplies the liquid LQ onto the substrate P, and a liquid recovery mechanism 20 which recovers the liquid LQ on the substrate P. In the embodiment of the present invention, pure or purified water is used as the liquid LQ. The exposure apparatus EXS forms a liquid immersion area AR2 locally on at least a part of the substrate P including a projection area AR1 of the projection optical system PL by the liquid LQ supplied from the liquid supply mechanism 10 at least during the period in which the image of the pattern of the mask M is being transferred onto the substrate P, the liquid immersion area AR2 being larger than the projection area AR1 and smaller than the substrate P. Specifically, the exposure apparatus EXS is operated as follows. That is, the exposure light beam EL is radiated in a state in which the space between the surface (exposure surface) of the substrate P and the optical element 2 disposed at the end portion on the side of the image plane of the projection optical system PL, i.e., the optical path space disposed on the side of the image plane of the projection optical system PL is filled with the liquid LQ. The image of the pattern of the mask M is projected onto the substrate P to expose the substrate P therewith via the projection optical system PL and the liquid LQ disposed between the projection optical system PL and the substrate P.

The embodiment of the present invention will now be explained as exemplified by a case of the use of the scanning type exposure apparatus (so-called scanning stepper) as the exposure apparatus EXS in which the substrate P is exposed with the pattern formed on the mask M while synchronously moving the mask M and the substrate P in mutually different directions (opposite directions) in the scanning directions (predetermined directions). In the following explanation, the X axis direction is the synchronous movement direction (scanning direction, predetermined direction) for the mask M and the substrate P in a horizontal plane, the Y axis direction (non-scanning direction) is the direction which is perpendicular to the X axis direction in the horizontal plane, and the Z axis direction is the direction which is perpendicular to the X axis direction and the Y axis direction and which is coincident with the optical axis AX of the projection optical system PL. The directions of rotation (inclination) about the X axis, the Y axis, and the Z axis are designated as $\theta x$, $\theta Y$, and $\theta Z$ directions respectively. The term "substrate" referred to herein includes those obtained by coating a semiconductor wafer surface with a resist, and the term "mask" includes a reticle formed with a device pattern to be subjected to the reduction projection onto the substrate.

The illumination optical system IL is provided so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL emitted from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used. As described above, the liquid LQ is pure water in this embodiment, through which the exposure light beam EL is transmissive even when the exposure light beam EL is the ArF excimer laser beam. The emission line (g-ray, h-ray, i-ray) and the far ultraviolet light beam (DUV light beam) such as the KrF excimer laser beam (wavelength: 248 nm) are also transmissive through pure water.

The mask stage MST is movable while holding the mask M. The mask stage MST is two-dimensionally movable in the plane perpendicular to the optical axis AX of the projection optical system PL, i.e., in the XY plane, and it is finely rotatable in the $\theta Z$ direction. The mask stage MST is driven by a mask stage-driving unit MSTD such as a linear motor.

The mask stage-driving unit MSTD is controlled by the control unit CONT. A movement mirror 50, which is movable together with the mask stage, is provided on the mask stage MST. A laser interferometer 51 is provided at a position opposed to the movement mirror 50. The position in the two-dimensional direction and the angle of rotation of the mask M on the mask stage MST are measured in real-time by the laser interferometer 51. The result of the measurement is outputted to the control unit CONT. The control unit CONT drives the mask stage-driving unit MSTD on the basis of the result of the measurement obtained by the laser interferometer 51 to thereby position the mask M supported on the mask stage MST.

The projection optical system PL projects the pattern on the mask M onto the substrate P at a predetermined projection magnification $\beta$ to perform the exposure. The projection optical system PL is constructed of a plurality of optical elements including the optical element (lens) 2 provided at the end portion on the side of the substrate P. The optical elements are supported by a barrel PK. In this embodiment, the projection optical system PL is the reduction system in which the projection magnification $\beta$ is, for example, ¼, ⅕, or ⅛. The projection optical system PL may be any one of the 1× magnification system and the magnifying system. The projection optical system PL may be any one of the catoptric system including no dioptric element, the dioptric system including no catoptric element, and the catadioptric system including dioptric and catoptric elements. The optical element 2, which is disposed at the end portion of the projection optical system PL of this embodiment, is provided detachably (exchangeably) with respect to the barrel PK. The optical element 2, which is disposed at the end portion, is exposed from the barrel PK. The liquid LQ of the liquid immersion area AR2 makes contact with the optical element 2. Accordingly, the barrel PK formed of metal is prevented from any corrosion or the like.

The substrate stage PST includes a Z tilt stage 52 which holds the substrate P by the aid of the substrate holder PH, and an XY stage 53 which supports the Z tilt stage 52. The substrate stage PST is driven by a substrate stage-driving unit PSTD such as a linear motor. The substrate stage-driving unit PSTD is controlled by the control unit CONT. The Z tilt stage 52 is capable of moving the substrate P held by the substrate holder PH in the Z axis direction and in the $\theta X$ and $\theta Y$ directions (directions of inclination). The XY stage 53 is capable of moving the substrate P held by the substrate holder PH in the XY directions (directions substantially parallel to the image plane of the projection optical system PL) and in the $\theta Z$ direction by the aid of the Z tilt stage 52. It goes without saying that the Z tilt stage and the XY stage may be provided as an integrated body.

A recess 32 is provided on the substrate stage PST. The substrate holder PH is arranged in the recess 32. The upper surface 31 other than the recess 32 of the substrate stage PST (Z tilt stage 52) forms a flat surface (flat portion) which has approximately the same height as that of (is flush with) the surface of the substrate P held by the substrate holder PH. Further, the upper surface of the movement mirror 55 also has approximately the same height as that of (is flush with) the upper surface 31 of the substrate stage PST. The liquid immersion area AR2 can be satisfactorily formed while retaining the liquid LQ on the side of the image plane of the projection optical system PL even when the edge area of the substrate P is subjected to the liquid immersion exposure, because the upper surface 31, which is substantially flush with the surface of the substrate P, is provided around the substrate P. A gap of about 0.1 to 2 mm is formed between the edge portion of the substrate P and the flat surface (upper surface) 31 provided around the substrate P. However, the liquid LQ hardly flows into the gap owing to the surface tension of the liquid LQ. The liquid LQ can be retained under the projection optical system PL by the aid of the upper surface 31 even when the portion, which is disposed in the vicinity of the circumferential edge of the substrate P, is subjected to the exposure.

The upper surface 31 of the substrate stage PST is subjected to a liquid-repelling treatment to have a liquid-repellent property. The liquid-repelling treatment for the upper surface 31 includes, for example, the following treatment. That is, a liquid-repellent material including, for example, a fluorine-based resin material such as polytetrafluoroethylene (Teflon (trade name)) or an acrylic resin material is coated, or a thin film composed of the liquid-repellent material as described above is stuck. The member itself, which forms the upper surface 31 of the substrate stage PST, may be formed of a liquid-repellent member such as fluororesin. When the upper surface 31 is liquid-repellent, then it is possible to avoid the outflow of the liquid LQ to the outside of the substrate stage PST during the liquid immersion exposure, and it is possible to satisfactorily recover (remove) the liquid LQ remaining on the upper surface 31 after the liquid immersion exposure.

In this embodiment, the ultraviolet light beam (UV light beam) is radiated from the optical cleaning unit 80 onto the upper surface 31 as described later on. However, a film material is used, which does not undergo any great deterioration of the liquid-repellent property of the upper surface 31 even when the ultraviolet light beam is radiated.

The movement mirror 55, which is movable together with the substrate stage PST with respect to the projection optical system PL, is provided on the substrate stage PST (Z tilt stage 52). A laser interferometer 56 is provided at a position opposed to the movement mirror 55. The angle of rotation and the position in the two-dimensional direction of the substrate P on the substrate stage PST are measured in real-time by the laser interferometer 56. The result of the measurement is outputted to the control unit CONT. The control unit CONT positions the substrate P supported by the substrate stage PST in the X axis direction and the Y axis direction by driving the XY stage 53 by the aid of the substrate stage-driving unit PSTD in the two-dimensional coordinate system defined by the laser interferometer 56 on the basis of the result of the measurement performed by the laser interferometer 56.

As shown in FIG. 2, the exposure apparatus EXS (exposure apparatus body EX) has a focus/leveling-detecting system 60 for detecting the surface position information about the surface of the substrate P. The focus/leveling-detecting system 60 includes a light-emitting section 60A and a light-receiving section 60B. A detecting light beam La is radiated in an oblique direction from the light-emitting section 60A through the liquid LQ onto the surface (exposure surface) of the substrate P. A reflected light beam from the substrate P is received by the light-receiving section 60B through the liquid LQ. Accordingly, the focus/leveling-detecting system 60 detects the surface position information about the surface of the substrate P. The control unit CONT controls the operation of the focus/leveling-detecting system 60. Further, the control unit CONT detects the position (focus position) in the Z axis direction of the surface of the substrate P with respect to a predetermined reference surface (image plane) on the basis of the light-receiving result of the light-receiving section 60B. The focus/leveling-detecting system 60 can also determine the posture or attitude of the substrate P in the direction of inclination by determining the respective focus positions at a plurality of points on the surface of the substrate P respectively. A system, which is disclosed, for example, in Japanese Patent Application Laid-open No. 8-37149, may be used for the focus/leveling-detecting system 60. The focus/leveling-detecting system 60 may be a system in which the surface position of the substrate P is detected not through the liquid LQ.

The control unit CONT controls the position (focus position) of the substrate P held by the Z tilt stage 52 in the Z axis direction and the position in the θX and θY directions by driving the Z tilt stage 52 of the substrate stage PST by the aid of the substrate stage-driving unit PSTD. That is, the Z tilt stage 52 is operated on the basis of the instruction from the control unit CONT based on the detection result of the focus/leveling-detecting system 60. The angle of inclination and the focus position (Z position) of the substrate P are controlled so that the surface (exposure surface) of the substrate P is adjusted to match the image plane to be formed via the projection optical system PL and the liquid LQ.

A substrate alignment system 350, which detects an alignment mark disposed on the substrate P or a reference mark disposed on a reference member (measuring member) described later on provided on the Z tilt stage 52, is provided in the vicinity of the end portion of the projection optical system PL. The substrate alignment system 350 of this embodiment adopts the FIA (field image alignment) system in which an illumination light beam such as white light is radiated from a halogen lamp onto the mark while allowing the substrate stage PST to stand still so that an obtained image of the mark is imaged in a predetermined image pickup field by an image pickup element to measure the position of the mark by means of the image processing, as disclosed, for example, in Japanese Patent Application Laid-open No. 4-65603.

With reference to FIG. 1 again, the mask stage MST, the projection optical system PL, and the substrate stage PST are supported by a body column 1. The body column 1 is supported over a base plate BP installed on the bottom surface of the body chamber CH1 by the aid of a plurality of anti-vibration units 3 intervening therebetween. The body column 1 includes a main column 4 which is supported by the anti-vibration units 3, and a support column 5 which is provided on the main column 4. The projection optical system PL is held on the upper surface 4A of the main column 4 by the aid of a holding member PF. The support column 5 supports at least a part of the illumination optical system IL at a lower portion thereof.

The mask stage MST is provided two-dimensionally movably on an unillustrated mask stage base supported by the main column 4. The substrate stage PST (XY stage 53) is provided two-dimensionally movably on a substrate stage base 57 constructed by the bottom surface of the main column 4.

A mask alignment system 360, which detects a reference mark disposed on a reference member, described later on provided on the Z tilt stage 52, via the mask M and the projection optical system PL, is provided in the vicinity of the mask stage MST. The mask alignment system 360 of this embodiment adopts the VRA (visual reticle alignment) system in which a light beam is radiated onto the mark so that image data of the mark imaged, for example, by a CCD camera is subjected to image processing to detect the mark position, as disclosed, for example, in Japanese Patent Application Laid-open No. 7-176468.

Next, an explanation will be made with reference to FIG. 1 about the air-conditioning system KC for air-conditioning the exposure chamber 100 which accommodates the exposure apparatus body EX.

The air-conditioning system KC includes temperature-adjusting units 110, 111, 116 and filter units 103, 105, 118, 121 arranged at a plurality of predetermined positions, respectively, of a circulating flow passage including the interior of the body chamber CH1 and the interior of the machine chamber CH2. The air-conditioning system KC maintains the environment (cleanness, temperature, pressure, etc.) of the exposure chamber 100 to be in a desired state by circulating the gas by the aid of, for example, the filter units and the temperature-adjusting units. An outside air-inlet port (OA port) 108 arranged with the filter unit 109 is formed at a predetermined position of the machine chamber CH2. In order to maintain the cleanness, the positive pressure is maintained with respect to the outside for the interior of the body chamber CH1, especially for the interior of the exposure chamber 100. Therefore, the gas is allowed to leak from the inside to the outside of the body chamber CH1. The OA port 108 is provided to introduce the gas corresponding to the amount of leak from the outside.

The filter unit 103, which is provided with, for example, a chemical filter for removing any chemical pollutant contained in the gas by means of the chemical adsorption and/or the physical adsorption, is provided at one end (end on the side of the machine chamber CH2) of the gas feed flow passage 101 provided in the body chamber CH1. One end of the gas feed flow passage 101 is connected via a connecting section 102 to an outlet 114 of the gas flow passage provided in the machine chamber CH2. On the other hand, the other end of the gas feed flow passage 101 is connected to an opening (gas feed port) 104 provided at an upper portion of the exposure chamber 100. The gas feed port 104 is provided with the filter unit 105 which includes, for example, a ULPA filter (ultra low penetration air-filter) as a particle filter for removing particles contained in the gas allowed to flow into the exposure chamber 100. The air-conditioning system KC supplies the gas from the gas feed port 104 to the upper space of the exposure chamber 100 in the lateral direction, i.e., in the −X direction in this embodiment.

A gas discharge section (return section) 106 is provided at the bottom of the exposure chamber 100. The return section 106 is connected via a gas discharge flow passage (return duct) 107 to an opening 107A formed on the floor surface of the machine chamber CH2. The gas contained in the exposure chamber 100 is discharged from the gas discharge section 106, and the gas is fed to the machine chamber CH2.

The filter unit 109, which is provided with a chemical filter or the like, is provided at the OA port 108 which is provided at the predetermined position of the machine chamber CH2. The cooling unit (temperature-adjusting unit) 110 is provided in the gas flow passage in the machine chamber CH2. The heating unit (temperature-adjusting unit) 111 is provided over or above the cooling unit 110 while being separated therefrom by a predetermined distance. A gas feed fan 112 is provided in the vicinity of the outlet 114 of the machine chamber CH2 provided over the heating unit 111. A drain pan 122 is arranged under the cooling unit 110. The gas, which is temperature-adjusted by the temperature-adjusting units 110, 111, is supplied via the outlet 114 to the body chamber CH1.

A branch passage 113, into which a part (for example, about ⅓) of the gas allowed to pass through the cooling unit 110 from the lower position to the upper position, has one end which is connected to a lower portion of the heating unit 111 in the machine chamber CH2. An expandable/contractible bellows-shaped member 113a is provided at one end of the branch passage 113. One end of the branch passage 113 is connected to the interior of the machine chamber CH2 via the bellows-shaped member 113a. On the other hand, an opening (gas feed port) 115, which is provided at the other end of the branch passage 113, is arranged in the vicinity of the substrate stage PST. As shown in FIG. 1, a greater part of the branch passage 113 is provided in the exposure chamber 100.

The heating unit 116 is provided in the branch passage 113. A gas feed fan 117 is provided in the vicinity of the gas feed port 115 of the branch passage 113. The gas feed port 115 is provided on the side wall of the main column 4 on the −X side. The filter unit 118, which includes, for example, a chemical filter and a ULPA filter, is provided for the gas feed port 115. The gas, which is temperature-adjusted by the temperature-adjusting units 110, 116, is supplied via the gas feed port 115 to the space (air-conditioned space) 125 in the vicinity of the substrate stage PST including a part of the projection optical system PL in the exposure chamber 100. The following explanation will be made assuming that the space, which includes a part of the projection optical system PL and the substrate stage PST and which is surrounded by the main column 4, is designated as the air-conditioned space 125.

The air-conditioning system KC performs air-conditioning for the air-conditioned space 125 by supplying the gas in the lateral direction, i.e., in the +X direction in this embodiment from the gas feed port 115 to the space (air-conditioned space) 125 in the vicinity of the substrate stage PST including a part of the projection optical system PL. That is, the flow of the gas, which is formed by the air-conditioning system KC, is set substantially in the +X direction in the air-conditioned space 125.

On the other hand, the gas discharge port 120, which is one end of the gas discharge flow passage (return duct) 119, is arranged on the side opposite to the gas feed port 115 with respect to the substrate stage PST. The gas discharge port 120 is provided on the side wall of the main column 4 on the +X side. The gas feed port 115 and the gas discharge port 120 are opposed to one another. On the other hand, the other end of the return duct 119 is connected to an opening 119A formed on the floor surface of the machine chamber CH2. The filter unit 121, which is provided with a chemical filter or the like, is provided for the openings 107A, 119A formed on the floor surface of the machine chamber CH2. The gas, which is contained or present in the air-conditioned space 125 in the exposure chamber 100, is discharged from the gas discharge port 120, and the gas is fed to the machine chamber CH2.

Next, an explanation will be made with reference to FIGS. 1 and 2 about the liquid supply mechanism 10 and the liquid recovery mechanism 20.

The liquid supply mechanism 10 supplies the predetermined liquid LQ to the side of the image plane of the projection optical system PL. The liquid supply mechanism 10 includes a liquid supply section 11 which is capable of feeding the liquid LQ, and a supply tube 13 which has one end connected to the liquid supply section 11. The liquid supply section 11 includes, for example, a tank for accommodating the liquid LQ, a pressurizing pump, and a filter unit for removing any foreign matter and bubbles contained or present in the liquid LQ. The liquid supply operation of the liquid supply section 11 is controlled by the control unit CONT. When the liquid immersion area AR2 is formed on the substrate P, the liquid supply mechanism 10 supplies the liquid LQ onto the substrate P.

The liquid recovery mechanism 20 recovers the liquid LQ on the side of the image plane of the projection optical system PL. The liquid recovery mechanism 20 includes a liquid recovery section 21 which is capable of recovering the liquid LQ, and a recovery tube 23 which has one end connected to the liquid recovery section 21. The liquid recovery section 21 includes, for example, a vacuum system (suction unit) such as a vacuum pump, a gas/liquid separator for separating the gas and the recovered liquid LQ from each other, and a tank for accommodating the recovered liquid LQ. It is also allowable to use, for example, the equipment of the factory in which the exposure apparatus EXS is installed, instead of providing at least a part or parts of, for example, the vacuum system, the gas/liquid separator, and the tank for the exposure apparatus EXS. The liquid recovery operation of the liquid recovery section 21 is controlled by the control unit CONT. In order to form the liquid immersion area AR2 on the substrate P, the liquid recovery mechanism 20 recovers a predetermined amount of the liquid LQ on the substrate P supplied from the liquid supply mechanism 10.

A nozzle member 70 is arranged in the vicinity of the optical element 2 which makes contact with the liquid LQ and which is included in the plurality of optical elements for constructing the projection optical system PL. The nozzle member 70 is provided to fill, with the liquid LQ, the optical path space which is on the side of the image plane of the projection optical system PL and which allows the exposure light beam EL to pass therethrough. The nozzle member 70 is an annular member which is provided to surround the side surface of the optical element 2 over or at a position above the substrate P (substrate stage PST). A gap is formed between the nozzle member 70 and the optical element 2. The nozzle member 70 is supported by a predetermined support mechanism so that the nozzle member 70 is isolated from the optical element 2 in terms of the vibration. The nozzle member 70 is constructed such that the liquid LQ makes no invasion or infiltration into the gap, and no bubble enters into and is mixed with the liquid LQ from the gap. The nozzle member 70 is formed of, for example, stainless steel or titanium.

The nozzle member 70 includes supply ports 12 which are arranged over or above the substrate P (substrate stage PST) and which are arranged opposite to the surface of the substrate P. In this embodiment, the nozzle member 70 has the two supply ports 12A, 12B. The supply ports 12A, 12B are provided on the lower surface 70A of the nozzle member 70.

A supply flow passage, through which the liquid LQ to be supplied onto the substrate P is allowed to flow, is formed in the nozzle member 70. One end of the supply flow passage of the nozzle member 70 is connected to the other end of the supply tube 13. The other end of the supply flow passage is connected to the supply ports 12A, 12B respectively. In this case, the supply flow passage, which is formed in the nozzle member 70, has the other end which is branched from an intermediate position to be connectable to the plurality of (two) supply ports 12A, 12B respectively.

The nozzle member 70 includes a recovery port 22 which is provided over or above the substrate P (substrate stage PST) and which is arranged opposite to the surface of the substrate P. In this embodiment, the recovery port 22 is formed to be annular so that the recovery port 22 surrounds the supply ports 12 and the optical element 2 of the projection optical system PL (projection area AR1), on the lower surface 70A of the nozzle member 70.

A recovery flow passage, through which the liquid LQ recovered by the recovery port 22 is allowed to flow, is formed in the nozzle member 70. One end of the recovery flow passage of the nozzle member 70 is connected to the other end of the recovery tube 23. The other end of the recovery flow passage is connected to the recovery port 22. In this case, the recovery flow passage, which is formed in the nozzle member 70, includes an annular flow passage which is adapted to the recovery port 22, and a manifold flow passage which collects the liquid LQ allowed to flow through the annular flow passage.

In this embodiment, the nozzle member 70 constructs parts of the liquid supply mechanism 10 and the liquid recovery mechanism 20 respectively. The supply ports 12A, 12B, which construct the liquid supply mechanism 10, are provided at the positions on the both sides in the X axis direction, respectively, with the projection area AR1 of the projection optical system PL intervening therebetween. The recovery port 22, which constructs the liquid recovery mechanism 22, is provided outside the liquid supply ports 12A, 12B of the liquid supply mechanism 10 with respect to the projection area AR1 of the projection optical system PL. In this embodiment, the projection area AR1 of the projection optical system PL is set to have a rectangular shape as viewed in a plan view in which the Y axis direction is the longitudinal direction and the X axis direction is the transverse direction.

The operation of the liquid supply section 11 is controlled by the control unit CONT. The control unit CONT is capable of controlling the liquid supply amount per unit time to be provided by the liquid supply section 11. When the liquid LQ is supplied onto the substrate P, then the control unit CONT feeds the liquid LQ from the liquid supply section 11, and the liquid LQ is supplied onto the substrate P from the supply ports 12A, 12B provided over the substrate P via the supply tube 13 and the supply flow passage formed in the nozzle member 70. The liquid LQ is supplied from the both sides of the projection area AR1 by the aid of the supply ports 12A, 12B.

The liquid recovery operation of the liquid recovery section 21 is controlled by the control unit CONT. The control unit CONT is capable of controlling the liquid recovery amount per unit time to be recovered by the liquid recovery section 21. The liquid LQ on the substrate P, recovered from the recovery port 22 provided over the substrate P, is recovered by the liquid recovery section 21 via the recovery tube 23 and the recovery flow passage formed in the nozzle member 70. The arrangement of the nozzle member 70 (for example, the position, the shape, and the number of the supply port or ports and the recovery port or ports) is not limited to the arrangement described above. Any arrangement may be adopted provided that the liquid immersion area AR2 can be maintained so as to fill the optical path for the exposure light beam EL with the liquid LQ. For example, the supply ports 12A, 12B may be arranged on the both sides in the Y axis direction, respectively, with respect to the projection area AR1 of the projection optical system PL. The nozzle member 70 may be constructed of a plurality of members.

The lower surface (liquid contact surface) 2A of the optical element 2 of the projection optical system PL and the lower surface (liquid contact surface) 70A of the nozzle member 70 are liquid-attractive or lyophilic (water-attractive or hydrophilic). In this embodiment, the optical element 2 is formed of calcium fluorite having a high affinity for pure water. The optical element 2 may be formed of silica glass having a high affinity for water. The affinity for the liquid LQ may be further enhanced by performing a water-attracting (liquid-attracting) treatment to the liquid contact surface 2A of the optical element 2 and the liquid contact surface 70A of the nozzle member 70. The liquid-attracting treatment includes a treatment in which a liquid-attractive material such as $MgF_2$, $Al_2O_3$, or $SiO_2$ is provided on the liquid contact surface. Alternatively, as the liquid-attracting treatment (water-attracting treatment), for example, a thin film may be provided which is formed with a substance having a molecular structure with large polarity such as alcohol, because the liquid LQ is water having the large polarity in this embodiment. When the lower surface 2A of the optical element 2 and the lower surface 70A of the nozzle member 70 are liquid-attractive, the liquid immersion area AR2 of the liquid LQ can be satisfactorily formed between the lower surface 2A of the optical element 2 and the lower surface 70A of the nozzle member 70 and the upper surface of the substrate P and/or the upper surface of the substrate stage PST by utilizing the surface tension of the liquid LQ. In this embodiment, the nozzle member 70 is arranged so that the lower surface 2A of the optical element 2 is substantially flush with the lower surface 70A of the nozzle member 70. However, a difference in height may be present between the lower surface 2A of the optical element 2 and the lower surface 70A of the nozzle member 70. For example, the nozzle member 70 may be arranged so that the distance between the lower surface 70A of the nozzle member 70 and the upper surface of the substrate P and/or the upper surface of the substrate stage PST is smaller than the distance between the lower surface 2A of the optical element 2 and the upper surface of the substrate P and/or the upper surface of the substrate stage PST.

Next, the optical cleaning unit 80 will be explained with reference to FIG. 2.

The optical cleaning unit 80 radiates the radiation light beam Lu having the optical cleaning effect. The optical cleaning unit 80 is provided with a light source 82 and a casing 81 which holds the light source 82. In this embodiment, the optical cleaning unit 80 radiates the ultraviolet light beam (UV light beam) in the downward direction. Those usable as the light source 82 include, for example, the $Xe_2$ excimer laser (wavelength: 172 nm), the KrCl excimer laser (wavelength: 222 nm), and the XeCl excimer laser (wavelength: 308 nm). The optical cleaning unit 80 is provided at the position beside the projection optical system PL at the inside of the air-conditioned space 125 which accommodates the optical element 2 disposed at the end portion of the projection optical system PL, the nozzle member 70, and the substrate stage PST. Specifically, the optical cleaning unit 80 is attached at the position on the ceiling surface 4B of the main column 4 at the inside of the air-conditioned space 125, the position being separated by a predetermined distance on the +X side with respect to the projection optical system PL (optical path for the exposure light beam EL). In this case, as described above, the gas, which is supplied from the gas feed port 115, is allowed to flow in the +X direction in the air-conditioned space 125. Therefore, the optical cleaning unit 80 is constructed to be provided on the downstream side of the flow of the gas (air) formed by the air-conditioning system KC with respect to the projection optical system PL.

In this embodiment, the substrate transport system 150, which loads (imports) and unloads (exports) the substrate P with respect to the substrate stage PST, is arranged outside the air-conditioned space 125 on the +X side. When the substrate P is loaded/unloaded with respect to the substrate stage PST, then the control unit CONT moves the substrate stage PST to the +X side of the air-conditioned space 125, and the substrate stage PST is arranged at the position (load/unload position) in the vicinity of the substrate transport system 150. The optical cleaning unit 80 is provided over or above the load/unload position. In this case, the substrate stage PST is constructed to be movable to the position just below or under the optical cleaning unit 80.

Detectors 84 (84A, 84B) which detect the gas component in the air-conditioned space 125, are provided inside the air-conditioned space 125. In this embodiment, each of the detectors 84 is constructed of an oxygen concentration meter which is capable of detecting the oxygen concentration in the air-conditioned space 125. It is also allowable that one detector 84 may be provided. However, in this embodiment, the detectors 84A, 84B are provided at a plurality of predetermined positions in the air-conditioned space 125 respectively. Specifically, the detector 84A is attached at the position on the ceiling surface 4B of the main column 4, the position being aligned with the optical cleaning unit 80. The detector 84B is provided in the vicinity of the optical path for the ultraviolet light beam Lu radiated from the optical cleaning unit 80.

Figure 3:
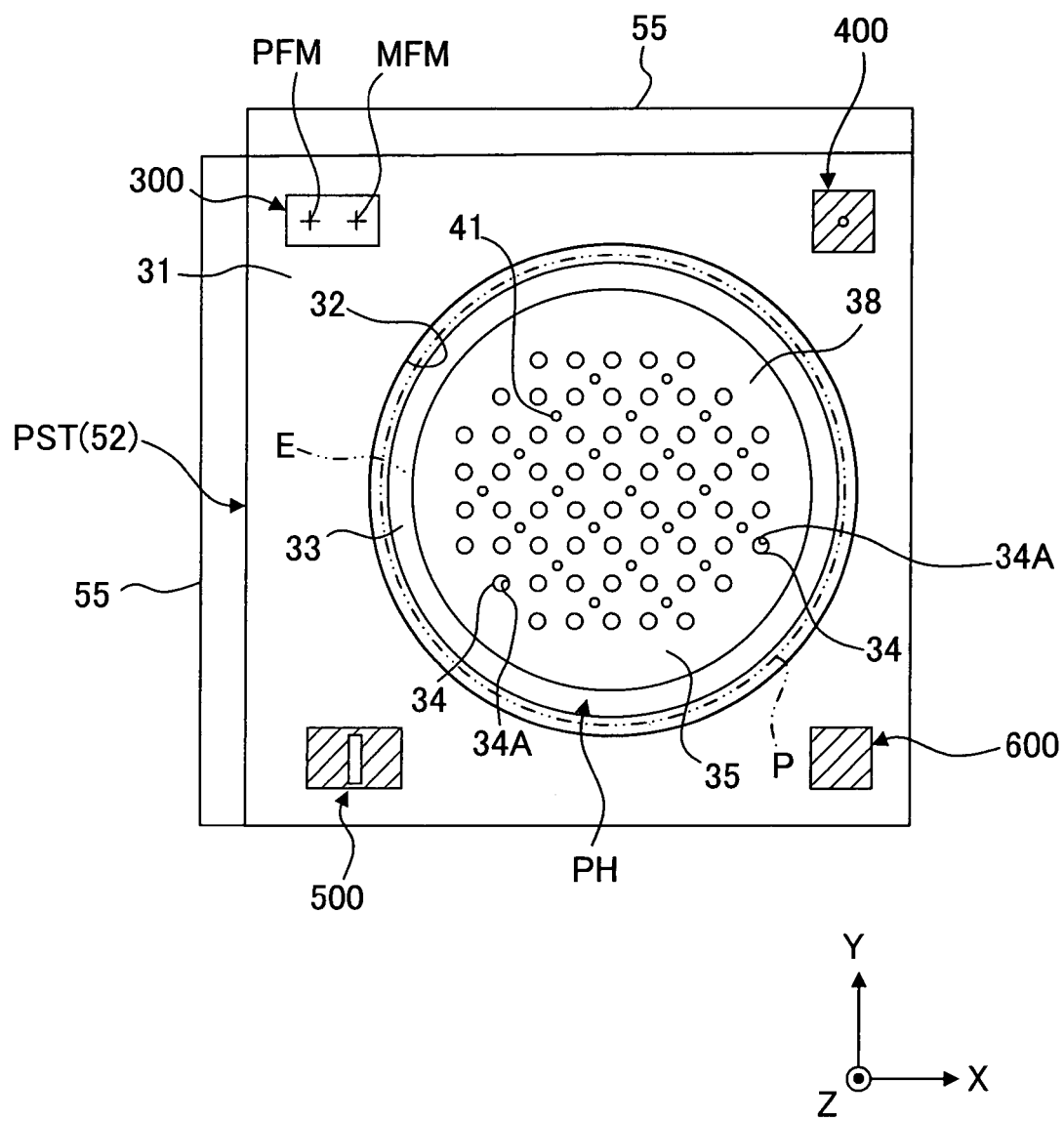
FIG. 3 shows a plan view illustrating a substrate stage.

FIG. 3 shows a plan view illustrating the Z tilt stage 52 of the substrate stage PST as viewed from an upper position. The substrate P is virtually depicted with a broken line in FIG. 3. Movement mirrors 55 are arranged at the two edges of the Z tilt stage 52 which is rectangular as viewed in a plan view, the two edges being perpendicular to each other. The recess 32 is formed at a substantially central portion of the Z tilt stage 52. The substrate holder PH, which holds the substrate P, is arranged in the recess 32.

The substrate holder PH includes a circumferential wall 33 which is substantially annular, and a plurality of pin-shaped supports 34 which are arranged inside the circumferential wall 33 and which hold (support) the substrate P. The respective pin-shaped supports 34 have their upper surfaces 34A which are allowed to make contact with the back surface of the substrate P so that the substrate P is held thereby. The supports 34 are depicted to be relatively large in the drawing. However, actually, a large number of the pin-shaped supports, which are extremely small, are formed inside the circumferential wall 33.

The circumferential wall 33 is arranged around the supports 34. The supports 34 are arranged uniformly inside the circumferential wall 33. As described above, the predetermined gap is formed between the side surface of the substrate P held by the substrate holder PH and the upper surface 31 of the Z tilt stage 52. In the drawing, the upper end surface of the circumferential wall 33 has a relatively wide width. However, actually, the upper end surface of the circumferential wall 33 merely has a width of about 0.1 to 2 mm.

A plurality of suction ports 41 are provided at portions of the upper surface other than the supports 34 of the substrate holder PH. The suction ports 41 are connected via the flow passage to an unillustrated vacuum system including a vacuum pump provided outside the substrate stage PST. The control unit CONT drives the vacuum system to attract and hold the substrate P on the supports 34 by providing the negative pressure in a space 38 by sucking, from the suction ports 41, the gas (air) contained or present in the space 38 which is formed between the substrate holder PH including the circumferential wall 33 and the supports 34 and the substrate P supported by the supports 34. That is, the substrate holder PH of this embodiment is provided with the so-called pin-chuck mechanism.

A reference member (measuring member) 300, which serves as the optical measuring section, is arranged at a predetermined position outside the substrate P on the substrate stage PST. A reference mark PFM to be detected by the substrate alignment system 350 and a reference mark MFM to be detected by the mask alignment system 360 are provided in a predetermined positional relationship on the reference member 300. The upper surface of the reference member 300 is a substantially flat surface, which is provided to have approximately the same height as those of (be flush with) the surface of the substrate P held by the substrate stage PST and the upper surface 31 of the substrate stage PST. The upper surface of the reference member 300 also plays a role of the reference surface for the focus/leveling-detecting system 60.

Various types of optical measuring sections are provided as the optical measuring sections at predetermined positions outside the substrate P on the substrate stage PST, which include, for example, an uneven illuminance sensor 400 as disclosed, for example, in Japanese Patent Application Laid-open No. 57-117238, a spatial image-measuring sensor 500 as disclosed, for example, in Japanese Patent Application Laid-open No. 2002-14005, a radiation amount sensor (illuminance sensor) 600 as disclosed, for example, in Japanese Patent Application Laid-open No. 11-16816, and an unillustrated reflecting member (measuring member) as disclosed in Japanese Patent Application Laid-open No. 62-183522.

The upper surface of each of the optical measuring sections is substantially flush with the upper surface 31 of the substrate stage PST, which is coated with a light-transmissive liquid-repellent (lyophobic) material. In this embodiment, pure or purified water is used as the liquid LQ. The upper surface of each of the optical measuring sections is coated with liquid-repellent CYTOP (produced by Asahi Glass Co., Ltd., trade name).

The liquid-repellent material, which is used for the upper surface of each of the optical measuring sections, has the liquid repellence which is hardly deteriorated even when the exposure light beam EL and the ultraviolet light beam (UV light beam) from the optical cleaning unit 80 are radiated. However, when the liquid repellence is deteriorated and/or when the material is polluted due to the adhesion of any impurity, then the member, which forms the upper surface of each of the optical measuring sections, may be exchanged.

The upper surface of each of the optical measuring sections may be formed integrally with the upper surface 31 of the substrate stage PST. Alternatively, the upper surface of each of the optical measuring sections may be formed on another (separate) member which is distinct from the member for forming the upper surface 31 of the substrate stage PST. It is unnecessary that all of the reference member 300 and the sensors 400, 500, 600 are provided on the substrate stage PST. It is also allowable that at least one of them may be omitted.

Next, an explanation will be made about a method for exposing the substrate P with the image of the pattern of the mask M by using the exposure apparatus EX constructed as described above.

In order to perform the exposure process for the substrate P, the control unit CONT firstly supplies and recovers the liquid LQ by the liquid supply mechanism 10 and the liquid recovery mechanism 20, in the state in which the substrate P is supported on the substrate stage PST, so as to form the liquid immersion area AR2 of the liquid LQ on the side of the image plane of the projection optical system PL.

The control unit CONT performs the various measuring operations by using the optical measuring sections 300, 400, 500, 600 before performing the exposure process for the substrate P. The control unit CONT performs the alignment process for the substrate P and the process for adjusting the image formation characteristic of the projection optical system PL (calibration) on the basis of the obtained result of the measurement. For example, when the measuring operation is performed by using the optical measuring section 400, the control unit CONT moves the substrate stage PST relative to the liquid immersion area AR2 of the liquid LQ by moving the substrate stage PST in the XY directions so that the liquid immersion area AR2 of the liquid LQ is arranged on the optical measuring section 400 to perform the measuring operation through the liquid LQ in this state. Similarly, when the measuring operation is performed by using the optical measuring section 300, and/or when the measuring operation is performed by using the optical measuring section 500, 600, then the substrate stage PST is moved relative to the liquid immersion area AR2 of the liquid LQ to perform the measuring operation through the liquid LQ in the state in which the liquid immersion area AR2 of the liquid LQ is arranged on the optical measuring section 300, 500, 600.

After the alignment process and the calibration process has been performed as described above, the control unit CONT recovers the liquid LQ on the substrate P by the liquid recovery mechanism 20 concurrently with the supply of the liquid LQ onto the substrate P by the liquid supply mechanism 10 to locally form the liquid immersion area AR2 which is smaller than the substrate P and which is larger than the projection area AR1, while the image of the pattern of the mask M is projected onto the substrate P to perform the exposure via the projection optical system PL and the liquid LQ between the projection optical system PL and the substrate P, while moving the substrate stage PST supporting the substrate P in the X axis direction (scanning direction).

The exposure apparatus EXS of the embodiment of the present invention performs the projection exposure for the substrate P with the image of the pattern of the mask M while moving the mask M and the substrate P in the X axis direction (scanning direction). During the scanning exposure, a part of the image of the pattern of the mask M is projected onto the portion included in the projection area AR1 via the projection optical system PL and the liquid LQ of the liquid immersion area AR2. The mask M is moved at the velocity V in the −X direction (or in the +X direction), in synchronization with which the substrate P is moved at the velocity $\beta*V$ ($\beta$ represents the projection magnification) in the +X direction (or in the −X direction) with respect to the projection area AR1. A plurality of shot areas are set on the substrate P. After the exposure is completed for one shot area, the next shot area is moved to the scanning start position in accordance with the stepping movement of the substrate P. The scanning exposure process is successively performed thereafter for the respective shot areas while moving the substrate P in the step-and-scan manner. Alternatively, the respective shot areas are exposed while moving the mask M and the substrate P in the same direction (for example, in the +X direction) depending on the structure of the projection optical system PL.

When a shot area, which is defined in the central area of the substrate P, is exposed, the liquid immersion area AR2 is arranged on the substrate P. On the other hand, when a shot area, which is defined in the edge area of the substrate P, is exposed, the liquid immersion area AR2 is arranged to range over the substrate P and the upper surface 31 of the substrate stage PST respectively.

Figure 4:
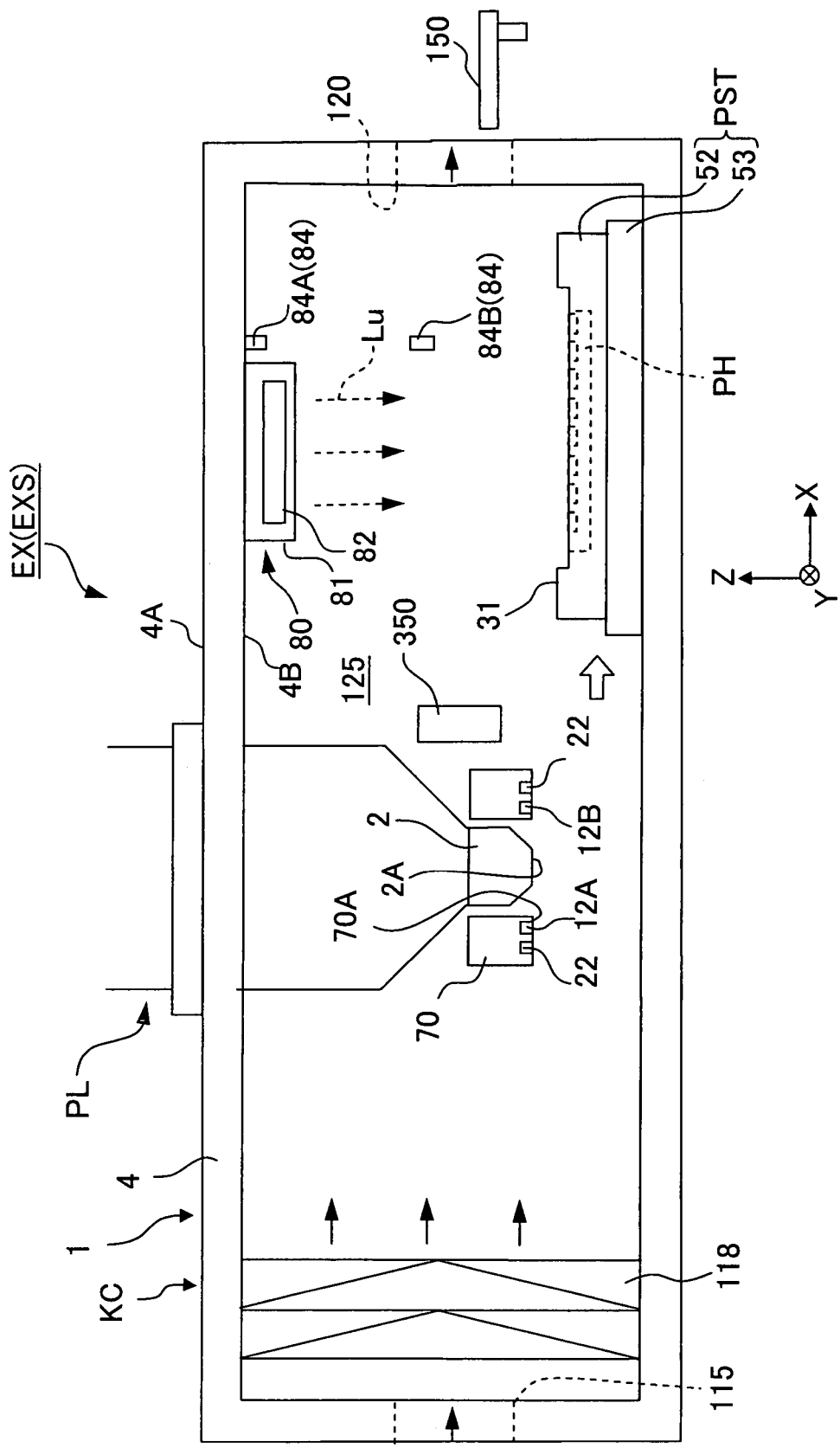
FIG. 4 shows an example of the operation of the exposure apparatus according to the first embodiment.

When the liquid immersion exposure is completed for the substrate P, then the control unit CONT stops the liquid supply having been performed by the liquid supply mechanism 10, and then the control unit CONT uses the liquid recovery mechanism 20 to recover the liquid LQ remaining on the substrate P, on the upper surface 31 of the substrate stage PST, and/or on the optical measuring sections 300, 400, 500, 600. Subsequently, the control unit CONT unloads (exports) the substrate P for which the exposure process has been completed. Further, in order to load (import) an unexposed substrate P, which is not subjected to the exposure yet, onto the substrate P, the substrate stage PST is moved to the +X side with respect to the projection optical system PL as shown in FIG. 4, and the substrate stage PST is arranged on the +X side of the air-conditioned space 125, i.e., at the position (load/unload position) in the vicinity of the substrate transport system 150. As described above, the optical cleaning unit 80 is provided over or above the load/unload position.

The control unit CONT unloads the substrate P for which the exposure process has been completed, from the substrate stage PST by the substrate transport system 150. After that, the substrate stage PST is moved in the state in which the substrate P is absent on the substrate stage PST before loading the unexposed substrate P on the substrate stage PST, and the substrate stage PST is arranged just under or below the optical cleaning unit 80. In this state, the control unit CONT drives the optical cleaning unit 80 to radiate the ultraviolet light beam Lu downwardly from the optical cleaning unit 80. The ultraviolet light beam Lu, which is emitted from the optical cleaning unit 80, is radiated onto the substrate stage PST. The optical cleaning unit 80 radiates the ultraviolet light beam Lu for a predetermined period of time onto the upper surface 31 of the substrate stage PST, the optical measuring sections 300, 400, 500, 600 provided on the upper surface 31 of the substrate stage PST, and the substrate holder PH. The optical cleaning unit 80 may radiate the ultraviolet light beam Lu onto the upper surface of the movement mirror 55.

Any impurity (organic matter), which is present or exists on the upper surface of the substrate stage PST, can be vaporized (removed) by being irradiated with the ultraviolet light beam Lu. The oxygen contained in the air absorbs the ultraviolet light beam Lu to be in the excited state in the vicinity of the upper surface of the substrate stage PST, which is chemically changed, for example, into ozone having the increased oxidizing power. Any impurity (organic matter), which is adhered to the upper surface of the substrate stage PST, is oxidized and decomposed.

There is such a possibility that any impurity (organic matter) generated, for example, from the photosensitive material coated onto the substrate P, may enter in the liquid LQ of the liquid immersion area AR2 and may be mixed in the liquid LQ. The impurity, which is generated from the photosensitive material, includes, for example, fragments of the photosensitive material and deposited matters of the electrolyte contained in the photosensitive material. There is such a possibility that the impurity containing the organic matter may enter in the liquid LQ of the liquid immersion area AR2 and be mixed therein, because the photosensitive material contains the organic matter. As described above, the liquid immersion area AR2 of the liquid LQ is moved on the surface of the substrate P and the upper surface 31 of the substrate stage PST including the optical measuring sections 300, 400, 500, 600. There is such a possibility that the impurity (organic matter) may adhere, for example, to the upper surface 31 of the substrate stage PST and the optical measuring sections 300, 400, 500, 600 provided on the substrate stage PST, as the liquid immersion area AR2 is moved relatively on the substrate stage PST. There is also such a possibility that the impurity (organic matter), which floats in the air, may adhere, for example, to the upper surface 31 of the substrate stage PST and the optical measuring sections 300, 400, 500, 600.

In this embodiment, the organic matter, which adheres onto the upper surface 31 of the substrate stage PST, the optical measuring sections 300, 400, 500, 600, and the substrate holder PH, is removed by the ultraviolet light beam Lu in the atmosphere in which the oxidizing power is strengthened. In this way, the upper surface 31 of the substrate stage PST, the upper surfaces of the optical measuring sections 300, 400, 500, 600, and the substrate holder PH are optically cleaned. It is possible to suppress the formation of the adhesion trace of the liquid LQ as well.

Further, the following possibility may also arise. That is, the liquid LQ, which is disposed on the substrate stage PST, is unsuccessfully recovered after the completion of the liquid immersion exposure for the substrate P, and the liquid LQ remains on the substrate stage PST. If the remaining liquid LQ is left to stand, there is such a possibility that the adhesion trace of the liquid LQ (so-called water mark) may be formed, for example, on the upper surface 31 of the substrate stage PST and the upper surfaces of the optical measuring sections 300, 400, 500, 600 after the liquid LQ is dried. If the liquid LQ enters the back surface side of the substrate P and adheres to the substrate holder PH, there is such a possibility that the adhesion trace of the liquid LQ (so-called water mark) may be also formed on the substrate holder PH. Even when the liquid LQ on the substrate stage PST is successfully recovered after the completion of the liquid immersion exposure for the substrate P, if the apparatus is left to stand for a long period of time in a state in which the impurity (organic matter) adheres onto the substrate stage PST, then there is such a possibility that the adhesion trace (water mark) may be formed.

In this embodiment, it is also expected that the adhesion trace (water mark) is removed owing to the optical cleaning effect by radiating the ultraviolet light beam onto the upper surface 31 of the substrate stage PST, the upper surfaces of the optical measuring sections 300, 400, 500, 600, and the substrate holder PH by using the optical cleaning unit 80.

After the completion of the optical cleaning treatment for the substrate stage PST, the control unit CONT loads the unexposed substrate P on the optically cleaned substrate stage PST. If any impurity (organic matter) adheres to the substrate holder PH, and/or if the adhesion trace (water mark) is formed, then they act as foreign matters, and the following inconvenience arises. That is, it is impossible to satisfactorily attract and hold the substrate P by the substrate holder PH. In other situations, the degree of flatness (flatness) of the held substrate P is deteriorated, and it is impossible to obtain the satisfactory exposure accuracy and the satisfactory measurement accuracy. In this embodiment, the substrate holder PH is optically cleaned before holding the unexposed substrate P with the substrate holder PH. Accordingly, it is possible to avoid the occurrence of the inconvenience which would be otherwise caused as described above.

When the measuring processes are performed by using the optical measuring sections 300, 400, 500, 600 as described above before exposing the substrate P, it is possible to avoid the deterioration of the measurement accuracy, which would be otherwise caused by the adhered impurity (organic matter) and/or the adhesion trace (water mark), by optically cleaning the optical measuring sections 300, 400, 500, 600 before performing the measuring processes.

As described above, when the edge area of the substrate P is subjected to the liquid immersion exposure, a part of the liquid immersion area AR2 is arranged on the upper surface 31 of the substrate stage PST. However, when the upper surface 31 of the substrate stage PST is optically cleaned before performing the liquid immersion exposure, it is possible to avoid the change of the contact angle of the upper surface 31 of the substrate stage PST with respect to the liquid LQ and the change of the contact angles of the upper surfaces of the optical measuring sections 300, 400, 500, 600 with respect to the liquid LQ, which would be otherwise caused by the adhered impurity (organic matter) and/or the adhesion trace (water mark). For example, if the contact angle of the upper surface 31 of the substrate stage PST with respect to the liquid LQ is changed, then the pressure of the liquid LQ of the liquid immersion area AR2 is changed, and the force of the liquid LQ, which is exerted on the substrate P, the substrate stage PST, and the optical element 2 of the projection optical system PL, is also changed in accordance therewith. In such situations, for example, the following inconvenience arises. That is, the substrate P and/or the substrate stage PST for supporting the substrate P is deformed, and/or the position of the optical element 2 is varied. Accordingly, there is such a possibility that the exposure accuracy and the measurement accuracy may be deteriorated. If the force of the liquid LQ, which is exerted, for example, on the substrate P, is changed, for example, the following inconvenience tends to arises. That is, the liquid LQ of the liquid immersion area AR2 outflows to the outside of the substrate P. Bubbles are generated in the liquid immersion area AR2. The liquid LQ enters or infiltrates to the gap between the upper surface 31 and the edge portion of the substrate P. In this embodiment, the upper surface 31 of the substrate stage PST is optically cleaned before performing the liquid immersion exposure. Accordingly, it is possible to avoid the change of the contact angle of the upper surface 31 with respect to the liquid LQ, and it is possible to avoid the occurrence of the inconvenience which would be otherwise caused as described above.

The adhesion trace (water mark), which is formed, for example, on the substrate stage PST, acts as the foreign matter. Therefore, for example, if the foreign matter flows in the air and adheres onto the surface of the substrate P, and the exposure process is performed in this state, then the pattern defect consequently arises on the substrate P. In this embodiment, the optical cleaning unit 80 radiates the ultraviolet light beam Lu so that the adhesion trace (water mark) is not formed on the substrate stage PST. Therefore, it is possible to suppress the formation of the adhesion trace (water mark), and it is possible to avoid the occurrence of the inconvenience such as the pattern defect as described above.

In this embodiment, the optical cleaning unit 80 is provided at the position aligned with the projection optical system PL. When this arrangement is adopted, the substrate stage PST can be moved immediately to the position just below the optical cleaning unit 80 when the exposure process is not performed. It is possible to shorten the time required for the optical cleaning treatment.

The optical cleaning unit 80 (light source 82) serves as a heat-generating source. Therefore, if the optical cleaning unit 80 (light source 82) is disposed at any position excessively near to the projection optical system PL, for example, the fluctuation of the image formation characteristic of the projection optical system PL is caused, resulting in the deterioration of the exposure accuracy and the measurement accuracy via the projection optical system PL. It is also feared that any foreign matter (impurity), which is scattered in the air by the optical cleaning with the optical cleaning unit 80, may affect the exposure accuracy and the measurement accuracy. Therefore, it is desirable that the optical cleaning unit 80 is provided at the position separated by the predetermined distance from the projection optical system PL (optical path for the exposure light beam EL).

This embodiment adopts such an arrangement or construction that the optical cleaning unit 80 is provided on the downstream side of the flow of the gas (air) formed by the air-conditioning system KC with respect to the projection optical system PL. Therefore, it is possible to effectively avoid the conduction of the heat generated by the optical cleaning unit 80 to the projection optical system PL (optical path for the exposure light beam EL). Even when the foreign matter (impurity), which is decomposed by the optical cleaning by the optical cleaning unit 80, is scattered in the air, then the foreign matter (impurity) does not flow toward the projection optical system PL, and the foreign matter (impurity) can be discharged from the gas discharge port 120.

As described above, the installation position of the optical cleaning unit 80 is set in consideration of the direction of the flow of the gas formed by the air-conditioning system KC. Accordingly, it is possible to avoid the deterioration of the exposure accuracy and the measurement accuracy which would be otherwise caused by the optical cleaning unit 80.

Those usable as the radiation light beam Lu radiated from the optical cleaning unit 80 may also include, for example, the vacuum ultraviolet light beam (VUV light beam) such as the ArF excimer laser beam (wavelength: 193 nm) and the $F_2$ laser beam (wavelength: 157 nm) provided that the radiation light beam has the optical cleaning effect. Alternatively, it is also possible to use, for example, a mercury lamp and a deuterium lamp. In this case, it is possible to lower the cost of the optical cleaning unit 80.

As described above, the optical cleaning is constructed such that the oxidizing power is strengthened in the atmosphere in the vicinity of the irradiated area of the ultraviolet light beam Lu on the basis of the absorption of the ultraviolet light beam Lu by the oxygen so that the impurity (organic matter) is oxidized and decomposed to accelerate the removal thereof. However, it is not necessarily indispensable that the oxygen is present in the atmosphere in the vicinity of the irradiated area of the ultraviolet light beam Lu. On the other hand, the oxygen acts as a light-absorbing substance with respect to the ultraviolet light beam Lu. Therefore, if the oxygen concentration is excessively high in the atmosphere, the ultraviolet light beam Lu is not radiated at a sufficient light intensity. Therefore, it is desirable that the oxygen concentration in the atmosphere is set to be optimum depending on, for example, the wavelength of the ultraviolet light beam Lu to be radiated.

Accordingly, the control unit CONT detects the oxygen concentration in the air-conditioned space 125 including the optical path for the ultraviolet light beam Lu by using the detectors 84 (84A, 84B). When the optical cleaning is performed, it is appropriate that the oxygen concentration of the space including at least the optical path for the ultraviolet light beam Lu, of the air-conditioned space 125 is adjusted on the basis of the detection result of the detector 84. For example, when the oxygen concentration detected by the detector 84 is lower than a desired concentration, the control unit CONT can raise the oxygen concentration of the air-conditioned space 125 by adding the oxygen to the gas to be supplied to the air-conditioned space 125 from the gas feed port 115 of the air-conditioning system KC. On the other hand, when the oxygen concentration detected by the detector 84 is higher than a desired concentration, the control unit CONT can lower the oxygen concentration of the air-conditioned space 125 by adding any inert gas such as nitrogen gas to the gas to be supplied to the air-conditioned space 125 from the gas feed port 115 of the air-conditioning system KC. The gas contained in the air-conditioned space 125 is recovered from the gas discharge port 120.

Second Embodiment

Figure 5:
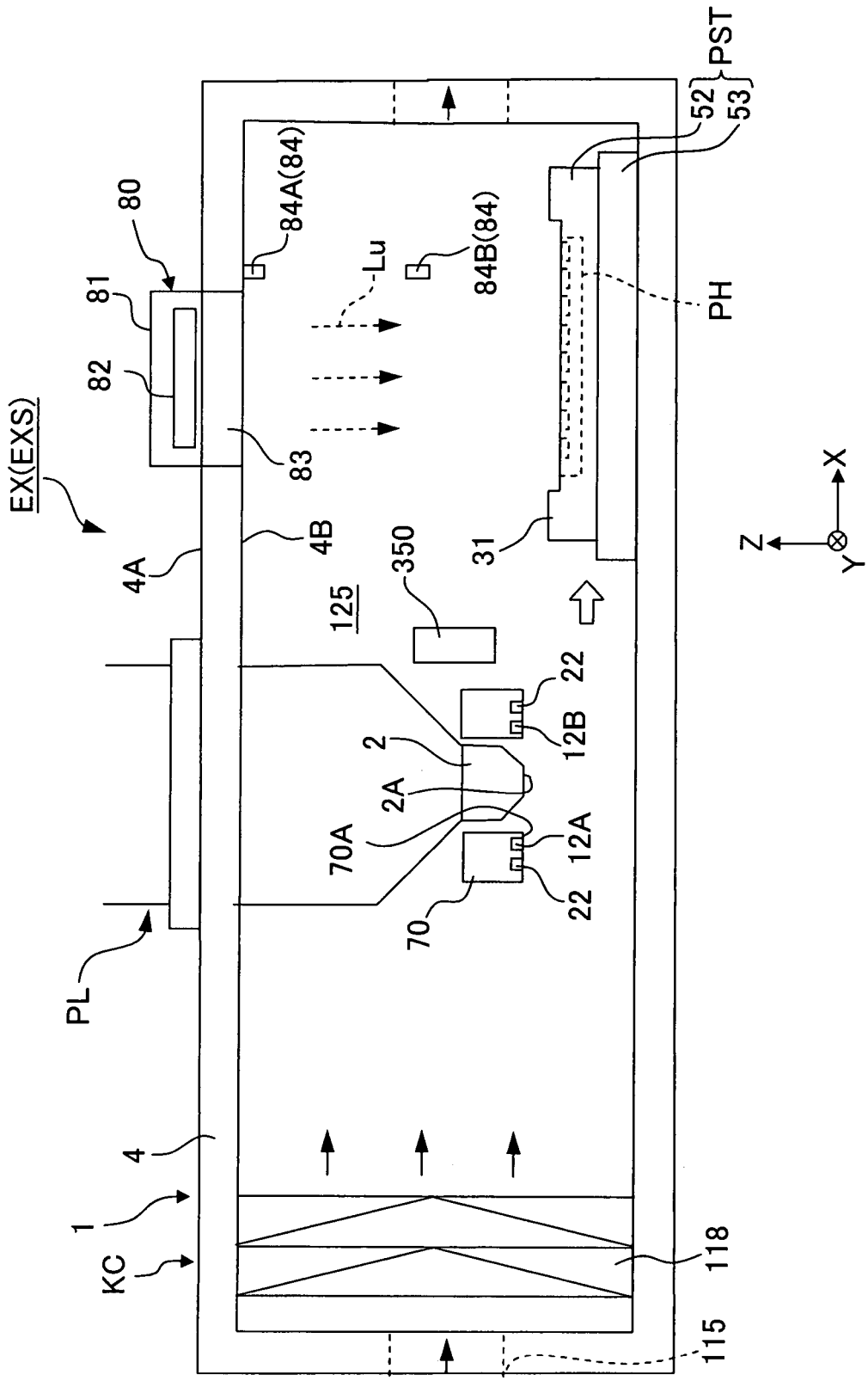
FIG. 5 shows a schematic arrangement illustrating an exposure apparatus according to a second embodiment.

FIG. 5 shows a schematic arrangement illustrating a second embodiment of the present invention. In the following explanation, constitutive parts or portions, which are the same as or equivalent to those of the embodiment described above, are designated by the same reference numerals, any explanation of which will be simplified or omitted.

As described above, the optical cleaning unit 80 (light source 82) serves as the heat-generating source. Therefore, the optical cleaning unit 80 (light source 82) may be arranged outside the air-conditioned space 125 as shown in FIG. 5. Accordingly, it is possible to more effectively avoid the conduction of the heat generated by the optical cleaning unit 80 to the projection optical system PL (optical path for the exposure light beam EL). With reference to FIG. 5, the optical cleaning unit 80 is provided on the upper surface 4A of the main column 4, and is arranged outside the air-conditioned space 125. A transmissive window 83, through which the ultraviolet light beam Lu is transmissive, is provided at a part of the upper wall of the main column 4. The optical cleaning unit 80 is provided on the transmissive window 83. The transmissive window 83 is composed of a material which scarcely absorbs the ultraviolet light beam Lu, including, for example, silica glass, calcium fluorite, and magnesium fluoride. The optical cleaning unit 80 radiates the ultraviolet light beam Lu downwardly. The ultraviolet light beam Lu, which is emitted from the optical cleaning unit 80, passes through the transmissive window 83, and then the ultraviolet light beam Lu is radiated onto the substrate stage PST arranged just below the optical cleaning unit 80 and the transmissive window 83.

In the embodiment shown in FIG. 5, the optical cleaning unit 80 is arranged outside the air-conditioned space 125. Therefore, it is possible to expand the degree of freedom in relation to the design of the way of the flow of the gas in the air-conditioned space 125 formed by the air-conditioning system KC.

Third Embodiment

Figure 6:
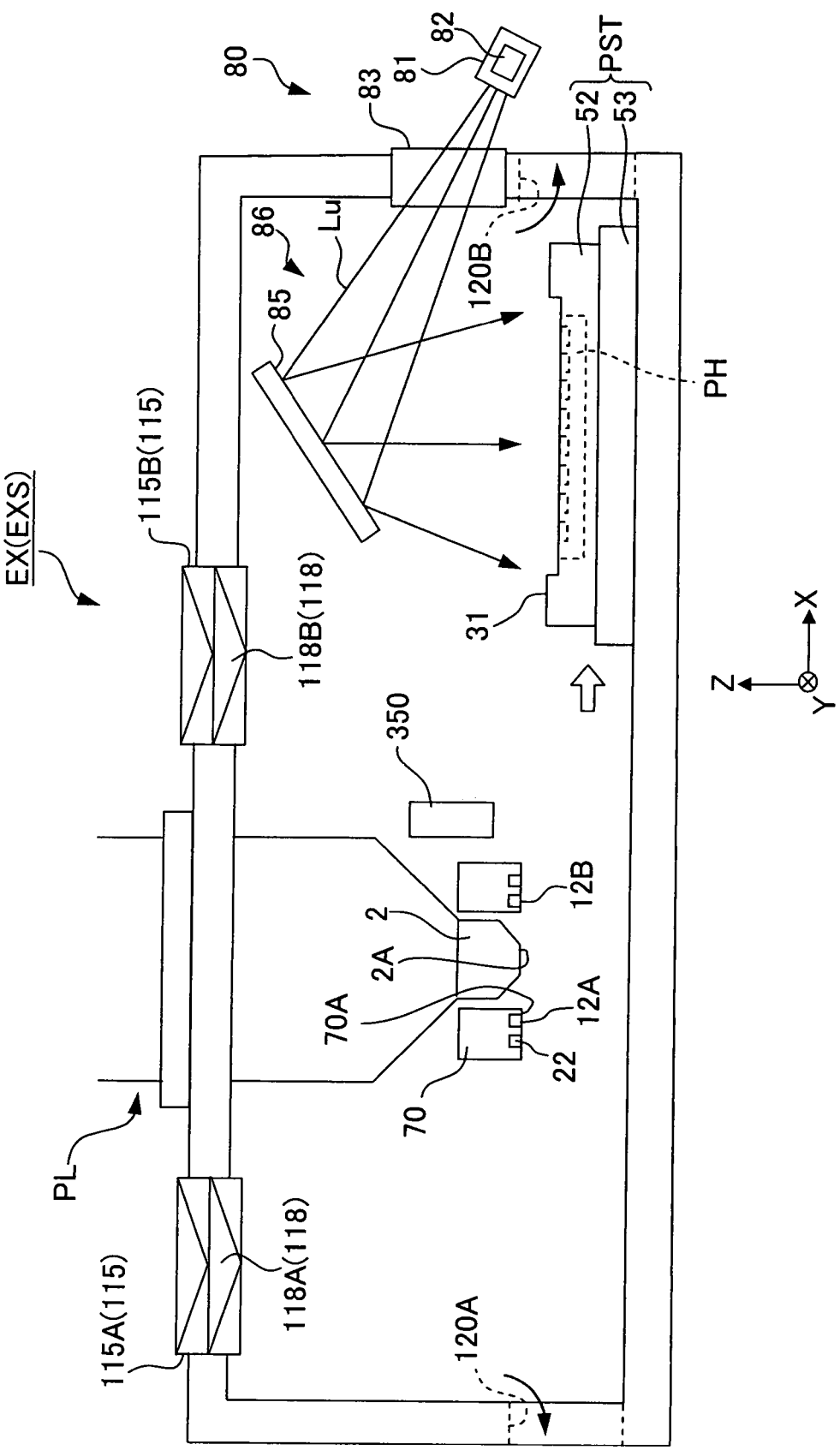
FIG. 6 shows a schematic arrangement illustrating an exposure apparatus according to a third embodiment.

FIG. 6 shows a third embodiment. With reference to FIG. 6, an optical cleaning unit 80 includes a light source 82 which is arranged outside the air-conditioned space 125 and which radiates the ultraviolet light beam Lu, and an optical system 86 which guides the ultraviolet light beam Lu radiated from the light source 82 onto the substrate stage PST arranged inside the air-conditioned space 125. The optical system 86 includes a transmissive window 83 which is provided at a part of the side wall of the main column 4 on the +X side and through which the ultraviolet light beam Lu is transmissive, and a reflecting mirror 85 which is arranged inside the air-conditioned space 125 and which bends the optical path for the ultraviolet light beam Lu allowed to pass through the transmissive window 83. The transmissive window 83 is formed of a material which scarcely absorbs the ultraviolet light beam Lu, including, for example, silica glass, calcium fluorite, and magnesium fluoride, in the same manner as described above. The light source 82 is arranged in the vicinity of the transmissive window 83 and outside the main column 4 on the +X side in a state in which the light source 82 is accommodated in a housing 81. The ultraviolet light beam Lu, which is emitted from the light source 82, passes through the transmissive window 83, and then the ultraviolet light beam Lu is reflected by the reflecting mirror 85, and then the ultraviolet light beam Lu is radiated onto the substrate stage PST. The reflecting mirror 85 may be either a convex mirror or a concave mirror. When the reflecting mirror 85 is a convex mirror, a wide area of the substrate stage PST can be collectively illuminated with the ultraviolet light beam Lu. On the other hand, when the reflecting mirror 85 is a concave mirror, then the ultraviolet light beam Lu, which is radiated from the light source 82, can be collected with the reflecting mirror 85, and then the ultraviolet light beam Lu can be radiated onto the substrate stage PST. Alternatively, the reflecting mirror 85 may be provided movably (swingably) so that the reflecting mirror 85 is moved. Accordingly, the ultraviolet light beam Lu, which is reflected by the reflecting mirror 85, can be radiated onto a desired position of the substrate stage PST. It is also allowable to use an optical element such as a lens or a prism which deflects or collects the ultraviolet light beam Lu, in place of the reflecting mirror 85 or in addition to the reflecting mirror 85.

Also in the embodiment shown in FIG. 6, the light source 82, which serves as a heat-generating source, is arranged outside the air-conditioned space 125. Therefore, it is possible to more effectively avoid the conduction of the heat generated by the light source 82 of the optical cleaning unit 80 to the projection optical system PL (optical path for the exposure light beam EL).

Also in the embodiment shown in FIG. 6, the light source 82 of the optical cleaning unit 80 is arranged outside the air-conditioned space 125. Therefore, it is possible to expand the degree of freedom in relation to the design of the way of the flow of the gas in the air-conditioned space 125 formed by the air-conditioning system KC. For example, in the embodiment shown in FIG. 6, two gas feed ports 115 (115A, 115B) are provided to supply the gas to the air-conditioned space 125, the gas feed ports being provided at the upper wall of the main column 4. Filter units 118 (118A, 118B) are provided for the gas feed ports 115A, 115B respectively in the same manner as in the embodiment described above. In this embodiment, the air-conditioning system KC supplies the gas in the vertical direction, i.e., in the −Z direction in this embodiment from the gas feed ports 115A, 115B to the air-conditioned space 125. Gas discharge ports 120 (120A, 120B), which discharge the gas from the air-conditioned space 125, are provided at lower portions of the side walls on the +X side and the −X side of the main column 4 respectively.

In the embodiments (first to third embodiments) shown in FIGS. 4 to 6, the substrate stage PST is moved to the predetermined position in the X direction from the position below the projection optical system PL, and the ultraviolet light beam Lu is radiated onto the substrate stage PST at the predetermined position. However, there is no limitation thereto. The ultraviolet light beam Lu may be guided to the substrate stage PST positioned below the projection optical system PL by using the reflecting mirror shown in FIG. 6 or any other optical member, while maintaining the substrate stage PST at the position below the projection optical system PL. In the embodiments (first to third embodiments) shown in FIGS. 4 to 6, when the oxygen concentration in the air-conditioned space 125 is maintained by the air-conditioning system 125 to be in a state in which the optical cleaning can be performed, then the detector 84 may be omitted, and it is also allowable that the adjustment of the oxygen concentration based on the detection result of the detector 84 is not performed actively.

In the first embodiment explained, for example, with reference to FIG. 2, the flow of the gas is in the lateral direction in the air-conditioned space 125. Therefore, the distance of the flow of the gas is long, and there is such a high possibility that any difference in temperature appears between the upstream portion and the downstream portion. Therefore, any temperature distribution may arise in relation to the direction of radiation of the measuring beam of the laser interferometer 56, and there is such a high possibility that the optical path for the measuring beam may be fluctuated. As a result, it is also feared that the position measurement accuracy for the substrate stage PST by the laser interferometer 56 may be lowered. On the other hand, in the third embodiment shown in FIG. 6, the direction of the flow of the gas is the vertical direction in the air-conditioned space 125. Therefore, it is possible to shorten the distance of the flow of the gas. It is possible to suppress the inconvenience which would be otherwise caused such that any temperature distribution appears between the upstream portion and the downstream portion. Further, the direction of the flow of the gas is substantially perpendicular to the direction of radiation of the measuring beam of the laser interferometer 56. Therefore, it is possible to suppress the inconvenience which would be otherwise caused such that the temperature distribution appears in relation to the direction of radiation of the measuring beam. Therefore, it is possible to maintain the position measurement accuracy for the substrate stage PST by the laser interferometer 56.

Fourth Embodiment

Figure 7:
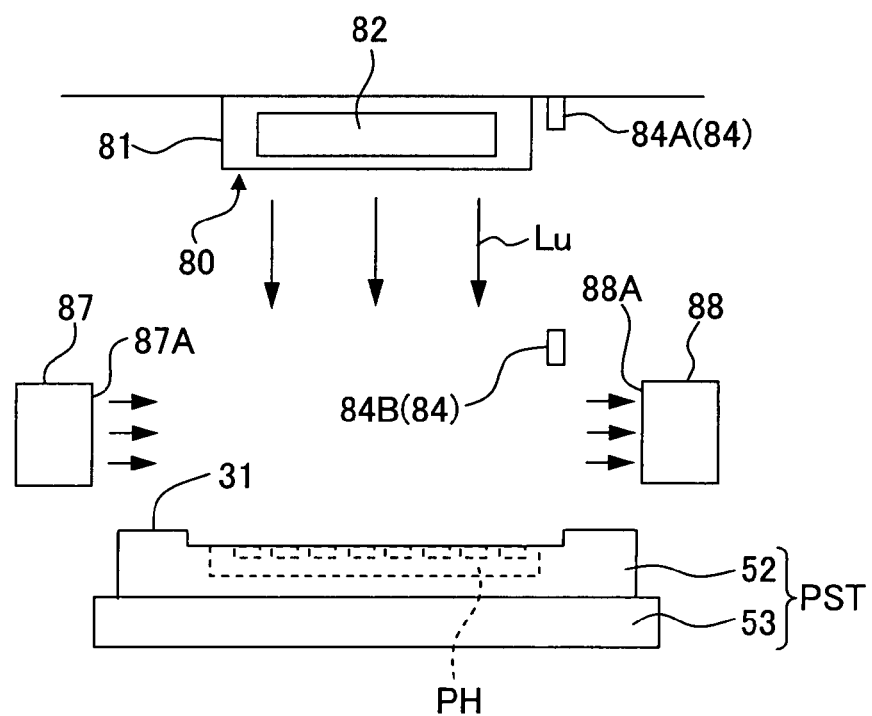
FIG. 7 shows a schematic arrangement illustrating an exposure apparatus according to a fourth embodiment.

Next, a fourth embodiment will be explained with reference to FIG. 7. In the case of the configuration in which the oxygen concentration of the entire air-conditioned space 125 is adjusted by using the air-conditioning system KC as in the first to third embodiments described above, there is such a possibility that the process requires a long period of time until atmosphere in the entire air-conditioned space 125 is replaced with that with a desired oxygen concentration. Accordingly, as shown in FIG. 7, it is appropriate that an optical cleaning unit 80 includes a gas supply system 87 which supplies the predetermined gas to area or areas in the vicinity of the irradiated area to be irradiated with the ultraviolet light beam Lu, of the substrate stage PST, and a gas recovery system 88 which sucks and recovers the gas. A supply port 87A of the gas supply system 87 and a recovery port 88A of the gas recovery system 88 are provided in the vicinity of the substrate stage PST, and are arranged so that they are opposed to each other with the substrate stage PST intervening therebetween.

The control unit CONT detects the oxygen concentration of the air-conditioned space 125 including the optical path for the ultraviolet light beam Lu by using the detectors 84 (84A, 84B), and adjusts the gas component (oxygen concentration) to be supplied from the gas supply system 87 on the basis of the detection result of the detectors 84 when the optical cleaning is performed. For example, when the oxygen concentration detected by the detector 84 is lower than a desired concentration, the control unit CONT is capable of raising the oxygen concentration in the vicinity of the irradiated area by adding the oxygen to the gas to be supplied to the irradiated area from the gas supply system 87. On the other hand, when the oxygen concentration detected by the detector 84 is higher than a desired concentration, the control unit CONT is capable of lowering the oxygen concentration in the vicinity of the irradiated area by adding any inert gas such as nitrogen gas to the gas to be supplied to the irradiated area from the gas supply system 87.

When the construction as described above is adopted, only the relatively small space, which is in the vicinity of the objective area of the optical cleaning (irradiated area to be irradiated with the ultraviolet light beam Lu), can be quickly set to be as an environment suitable for the optical cleaning. It is possible to shorten the period of time required for the optical cleaning treatment. In the embodiment shown in FIG. 7, the recovery port 88A of the gas recovery system 88 is provided in the vicinity of the irradiated area to be irradiated with the ultraviolet light beam Lu. Therefore, even when any foreign matter is generated, for example, from the surface of the substrate stage PST, it is possible to suck and recover the foreign matter. For example, when the substrate stage PST is optically cleaned, any organic matter, which adheres to the substrate stage PST, is vaporized and allowed to flow in some situations. However, when the vaporized organic matter is quickly recovered by the gas recovery system 88, it is possible to maintain the cleanness of the air-conditioned space 125. The gas supply system 87 can also supply the oxidation-accelerating gas (optical cleaning-accelerating gas) such as ozone. Accordingly, the space (atmosphere), which is in the vicinity of the optical cleaning objective area (irradiated area to be irradiated with the ultraviolet light beam Lu), can be filled with the ozone gas. The impurity (organic matter), which adheres onto the substrate stage PST, can be oxidized and decomposed with the ultraviolet light beam Lu to effect the optical cleaning in the atmosphere in which the oxidizing power is strengthened.

Fifth Embodiment

Next, a fifth embodiment will be explained with reference to FIG. 8. An optical cleaning unit 80 shown in FIG. 8 performs the optical cleaning by radiating the ultraviolet light beam Lu onto the nozzle member 70 and the optical element 2 which is closest to the image plane among the plurality of optical elements for constructing the projection optical system PL. The optical element 2 and the nozzle member 70 are members which make contact with the liquid LQ of the liquid immersion area AR2. The optical cleaning unit 80 radiates at least the ultraviolet light beam Lu onto the liquid contact surfaces 2A, 70A of the optical element 2 and the nozzle member 70, respectively, which make contact with the liquid LQ of the liquid immersion area AR2. The optical cleaning unit 80 is provided at a predetermined position of the substrate stage PST other than those of the substrate holder PH, the reference member, and the optical measuring section. A light source 82 of the optical cleaning unit 80 is provided inside a recess 59 which is formed at a predetermined position of the substrate stage PST. The opening of the recess 59 is closed by a transmissive window 83 through which the ultraviolet light beam Lu is transmissive. The light source 82 of the optical cleaning unit 80 radiates the ultraviolet light beam Lu upwardly. The ultraviolet light beam Lu, which is emitted from the light source 82, passes through the transmissive window 83, and then the optical element 2 and the nozzle member 70 are irradiated therewith.

Figure 8:
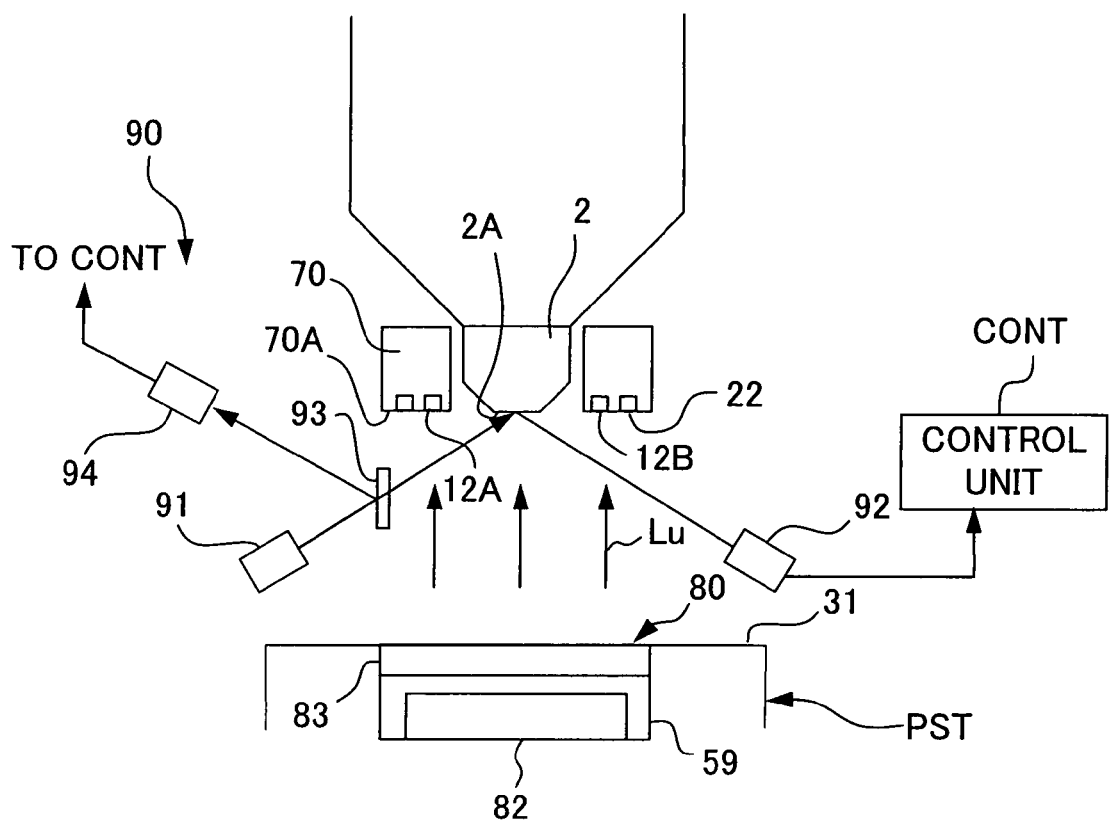
FIG. 8 shows a schematic arrangement illustrating an exposure apparatus according to a fifth embodiment.

With reference to FIG. 8, a detection unit (detection device) 90 is provided, which detects the pollution of the lower surface 2A of the optical element 2 and the lower surface 70A of the nozzle member 70. The detection unit 90 is capable of detecting any impurity (organic matter) adhered to the lower surfaces 2A, 70A. The impurity referred to herein includes the adhesion trace (water mark) of the liquid LQ and any foreign matter (for example, fragments of the photosensitive material and deposited matters of the electrolyte contained in the photosensitive material) generated from the photosensitive material (photoresist) of the substrate P, in the same manner as described above. The following explanation will be made about the case in which the pollution (foreign matter) of the lower surface 2A of the optical element 2 is detected. However, the detection can be also performed in accordance with the same procedure when the pollution (foreign matter) of the lower surface 70A of the nozzle member 70 is detected.

With reference to FIG. 8, the detection unit 90 includes a light-emitting section 91 which is provided above the substrate stage PST (Z stage 52) and which radiates a predetermined detecting light beam, from an obliquely downward position, onto the lower surface 2A of the optical element 2 of the projection optical system PL (or the lower surface 70A of the nozzle member 70); a branching mirror 93 which is arranged on an optical path for connecting the lower surface 2A of the optical element 2 and the light-emitting section 91; a first light-receiving section 92 which is provided at a position above or over the substrate stage PST and which receives a reflected light beam from the lower surface 2A of the optical element 2 on the basis of the radiation from the light-emitting section 91; and the second light-receiving section 94 which is arranged at a position above or over the substrate stage PST and which receives a branched light beam from the branching mirror 93 on the basis of the radiation from the light-emitting section 91. For example, the light-emitting section 91 and the first light-receiving section 92, which construct the detection unit 90, are provided at the positions above the substrate stage PST other than those above the substrate holder PH, the reference member, and the optical measuring section. The light-receiving results of the first and second light-receiving sections 92, 94 are outputted to the control unit CONT. The control unit CONT determines the light reflectance of the lower surface 2A of the optical element 2 on the basis of the light-receiving results of the first and second light-receiving sections 92, 94 to compare the determined light reflectance and a previously stored predetermined reflectance. The pollution (degree of pollution) of the lower surface 2A of the optical element 2 is detected (measured) on the basis of the result of the comparison. In other words, when any foreign matter adheres to the optical element 2, then any scattered light is generated due to the foreign matter to change the reflectance, and the light-receiving amount of the light beam received by the first light-receiving section 92 is changed. The control unit CONT previously stores, as the predetermined reflectance, the light reflectance of the lower surface 2A of the optical element 2 measured when the apparatus is completed and/or when the optical cleaning is performed previously wherein it is assumed that the lower surface 2A of the optical element 2 is not polluted to such an extent that the optical characteristic is affected thereby.

When the pollution of the optical element 2 is detected, the control unit CONT moves the substrate stage PST to arrange the detection unit 90 below the projection optical system PL. When the predetermined detecting light beam is radiated from the light-emitting section 91, then the detecting light beam, which is included in the radiated detecting light beam and which passes through the branching mirror 93, radiates the lower surface 2A of the optical element 2, and then the detecting light beam is reflected by the lower surface 2A. The reflected light beam is received by the first light-receiving section 92. On the other hand, the detecting light beam (branched light beam), which is branched by the branching mirror 93, is received by the second light-receiving section 94 without arriving at the lower surface 2A of the optical element 2. The light-receiving results of the both light-receiving sections 92, 94 are outputted to the control unit CONT. The control unit CONT determines the light reflectance of the lower surface 2A of the optical element 2 on the basis of the light-receiving result of the first light-receiving section 92 and the light-receiving result of the second light-receiving section 94 to determine whether or not the determined light reflectance is not less than an allowable value with respect to the predetermined reflectance. That is, if the determined light reflectance is less than the allowable value with respect to the predetermined reflectance, the control unit CONT judges that the lower surface 2A of the optical element 2 is not polluted. On the other hand, if the determined light reflectance is not less than the allowable value with respect to the predetermined reflectance, the control unit CONT judges that the lower surface 2A of the optical element 2 is polluted.

The control unit CONT controls the operation of the optical cleaning unit 80 on the basis of the detection result of the detection unit 90. Specifically, when it is judged that the lower surface 2A of the optical element 2 is not polluted on the basis of the detection result of the detection unit 90, then the control unit CONT does not perform the optical cleaning treatment by the optical cleaning unit 80, and the exposure operation is continued. Accordingly, any unnecessary optical cleaning treatment is not performed. Therefore, it is possible to improve the throughput (working rate of the exposure apparatus). On the other hand, when it is judged that the lower surface 2A of the optical element 2 is polluted on the basis of the detection result of the detection unit 90, the control unit CONT performs the optical cleaning treatment by the optical cleaning unit 80. If the lower surface 2A of the optical element 2 of the projection optical system PL is polluted, and the adhesion trace of the liquid or the like is consequently formed, then the radiation amount and the illuminance distribution of the measuring light beam and/or the exposure light beam allowed to pass through or via the projection optical system PL may be, for example, changed, and there is such a possibility that the exposure accuracy and the measurement accuracy may be deteriorated. In this embodiment, the lower surface 2A of the optical element 2 is subjected to the optical cleaning treatment by using the optical cleaning unit 80. Therefore, it is possible to avoid the occurrence of the inconvenience which would be otherwise caused such that the exposure process and/or the measurement process is performed by using the optical element 2 in the polluted state. When the optical cleaning treatment is performed for the lower surface 2A of the optical element 2 and the lower surface 70A of the nozzle member 70 by using the optical cleaning unit 80, it is possible to maintain the liquid-attractive properties of the lower surface 2A of the optical element 2 and the lower surface 70A of the nozzle member 70 (contact angle with respect to the liquid LQ is not more than 20 degrees). It is possible to continuously retain the liquid LQ satisfactorily between the substrate stage PST (substrate P) and the optical element 2 and the nozzle member 70. Any pollutant (foreign matter), which adheres to the supply port 12 and the recovery port 22 of the nozzle member 70, can be also removed. Therefore, the liquid is stably supplied and recovered with respect to the optical path space disposed on the side of the image plane of the optical element 2. It is possible to satisfactorily maintain the liquid immersion area AR2 of the liquid LQ.

When the lower surface 2A of the optical element 2 and the lower surface 70A of the nozzle member 70 are optically cleaned by using the optical cleaning unit 80 in this embodiment, it is also allowable that the space between the optical cleaning unit 80 and the lower surface 2A of the optical element 2 and the lower surface 70A of the nozzle member 70 is filled with the liquid LQ. In this procedure, the space between the optical cleaning unit 80 and the lower surface 2A of the optical element 2 and the lower surface 70A of the nozzle member 70 can be continuously filled with the liquid LQ even when the supply operation of the liquid supply unit 10 and the recovery operation of the liquid recovery unit 20 are not performed. However, when the optical cleaning is performed while executing the supply operation and the recovery operation for the liquid, any impurity (pollutant), which is removed from the lower surface 2A of the optical element 2 and the lower surface 70A of the nozzle member 70, can be recovered together with the liquid LQ.

The mask alignment system 360 can be also used as the detection unit 90 in order to detect the pollution of the lower surface 2A of the optical element 2. Alternatively, the optical measuring section, which is arranged on the substrate stage PST, may be used to judge the pollution state of the lower surface 2A of the optical element 2 according to the change of the transmittance of the exposure light beam of the projection optical system PL. Alternatively, an observing system (for example, a camera) may be disposed under and opposite to the lower surface 2A of the optical element 2 and the lower surface 70A of the nozzle member 70 to judge whether or not the optical cleaning is to be executed for the lower surface 2A of the optical element 2 and the lower surface 70A of the nozzle member 70 by using the observing system. In the fifth embodiment explained with reference to FIG. 8, the optical cleaning treatment is performed by the optical cleaning unit 80 after confirming the pollution state of the lower surface 2A of the optical element 2 and the lower surface 70A of the nozzle member 70 by using the detection unit 90. However, the detection unit 90 may be omitted, and the optical cleaning treatment can be performed, for example, every predetermined period of time or every time when a predetermined number of pieces of the substrates are processed. In the fifth embodiment, the both of the lower surface 2A of the optical element 2 and the lower surface 70A of the nozzle member 70 are optically cleaned. However, it is also allowable that only any one of them is optically cleaned.

Sixth Embodiment

Next, a sixth embodiment will be explained with reference to FIG. 9. The respective first to fifth embodiments described above are constructed such that the exposure apparatus EXS (exposure apparatus body EX) is provided with one substrate stage PST. However, the optical cleaning unit 80 of the present invention is also applicable to an exposure apparatus provided with two stages as disclosed in Japanese Patent Application Laid-open No. 11-135400.

Figure 9:
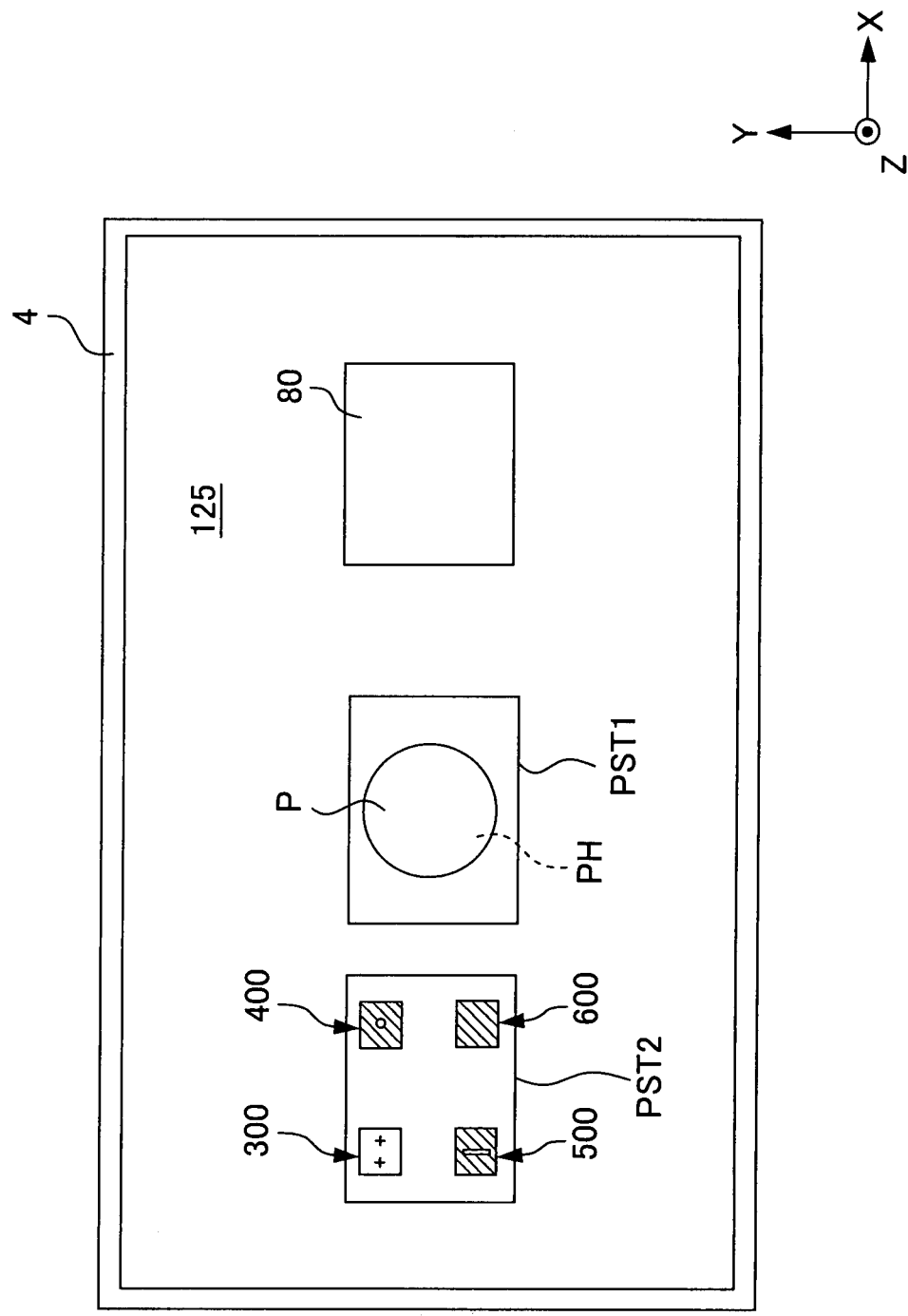
FIG. 9 shows a schematic arrangement illustrating an exposure apparatus according to a sixth embodiment.

A exposure apparatus body EX shown in FIG. 9 includes a substrate stage PST1 which has the substrate holder PH for holding the substrate P and which is movable while holding the substrate P, and a measuring stage PST2 which is provided at a position beside the substrate stage PST1 and which is provided with the optical measuring sections 300, 400, 500, 600 described above. In this embodiment, the reference member (measuring member) and the optical measuring section are not provided on the substrate stage PST1. The measuring stage PST2 is exclusively used for the measurement, and this stage does not hold the substrate P. The substrate stage PST1 and the measuring stage PST2 have stage-driving units including, for example, linear motors respectively, and they are two-dimensionally movable independently from each other in the XY plane. The positions of the substrate stage PST1 and the measuring stage PST2 in the XY directions are measured by laser interferometers.

When various types of measurement processes are performed, the measuring stage PST2 is arranged below the projection optical system PL. The liquid immersion area AR2 of the liquid LQ is formed on the measuring stage PST2. The measurement processes are performed by using the optical measuring sections 300, 400, 500, 600 through the liquid LQ of the liquid immersion area AR2. An unexposed substrate P is loaded on the substrate stage PST1 during the period in which the measurement process is performed by using the measuring stage PST2.

After the completion of the measurement process, the liquid immersion area AR2 of the liquid LQ, which is formed on the measuring stage PST2, is moved by the control unit CONT onto the substrate stage PST1 which supports the substrate P. When the liquid immersion area AR2 is moved from the measuring stage PST2 onto the substrate stage PST1, the control unit CONT integrally moves the measuring stage PST2 and the substrate stage PST1 with respect to the liquid immersion area AR2 formed on the side of the image plane of the projection optical system PL, for example, in a state in which the measuring stage PST2 and the substrate stage PST1 are allowed to make approach closely to each other to such an extent that any liquid LQ does not leak from the space therebetween. After the liquid immersion area AR2 is moved onto the substrate stage PST1, the control unit CONT performs the alignment process for the substrate P and the process for adjusting (calibrating) the image formation characteristic of the projection optical system PL on the basis of the measurement result measured by using the measuring stage PST2 as described above. After that, the substrate P on the substrate stage PST1 is subjected to the liquid immersion exposure.

As described above, in the embodiment shown in FIG. 9, the liquid immersion area AR2 of the liquid LQ is formed on both of the substrate stage PST1 and the measuring stage PST2. Therefore, there is such a possibility that the impurity (organic matter) may be adhered and/or the adhesion trace (water mark) of the liquid LQ may be formed on the upper surface of the substrate stage PST1 and the upper surface of the measuring stage PST2 respectively. However, the optical cleaning can be performed for the substrate stage PST1 and the measuring stage PST2 by using the optical cleaning unit 80 as explained in the first to fourth embodiments. For example, the control unit CONT can perform the optical cleaning by radiating the ultraviolet light beam Lu onto the substrate stage PST1 and the measuring stage PST2 respectively by using the optical cleaning unit 80 every predetermined time intervals (every time when a predetermined number of pieces of the substrates are processed). Alternatively, the control unit CONT detects the pollution of the substrate stage PST1 and the measuring stage PST2 by using the detection unit 90 to control the operation of the optical cleaning unit 80 on the basis of the obtained detection result. The measuring stage PST2 can be optically cleaned by using the optical cleaning unit 80 as well during the exposure for the substrate P on the substrate stage PST1. Alternatively, the substrate stage PST1 may be optically cleaned during the execution of the measuring operation on the measuring stage PST2. In the case of the exposure apparatus provided with the substrate stage PST1 and the measuring stage PST2 as described above, the optical cleaning unit 80 as described in the fifth embodiment may be provided for the measuring stage PST2 to optically clean the lower surface 2A of the optical element 2 and/or the lower surface 70A of the nozzle member 70. In this case, at least a part of the detecting system for detecting the pollution state of the lower surface 2A of the optical element 2 and/or the lower surface 70A of the nozzle member 70 may be provided for the measuring stage.

The present invention is also applicable to an exposure apparatus of the twin-stage type provided with a plurality of substrate stages disclosed, for example, in Japanese Patent Application Laid-open Nos. 10-163099 and 10-214783 and Published Japanese Translation of PCT International Publication for Patent Application No. 2000-505958. In the case of the twin-stage type exposure apparatus as described above, the optical cleaning unit 80, which is described, for example, in the fifth embodiment, may be provided for any one of the substrate stages, or the optical cleaning units 80 may be provided for both of the substrate stages. In the case of the twin-stage type exposure apparatus as described above, the optical cleaning can be performed for one of the substrate stages during the period in which the substrate is exposed on the other of the substrate stages or during the period in which the positional adjustment operation is performed for the other of the substrate stages.

The fifth and sixth embodiments described above are constructed such that the optical cleaning unit 80 is fixed to the substrate stage PST and/or the measuring stage PST2. However, it is also allowable to adopt such an arrangement that the optical cleaning unit 80 is detachable with respect to the substrate stage PST and/or the measuring stage PST2. In this case, the optical cleaning unit 80 may be attached/detached by the operator with respect to the substrate stage PST and/or the measuring stage PST2 when the exposure apparatus EXS is subjected to the maintenance to be performed at predetermined timings. Alternatively, the optical cleaning unit 80 may be installed in the exposure apparatus EXS by using a predetermined transport mechanism and/or a tool arranged in the exposure apparatus EXS.

The optical cleaning unit 80, which is provided on the movable member (substrate stage PST or measuring stage PST2) that is movable on the side of the image plane of the projection optical system PL, optically cleans the lower surface 2A of the optical element 2 and the lower surface 70A of the nozzle member 70. However, there is such a possibility that the impurity which float in the air-conditioned space 125 and/or the liquid droplets, may adhere to any member which makes no contact with the liquid LQ in ordinary cases, including, for example, a part of the focus/leveling-detecting system 60 and a part (for example, an objective lens) of the substrate alignment system 350 arranged in the vicinity of the liquid immersion area AR2. In such a case, the member, which is arranged in the vicinity of the liquid immersion area AR2, may be subjected to the optical cleaning treatment by using the optical cleaning unit 80.

In the fifth embodiment described above, the optical cleaning unit 80 is provided for the substrate stage PST. However, a movable member, which is movable two-dimensionally in the XY directions under or below the projection optical system PL (on the side of the image plane), may be arranged distinctly (separately) from the substrate stage PST, and the optical cleaning unit 80 may be arranged for the movable member. The measuring stage PST2 as described in the sixth embodiment may be used as such a movable member as described above.

In the first to fourth embodiments and the sixth embodiment described above, a supply mechanism and a recovery mechanism for the liquid LQ may be arranged distinctly from the mechanisms for forming the liquid immersion area AR2 in the vicinity of the optical cleaning unit 80. For example, when the upper surface 31 of the substrate stage PST is optically cleaned, the operation for supplying and recovering the liquid LQ may be performed for an irradiated area of the upper surface 31 to be irradiated with the ultraviolet light beam Lu concurrently with the operation for radiating the ultraviolet light beam Lu by using the optical cleaning unit 80. Accordingly, the foreign matter, which is generated from the upper surface 31 of the substrate stage PST, can be also recovered together with the liquid LQ.

In the first to sixth embodiments described above, the ArF excimer laser, which has the optical cleaning effect, is used as the exposure light beam EL. Therefore, the exposure light beam EL, which is to be used to expose the substrate P, may be used as the radiation light beam for performing the optical cleaning. When the substrate stage PST is optically cleaned, then the substrate stage PST may be arranged just under or below the projection optical system PL in a state in which the substrate P is absent on the substrate stage PST as the objective of the optical cleaning, and the exposure light beam EL (radiation light beam) may be radiated onto the substrate stage PST via the projection optical system PL from the illumination optical system IL. When the measuring stage is optically cleaned in the exposure apparatus provided with the measuring stage, then the measuring stage may be arranged just under or below the projection optical system PL, and the exposure light beam EL (radiation light beam) may be radiated onto the measuring stage via the projection optical system PL. The optical element 2, which makes contact with the liquid LQ of the liquid immersion area AR2, can be also optically cleaned by allowing the exposure light beam EL to pass via the projection optical system PL. Also in this case, the liquid supply mechanism 10 and the liquid recovery mechanism 20 may be simultaneously used, for example, when the optical cleaning is performed for the upper surface of the substrate stage PST and/or the upper surfaces of the optical measuring sections 300, 400, 500, 600.

In the first to fourth embodiments and the sixth embodiment described above, the light flux of the ultraviolet light beam Lu, which is radiated from the optical cleaning unit 80, has a relatively large diameter with which the entire region of the substrate stage PST (or the measuring stage) can be collectively irradiated. However, the diameter of the light flux of the ultraviolet light beam Lu radiated from the optical cleaning unit 80 may be decreased or small. The ultraviolet light beam Lu may be radiated onto the entire region of the substrate stage PST or a predetermined partial region of the substrate stage PST while relatively moving at least one of the light flux and the substrate stage PST. Accordingly, the optical cleaning unit 80 can be miniaturized, and it is possible to realize the space saving. It is also allowable that the optical cleaning unit 80 does not perform the optical cleaning every time for all of the upper surface 31 of the substrate stage PST (or the measuring stage), the upper surfaces of the optical measuring sections 300, 400, 500, 600, and the upper surface of the substrate holder PH. It is also allowable that the radiation time of the ultraviolet light beam Lu may differ respectively for these surfaces. For example, the ultraviolet light beam Lu may be radiated preferentially (for a long period of time) onto a specified area on the substrate stage PST, including, for example, the upper surface of the optical measuring section 400. Also in the fifth embodiment, for example, the diameter of the light flux of the ultraviolet light beam Lu radiated from the optical cleaning unit 80 may be small. The ultraviolet light beam Lu may be radiated onto the entire region of the optical element 2 and/or the nozzle member 70 or a predetermined partial region of the optical element 2 and the nozzle member 70 while relatively moving at least one of the light flux and the substrate stage PST which is provided with the optical cleaning unit 80.

The first to fourth embodiments and the sixth embodiment described above are constructed such that the substrate stage PST is subjected to the optical cleaning treatment by using the optical cleaning unit 80 before loading the unexposed substrate P after unloading the substrate P, for which the exposure process has been completed, from the substrate stage PST (i.e., during the substrate exchange). However, it is also allowable to adopt such an arrangement that the optical cleaning treatment is performed at every predetermined time intervals previously prescribed or every time when a predetermined number of pieces of the substrates are processed. In this procedure, the control unit CONT moves the substrate stage PST to the position just under or below the optical cleaning unit 80 in a state in which the substrate P is absent on the substrate stage PST. The optical cleaning unit 80 starts the radiation of the ultraviolet light beam Lu as the substrate stage PST is moved, under the control of the control unit CONT. The control unit CONT may radiate the ultraviolet light beam Lu for a predetermined period of time onto the substrate stage PST by using the optical cleaning unit 80, and then the control unit CONT may return to the exposure operation again. If the time interval is excessively long, and/or if the number of the pieces of the substrates to be processed is excessively large, then the possibility is raised that the adhesion trace (water mark) of the liquid LQ may be formed, for example, on the substrate stage PST. Therefore, the time interval for radiating the ultraviolet light beam Lu by the optical cleaning unit 80

(number of the pieces of the substrates to be processed) may be appropriately determined so that the adhesion trace (water mark) of the liquid LQ is not formed, for example, on the substrate stage PST.

Although a part of the foregoing description is repeated regarding light sources usable, as the light source which emit the radiation light beam Lu for performing the optical cleaning treatment in the first to sixth embodiments described above, the light sources may include, for example, the $Ar_2$ excimer lamp (wavelength: 126 nm), the $Ar_2$ excimer laser (wavelength: 126 nm), the $Kr_2$ excimer lamp (wavelength: 146 nm), the $Kr_2$ excimer laser (wavelength: 146 nm), the $F_2$ dimer lamp (wavelength: 157 nm), the $K_2$ dimer laser (wavelength: 157 nm), the $Xe_2$ excimer lamp (wavelength: 172 nm), the $Xe_2$ excimer laser (wavelength: 172 nm), the ArF excimer lamp (wavelength: 193 nm), the ArF excimer laser (wavelength: 193 nm), the KrCl excimer lamp (wavelength: 222 nm), the KrCl excimer laser (wavelength: 222 nm), the KrF excimer lamp (wavelength: 248 nm), the KrF excimer laser (wavelength: 248 nm), the XeCl excimer lamp (wavelength: 308 nm), the XeCl excimer laser (wavelength: 308 nm), the low pressure mercury lamp (which simultaneously emits the light beams having wavelengths of 185 nm and 254 nm), and the deuterium lamp (light beam having wide region wavelengths ranging from the vacuum ultraviolet to the visible). The light source as described above may be used so that the radiation light beam Lu may be radiated continuously, or the radiation light beam Lu may be radiated intermittently as the pulse light beam. The power and the radiation time of the radiation light beam Lu can be appropriately adjusted depending on, for example, the degree of pollution and the objective of the optical cleaning. Alternatively, a plurality of light sources may be used, or a wavelength-variable laser may be used to effect the radiation of light beams at a plurality of wavelengths onto the portion to make contact with the liquid.

Seventh Embodiment

Figure 10:
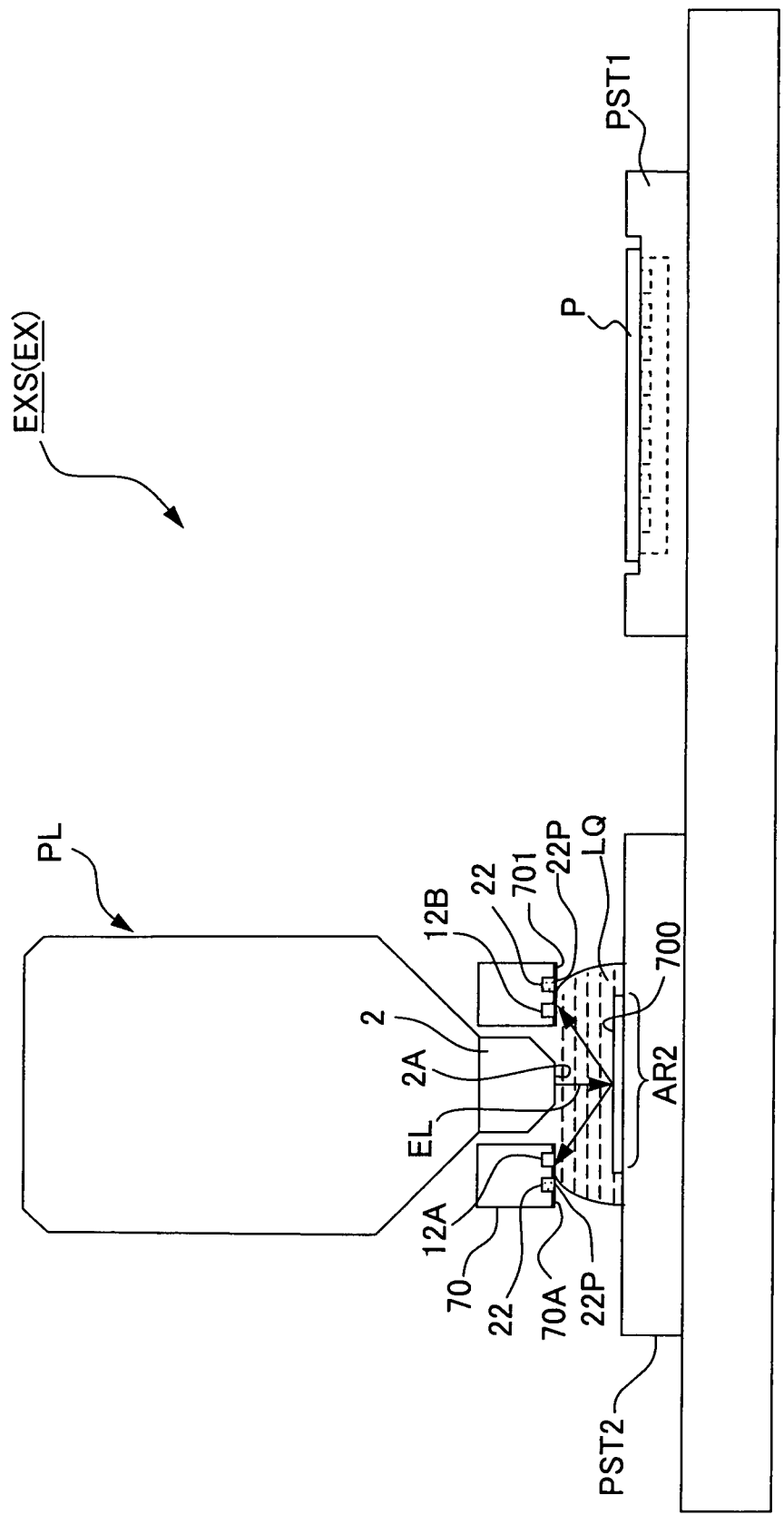
FIG. 10 shows a schematic arrangement illustrating an exposure apparatus according to a seventh embodiment.

Next, a seventh embodiment will be explained with reference to FIG. 10. An exposure apparatus EXS (exposure apparatus body EX) shown in FIG. 10 is provided with two stages in the same manner as the sixth embodiment explained with reference to FIG. 7. With reference to FIG. 10, a reflecting member 700 is provided as the optical member on the side of the image plane of the projection optical system PL. The reflecting member 700 is formed of, for example, glass. The upper surface of the reflecting member 700 is a reflecting surface capable of reflecting the light beam. In this embodiment, the reflecting member 700 is arranged on the measuring stage PST2 which is movable on the side of the image plane of the projection optical system PL. The control unit CONT radiates the exposure light beam EL onto the reflecting member 700 via the projection optical system PL in a state in which the reflecting member 700 is arranged under or below the projection optical system PL by driving the measuring stage PST2. The reflecting member 700, which is irradiated with the exposure light beam EL from the projection optical system PL, reflects the exposure light beam EL to thereby generate the light beam having the same wavelength as that of the exposure light beam EL. The reflected light beam, which is generated from the reflecting member 700 and which has the same wavelength as that of the exposure light beam EL, is radiated onto the lower surface 70A of the nozzle member 70 and the lower surface 2A of the optical element 2 which make contact with the liquid LQ of the liquid immersion area AR2. Also in this embodiment, the ArF excimer laser, which has the optical cleaning effect, is used as the exposure light beam EL.

In this embodiment, a porous member (or a mesh member) 22P is arranged in the recovery port 22 formed on the lower surface 70A of the nozzle member 70. The porous member 22P forms a part of the lower surface 70A. The reflected light beam, which is reflected from the reflecting member 700, is also radiated onto the porous member 22P. As described above, the reflecting member 700, which functions as a part of the optical cleaning unit, is arranged on the side of the image plane of the projection optical system PL, and the exposure light beam EL, which has the optical cleaning effect, is radiated onto the lower surface 2A of the optical element 2 and the lower surface 70A of the nozzle member 70 including the porous member 22P by the aid of the reflecting member 700. Accordingly, the optical element 2 and the nozzle member 70 (porous member 22P) can be optically cleaned. Accordingly, it is possible to maintain (enhance) the liquid-attractive properties of the lower surface 2A of the optical element 2 and the lower surface 70A of the nozzle member 70.

The optical member 700, which is arranged on the side of the image plane of the projection optical system PL, is not limited to the reflecting member for reflecting the radiated light beam (exposure light beam EL). It is also allowable to provide a scattering member having a scattering surface for scattering the radiated light beam. When the scattering member is used as the optical member 700, the exposure light beam EL, which is radiated onto the scattering member, causes the scattering to arrive at the lower surface 2A of the optical element 2 and the lower surface 70A of the nozzle member 70. Therefore, the radiation light beam, which has the optical cleaning function and which has the same wavelength as that of the exposure light beam EL, can be radiated onto a relatively wide area of the lower surface 2A of the optical element 2 and the lower surface 70A of the nozzle member 70. Further, a diffracting member, which has a diffracting surface for diffracting the radiated light beam, may be used as the optical member 700. Also in this case, the radiation light beam, which has the optical cleaning function and which has the same wavelength as that of the exposure light beam EL, can be radiated onto a relatively wide area of the lower surface 2A of the optical element 2 and the lower surface 70A of the nozzle member 70.

When the exposure light beam EL is radiated onto the optical member (reflecting member, diffracting member, scattering member) 700 arranged on the measuring stage PST2, the exposure light beam EL may be radiated onto the optical member 700 while moving the measuring stage PST2 in the XY directions. Alternatively, the optical member 700 may be provided movably to change the direction of the radiation light beam (exposure light beam) from the optical member 700. Accordingly, the radiation light beam (exposure light beam) can be radiated onto a relatively wide area of the lower surface 2A of the optical element 2 and the lower surface 70A of the nozzle member 70 to perform the optical cleaning satisfactorily.

The lower surface 70A (including the porous member 22P) of the nozzle member 70 may be coated with a material 701 having a photocatalytic function. Such a material may include titanium oxide. When the light beam, which has the optical cleaning function and which has the same wavelength as that of the exposure light beam EL, is radiated onto the lower surface 70A of the nozzle member 70 in the state in which the lower surface 70A of the nozzle member 70 is coated with the titanium oxide 701, the pollutant such as the organic matter is oxidized and decomposed by the photocatalytic reaction. Therefore, the optical cleaning can be performed more effectively. The liquid-attractive property of the lower surface 70A of the nozzle member 70 is improved owing to the photocatalytic reaction. Therefore, it is also expected to obtain such an effect that the liquid immersion area AR2 can be satisfactorily formed below the nozzle member 70A.

As shown in FIG. 10, the control unit CONT may radiate the exposure light beam EL onto the optical member 700 via the projection optical system PL and the liquid LQ in a state in which the space between the projection optical system PL and the optical member 700 is filled with the liquid LQ which is same as the liquid to be used when the substrate P is subjected to the liquid immersion exposure, by using the liquid supply mechanism 10 and the liquid recovery mechanism 20 during the optical cleaning. The light beam, which is emitted from the optical member 700 and which has the same wavelength as that of the exposure light beam EL, is radiated onto the lower surface 2A of the optical element 2 and the lower surface 70A of the nozzle member 70 through the liquid LQ of the liquid immersion area AR2. When the optical cleaning is performed while performing the supply and the recovery of the liquid LQ by using the liquid supply mechanism 10 and the liquid recovery mechanism 20, any foreign matter, which is generated from the optical element 2 and the nozzle member 70 as a result of the execution of the optical cleaning, can be recovered together with the liquid LQ.

The liquid LQ, which is used when the substrate P is subjected to the liquid immersion exposure, is subjected to the degassing treatment before the liquid LQ is supplied to the side of the image plane of the projection optical system PL, in order to avoid, for example, the formation of any bubble in the liquid immersion area AR2. That is, the liquid supply mechanism 10 (liquid supply section 11) is provided with a degassing unit which reduces the dissolved oxygen (dissolved gas) in the liquid LQ. The degassing treatment is performed for the liquid LQ before the liquid LQ is supplied to the side of the image plane of the projection optical system PL, and then the liquid LQ, which has been subjected to the degassing treatment, is supplied to the side of the image plane of the projection optical system PL. On the other hand, the optical cleaning makes it possible to oxidize and decompose the pollutant (organic matter) by radiating the light beam having the optical cleaning effect. Therefore, it is desirable that the oxygen is present (dissolved) at a predetermined concentration in the liquid LQ when the optical cleaning is performed. Therefore, when the optical element 2 and the nozzle member 70 are optically cleaned by radiating the exposure light beam EL onto the optical member 700 in the state in which the space between the projection optical system PL and the optical member 700 is filled with the liquid LQ, the control unit CONT may increase the oxygen concentration of the liquid LQ to be supplied to the side of the image plane of the projection optical system PL as compared with the oxygen concentration of the liquid LQ to be provided when the substrate P is exposed. That is, when the optical cleaning is performed, the control unit CONT supplies, for example, the liquid LQ to which the degassing treatment is not performed, to the side of the image plane of the projection optical system PL. Alternatively, when the optical element 2 and the nozzle member 70 are optically cleaned by radiating the exposure light beam EL onto the optical member 700 in the state in which the space between the projection optical system PL and the optical member 700 is filled with the liquid LQ, the control unit CONT may supply any liquid, for example, aqueous hydrogen peroxide distinct (different) from the liquid (pure water) to be used for the exposure of the substrate P, to the side of the image plane of the projection optical system PL.

The position, at which the optical member (reflecting member, diffracting member, scattering member) 700 is installed in this embodiment, is not limited to the position on the measuring stage PST2. For example, the optical member 700 may be arranged in an area other than the area in which the substrate P is arranged, of the upper surface of the substrate stage PST. Further, the optical member 700 may be supported by any member which is arranged on the side of the image plane of the projection optical system PL and which is distinct from the substrate stage PST1 and the measuring stage PST2. The optical member 700 may be detachable with respect to the substrate stage PST or the measuring stage PST2 as well. Alternatively, a dummy substrate, which has at least one of the reflecting surface, the diffracting surface, and the scattering surface, may be arranged on the substrate holder of the substrate stage PST, and the exposure light beam EL may be radiated onto the dummy substrate. When the dummy substrate is used, the dummy substrate can be easily provided to the substrate stage PST (substrate holder PH) by using the substrate transport system 150. It goes without saying that the application can be also applicable to the exposure apparatus of the twin-stage type as described above when the optical member 700 is arranged on the substrate stage PST and when the dummy substrate having, for example, the diffracting surface is provided to the substrate stage PST.

A part of the substrate alignment system 350 and a part of the focus/leveling-detecting system 60, which are arranged near to the liquid immersion area AR2, may be subjected to the optical cleaning treatment with the light beam having the optical cleaning function and from the optical member 700. Accordingly, it is possible to avoid the deterioration of the measurement accuracy which would be otherwise caused by the adhesion of the impurity and/or the liquid droplets to the part of the substrate alignment system 350 and the part of the focus/leveling-detecting system 60.

In the seventh embodiment, the lower surface 70A of the nozzle member 70 is coated with the liquid-attractive or lyophilic (water-attractive or hydrophilic) material such as titanium oxide (titanium dioxide) having the photocatalytic function. However, the nozzle member 70 itself or a part thereof (portion to make contact with the liquid) may be formed of a material having the photocatalytic function.

The lower surface 2A of the optical element 2 may be coated with the material such as titanium oxide having the photocatalytic function, and the optical cleaning may be performed with the light beam from the optical member 700. Accordingly, it is possible to avoid the pollution of the lower surface 2A of the optical element 2 more reliably.

When the optical cleaning unit 80 as explained, for example, in the fifth embodiment described above is used, the lower surface 70A of the nozzle member 70 and the lower surface 2A of the optical element 2 may be coated with the material such as titanium oxide.

At least a part or parts of the upper surface of the substrate stage PST1 and the upper surface of the measuring stage PST2 (including the upper surface of the optical measuring section) may be formed of the material such as titanium oxide having the photocatalytic function, if necessary. Also in this case, the upper surfaces of the substrate stage PST and the measuring stage PTS2 can be prevented from the pollution by using the optical cleaning unit 80 as in the first to fourth embodiments and the sixth embodiment.

The members such as the nozzle member 70 and the stages (PST1, PST2), which make contact with the liquid LQ, may be formed of materials containing titanium and/or zinc dioxide. In the case of titanium and zinc dioxide, a passive film, which has the photocatalytic function, is formed on the surface. Therefore, the pollutant (organic matter), which exists on the surface, can be removed by performing the optical cleaning treatment in the same manner as in the titanium oxide coating.

Eighth Embodiment

Figure 11:
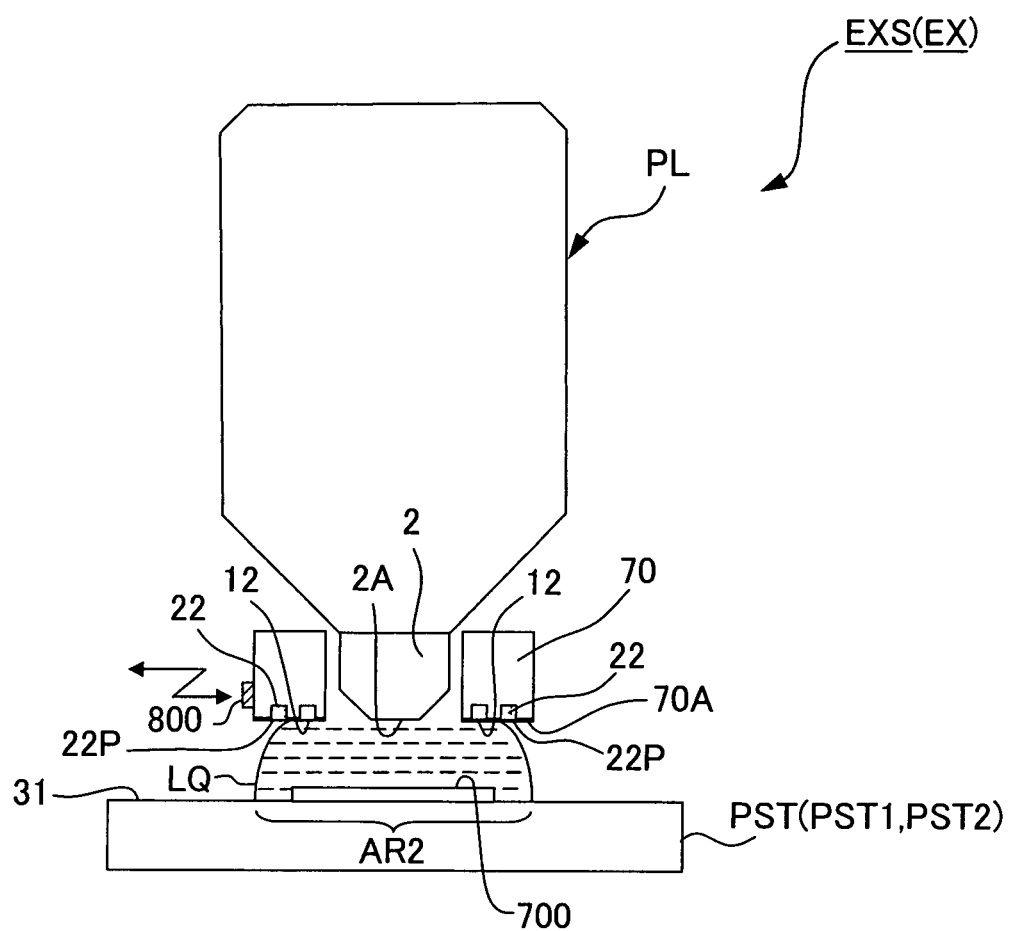
FIG. 11 shows a schematic arrangement illustrating an exposure apparatus according to an eighth embodiment.

Next, an eighth embodiment will be explained with reference to FIG. 11. An exposure apparatus EXS (exposure apparatus body EX) shown in FIG. 11 is provided with a vibration mechanism 800 which vibrates the nozzle member 70. In this embodiment, the vibration mechanism 800 is constructed of an ultrasonic vibration element, and is attached at a predetermined position on the nozzle member 70. In an example shown in FIG. 11, the ultrasonic vibration element 800 is attached to the side surface of the nozzle member 70. The ultrasonic vibration element is exemplified by a piezoelectric element and an electromagnetic vibration element. The ultrasonic vibration element 800 is provided to remove the pollutant adhered to the side surface and the lower surface 70A of the nozzle member 70 including the porous member 22P. The ultrasonic vibration element 800 vibrates the nozzle member 70, and thus the adhered pollutant is removed by the vibration to clean the nozzle member 70. Further, when the nozzle member 70 is vibrated by using the ultrasonic vibration element 800, then it is also possible to remove the pollutant adhered to those disposed in the vicinity of the supply port 12 and the supply flow passage formed in the nozzle member 70 connected to the supply port 12, and it is also possible to remove the pollutant adhered to those disposed in the vicinity of the recovery port 22, the porous member 22P arranged in the recovery port 22, and the recovery flow passage formed in the nozzle member 70 connected to the recovery port 22. The cleaning operation, which is based on the use of the ultrasonic vibration element 800, can be performed during the exchange of the substrate P and/or between the lots.

In a state in which the nozzle member 70 is vibrated by using the ultrasonic vibration element 800, the control unit CONT may be operated such that optical path space between the projection optical system PL and the upper surface 31 of the substrate stage PST is filled with the liquid LQ which is same as the liquid to be used when the substrate P is subjected to the liquid immersion exposure by using the liquid supply mechanism 10 and the liquid recovery mechanism 20. Accordingly, the pollutant, which is removed (separated) from the nozzle member 70, can be recovered together with the liquid LQ. The liquid, with which the optical path space between the projection optical system PL and the upper surface 31 of the substrate stage PST is filled when the nozzle member 70 is vibrated by using the ultrasonic vibration element 800, may be distinct from the liquid (pure water) to be used when the substrate P is subjected to the liquid immersion exposure. It is also allowable to use, for example, alcohol or aqueous hydrogen peroxide. Further, it is also allowable to simultaneously perform the cleaning operation using the ultrasonic vibration element 800 and the cleaning operation using the optical cleaning unit 80 described in the fifth embodiment and/or the optical member 700 described in the seventh embodiment.

The gas supply system 87 and the gas recovery system 88 as explained in the fourth embodiment may be provided in the first to third embodiments and the fifth to eighth embodiments described above to set the environment suitable for the optical cleaning for the space (atmosphere) in the vicinity of the irradiated area of the ultraviolet light beam Lu in relation to the optical element 2 and the nozzle member 70.

The detection unit 90 as described in the fifth embodiment may be provided in the first to fourth embodiments and the six to eighth embodiments described above, and the detection unit 90 may be used to detect the pollution of, for example, the upper surface 31 of the substrate stage PST, the optical measuring sections 300, 400, 500, 600, and the substrate holder PH. The control unit CONT can judge whether or not the substrate stage PST is polluted on the basis of the detection result of the detection unit 90, and the control unit CONT can control the operation of the optical cleaning unit 80. In this case, the substrate alignment system 350 and/or the mask alignment system 360 can be also used as the detection unit 90.

The projection optical system PL, which is described in the first to eighth embodiments described above, is constructed such that the optical path space on the side of the lower surface 2A of the optical element 2 is filled with the liquid LQ. However, as disclosed in International Publication No. 2004/019128, it is also possible to adopt a projection optical system in which the optical path space disposed on the side of the mask M of the optical element 2 is also filled with the liquid. In this case, the optical cleaning treatment may be performed for the upper surface side of the optical member (optical element 2) at the terminal end of the projection optical system PL and the lower surface of the optical member disposed on the side of the mask M of the optical member arranged at the terminal end by using the exposure light beam EL emitted from the illumination optical system IL or the optical cleaning unit 80 as explained in the fifth embodiment and the seventh embodiment.

The first to eighth embodiments described above have been explained such that the cleaning operation is performed, for example, during the substrate exchange. However, when the maintenance is performed for the exposure apparatus at every predetermined time intervals previously prescribed, the treatment, in which the optical cleaning is performed by radiating the radiation light beam having the optical cleaning effect as described above, may be added as one item of the maintenance.

Ninth Embodiment

Figure 12:
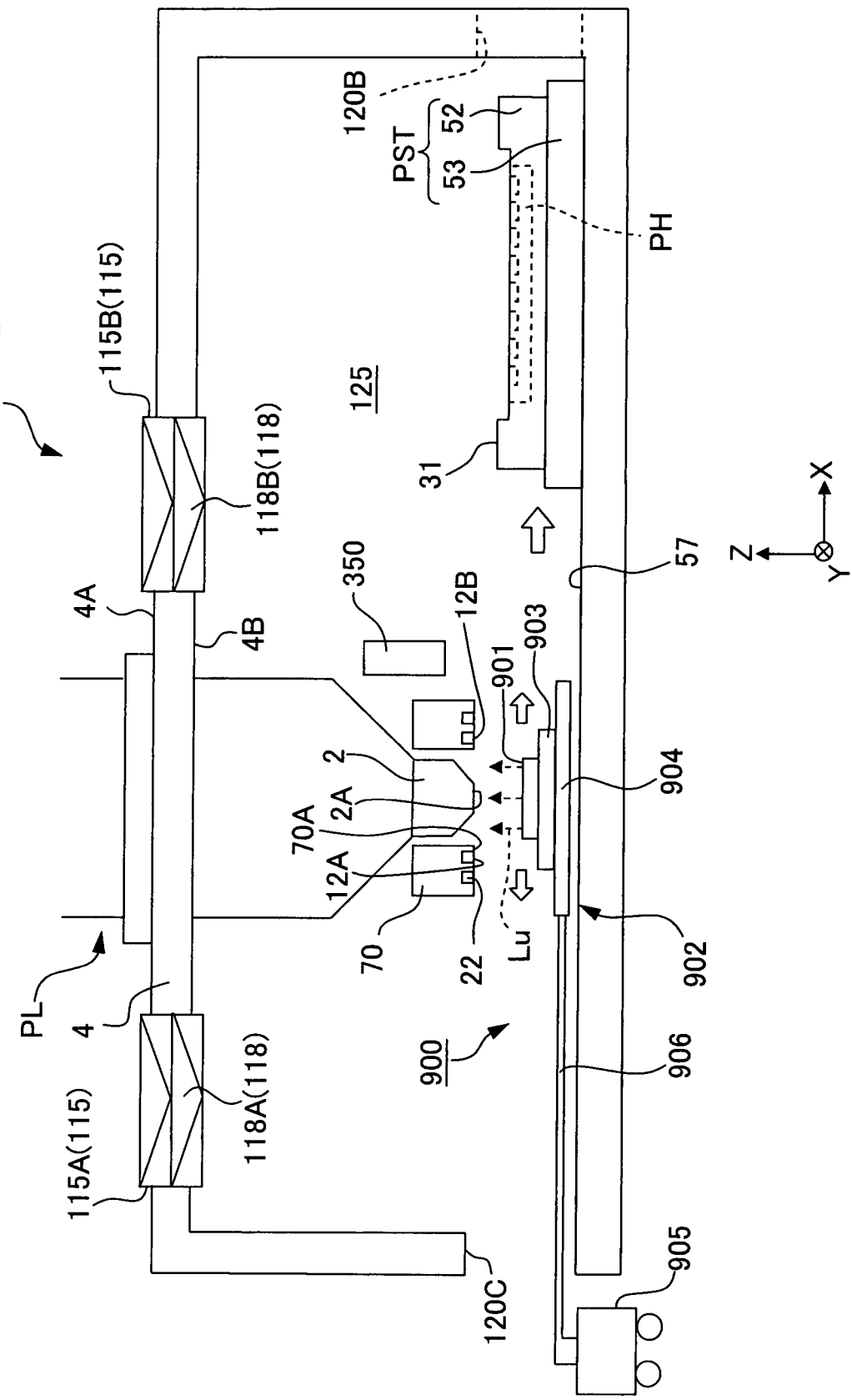
FIG. 12 shows a maintenance device according to a ninth embodiment.

Next, a ninth embodiment will be explained with reference to FIG. 12. In this embodiment, the optical cleaning treatment for the exposure apparatus EXS is performed by a maintenance device 900 which is provided distinctly from the exposure apparatus EXS. With reference to FIG. 12, the maintenance device 900 is provided with a light-emitting section 901 which generates the predetermined radiation light beam Lu having the optical cleaning effect with respect to the member to make contact with the liquid LQ in the exposure apparatus EXS. The light-emitting section 901 has a light source. Light source (for example, the $Xe_2$ excimer laser, the KrCl excimer laser, and the XeCl excimer laser), which is the same as or equivalent to that used in the embodiment described above, can be used as the light source. The maintenance device 900 of this embodiment is provided with a support mechanism 902 which movably supports the light-emitting section 901. The support mechanism 902 includes a support base 903 which is capable of moving the light-emitting section 901 between the inside and the outside of the exposure apparatus EXS and which supports the light-emitting section 901, a stage 904 which movably supports the support base 903, and a connecting member 906 which connects the stage 904 and a carriage 905. The stage 904 has a driving mechanism such as an actuator. The support base 903, which supports the light-emitting section 901, is movable in the X axis direction and the Y axis direction on the stage 904. The stage 904 may be capable of moving the support base 903 in the Z axis direction.

An opening 120C, through which the light-emitting section 901 can be introduced and withdrawn with respect to the air-conditioned space 125, is formed at a part of the main column 4 of the exposure apparatus EXS. The maintenance device 900 is capable of moving the light-emitting section 901 with respect to the inside of the air-conditioned space 125 of the exposure apparatus EXS via the opening 120C.

In this embodiment, the optical cleaning treatment is performed by using the maintenance device 900 during the maintenance for the exposure apparatus EXS. When the optical cleaning treatment is performed by using the maintenance device 900, for example, the operator transports the maintenance device 900 to the position in the vicinity of the opening 120C of the exposure apparatus EXS. The operator can easily transport the maintenance device 900, because the maintenance device 900 has the carriage 905. The stage 904 supported at the forward end of the connecting member 906 and the support base 903 disposed on the stage 904 are moved together with the light-emitting section 901 to the inside of the air-conditioned space 125 via the opening 120C. The light-emitting section 901 is arranged at the position under or below the projection optical system PL and the nozzle member 70. In this situation, the substrate stage PST is retracted to a predetermined retract position other than the position under or below the projection optical system PL. The maintenance device 900 drives the stage 904 so that the light-emitting section 901, which is supported by the support base 903, is positioned with respect to the lower surface 2A of the optical element 2 of the projection optical system PL. The light-emitting surface of the light-emitting section 901 is directed upwardly, and is opposed to the lower surface 2A of the optical element 2. In this state, the maintenance device 900 radiates the radiation light beam Lu from the light-emitting section 901. The lower surface 2A of the optical element 2 is optically cleaned by being irradiated with the radiation light beam Lu. The maintenance device 900 is capable of positioning the light-emitting section 901 with respect to the lower surface 70A of the nozzle member 70 by driving the stage 904. When the radiation light beam Lu is radiated from the light-emitting section 901 in this state, the lower surface 70A of the nozzle member 70 can be optically cleaned satisfactorily. As described above, also in the maintenance method and the measuring apparatus according to this embodiment, only the member to be cleaned can be optically cleaned in the exposure apparatus without detaching the member from the exposure apparatus. Therefore, it is possible to complete the maintenance in a short period of time as compared with a case in which the member is detached from the exposure apparatus. As described above, in order to satisfactorily form the liquid immersion area AR2, it is preferable that the lower surface 2A of the optical element 2 of the projection optical system PL and the lower surface 70A of the nozzle member 70 are liquid-attractive or lyophilic (water-attractive or hydrophilic). The liquid-attractive property can be also imparted to the lower surface 2A of the optical element 2 and the lower surface 70A of the nozzle member 70 by radiating the radiation light beam (ultraviolet light beam) Lu.

The maintenance device 900 is also capable of satisfactorily cleaning other members including, for example, the substrate alignment system 350 and the focus/leveling-detecting system 60, by moving the light-emitting section 901 by driving the stage 904.

The maintenance device 900 is capable of optically cleaning the upper surface 31 of the substrate stage PST and the respective optical measuring sections 300, 400, 500, 600 on the substrate stage PST while directing the light-emitting surface of the light-emitting section 901 downwardly. Alternatively, the maintenance device 900 is also capable of radiating the radiation light beam Lu in a state in which the light-emitting surface of the light-emitting section 901 is directed upwardly so that the radiation light beam Lu, which is radiated from the light-emitting section 901, is guided to the substrate stage PST by using a reflecting member. That is, when the maintenance device 900 is constructed to have the reflecting member, the radiation light beam Lu, which is radiated from the light-emitting section 901, can be guided in a predetermined direction.

Also in this embodiment, the optical cleaning treatment may be performed while filling, with the liquid LQ, the space between the light-emitting surface of the light-emitting section 901 and the lower surface 2A of the optical element 2 and the lower surface 70A of the nozzle member 70.

Tenth Embodiment

Figure 13:
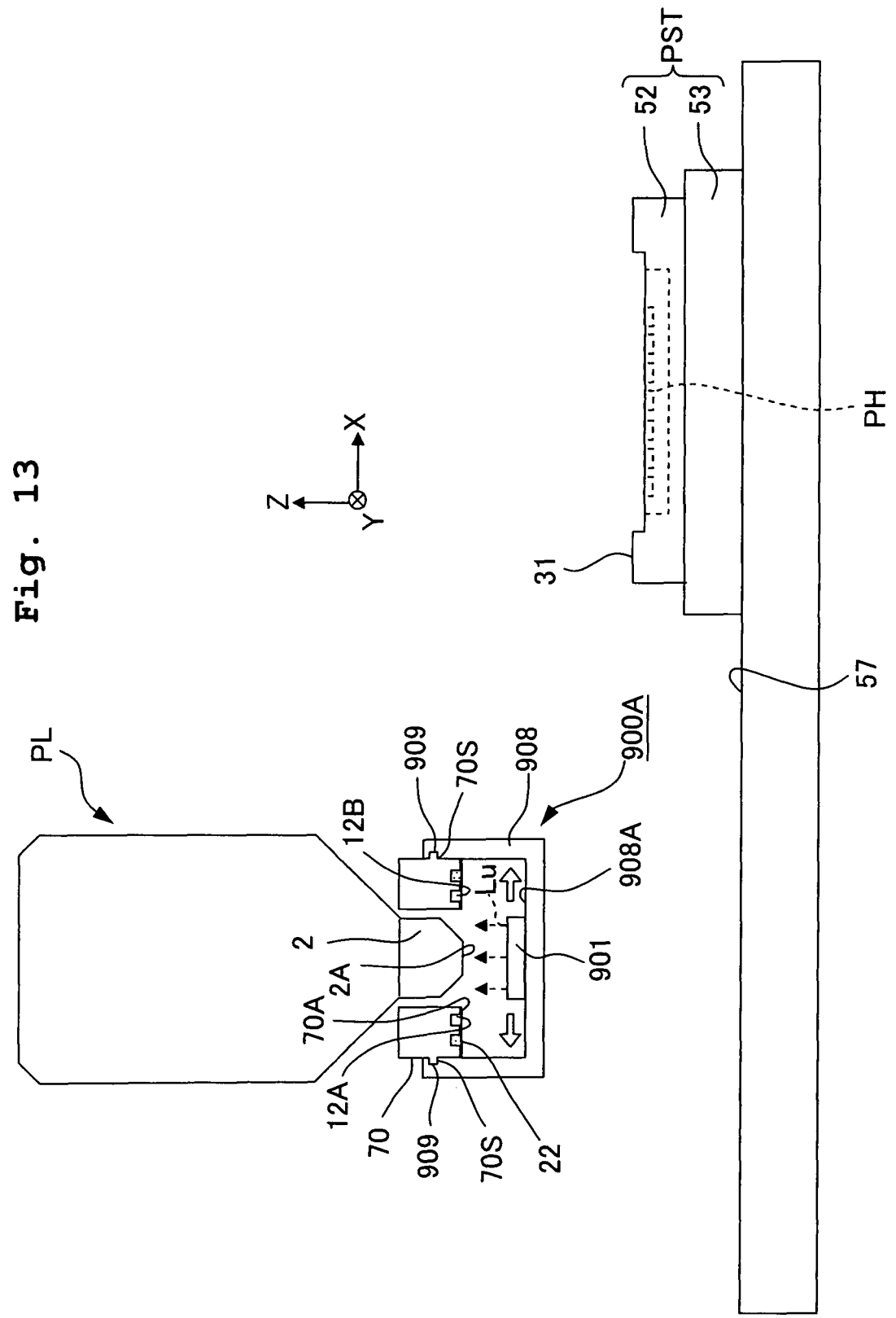
FIG. 13 shows a maintenance device according to a tenth embodiment.

Next, a tenth embodiment will be explained with reference to FIG. 13. A maintenance device 900A shown in FIG. 13 includes a light-emitting section 901, and a support member 908 which has a support surface 908A for supporting the light-emitting section 901. The support member 908 is provided with a connecting portion 909 which is connectable to the nozzle member 70. A connection-objective portion 70S, which is connectable to the connecting portion 909 of the support member 908, is provided on the side surface of the nozzle member 70. When the connecting portion 909 and the connection-objective portion 70S are connected to each other, the support member 908 and the nozzle member 70 are connected to each other. When the nozzle member 70 and the support member 908 are connected to each other by the aid of the connecting portion 909, the light-emitting section 901, which is disposed on the support surface 908A of the support member 908, is opposed to the lower surface 2A of the optical element 2 of the projection optical system PL and the lower surface 70A of the nozzle member 70. In this embodiment, the light-emitting section 901 is provided movably in the X axis direction and the Y axis direction respectively on the support surface 908A.

When the optical cleaning treatment is performed by using the maintenance device 900A, for example, the support member 908 which supports the light-emitting section 901 is connected to the nozzle member 70 by the operator. In this situation, the substrate stage PST is retracted to a predetermined retraction position other than the position below the projection optical system PL. The radiation light beam Lu is radiated from the light-emitting section 901 in a state in which the light-emitting surface of the light-emitting section 901 is opposed to the lower surface 2A of the optical element 2 and the lower surface 70A of the nozzle member 70. Accordingly, the lower surface 2A of the optical element 2 and the lower surface 70A of the nozzle member 70 are optically cleaned by being irradiated with the radiation light beam Lu. The light-emitting section 901 is movable on the support surface 908A. Therefore, the radiation light beam Lu can be radiated in a state in which the light-emitting section 901 is positioned at a desired position with respect to the lower surface 2A of the optical element 2 and the lower surface 70A of the nozzle member 70 respectively.

Also in this embodiment, the optical cleaning treatment may be performed while filling, with the liquid LQ, the space between the light-emitting surface of the light-emitting section 901 and the lower surface 2A of the optical element 2 and the lower surface 70A of the nozzle member 70.

The ninth and tenth embodiments described above are illustrative of the maintenance for the exposure apparatus which is provided with one substrate stage PST. However, the maintenance device as described in the ninth and tenth embodiments can be also applied to the exposure apparatus which is provided with the measuring stage and the substrate stage and the exposure apparatus which is provided with a plurality of substrate stages, as described above.

Eleventh Embodiment

Next, an eleventh embodiment will be explained with reference to FIG. 14. An exposure apparatus EXS shown in FIG. 14 is provided with a substrate stage PST1 and a measuring stage PST2 which are movable on the side of the image plane of the projection optical system PL, in the same manner as in the embodiments shown in FIGS. 9 and 10. A maintenance device 900B shown in FIG. 14 is provided with a light-emitting section 901, and a support member 912 which supports the light-emitting section 901. The support member 912 includes a connecting portion 913 which is connectable to the measuring stage PST2. The measuring stage PST2 is provided with a connection-objective portion 914 which is connectable to the connecting portion 913 of the support member 912. When the connecting portion 913 and the connection-objective portion 914 are connected to each other, the support member 912 and the measuring stage PST2 are connected to each other.

When the optical cleaning treatment is performed by using the maintenance device 900B, for example, the support member 912, which supports the light-emitting section 901, is connected to the measuring stage PST2 by the aid of the connecting portion 913 by the operator as shown in FIG. 14(A). As shown in FIG. 14(B), the measuring stage PST2 is moved to position the light-emitting section 901 at the position under or below the projection optical system PL so that the light-emitting surface of the light-emitting section 901 is opposed to the lower surface 2A of the optical element 2 and the lower surface 70A of the nozzle member 70. The radiation light beam Lu is radiated from the light-emitting section 901 in this state. Accordingly, the lower surface 2A of the optical element 2 and the lower surface 70A of the nozzle member 70 are optically cleaned by being irradiated with the radiation light beam Lu. The light-emitting section 901 is movable in accordance with the movement of the measuring stage PST2. Therefore, the radiation light beam Lu can be radiated in a state in which the light-emitting section 901 is positioned at a desired position with respect to the lower surface 2A of the optical element 2 and the lower surface 70A of the nozzle member 70 respectively.

The maintenance device 900B may be connected to the substrate stage PST1, without being limited to the connection with the measuring stage PST2. When a connecting section, which is connectable to the substrate stage PST1, is provided for the support member 912 of the maintenance device 900B, the maintenance device 900B and the substrate stage PST1 can be connected to each other.

Also in this embodiment, the optical cleaning treatment may be performed while filling, with the liquid LQ, the space between the light-emitting surface of the light-emitting section 901 and the lower surface 2A of the optical element 2 and the lower surface 70A of the nozzle member 70.

Twelfth Embodiment

Figure 15:
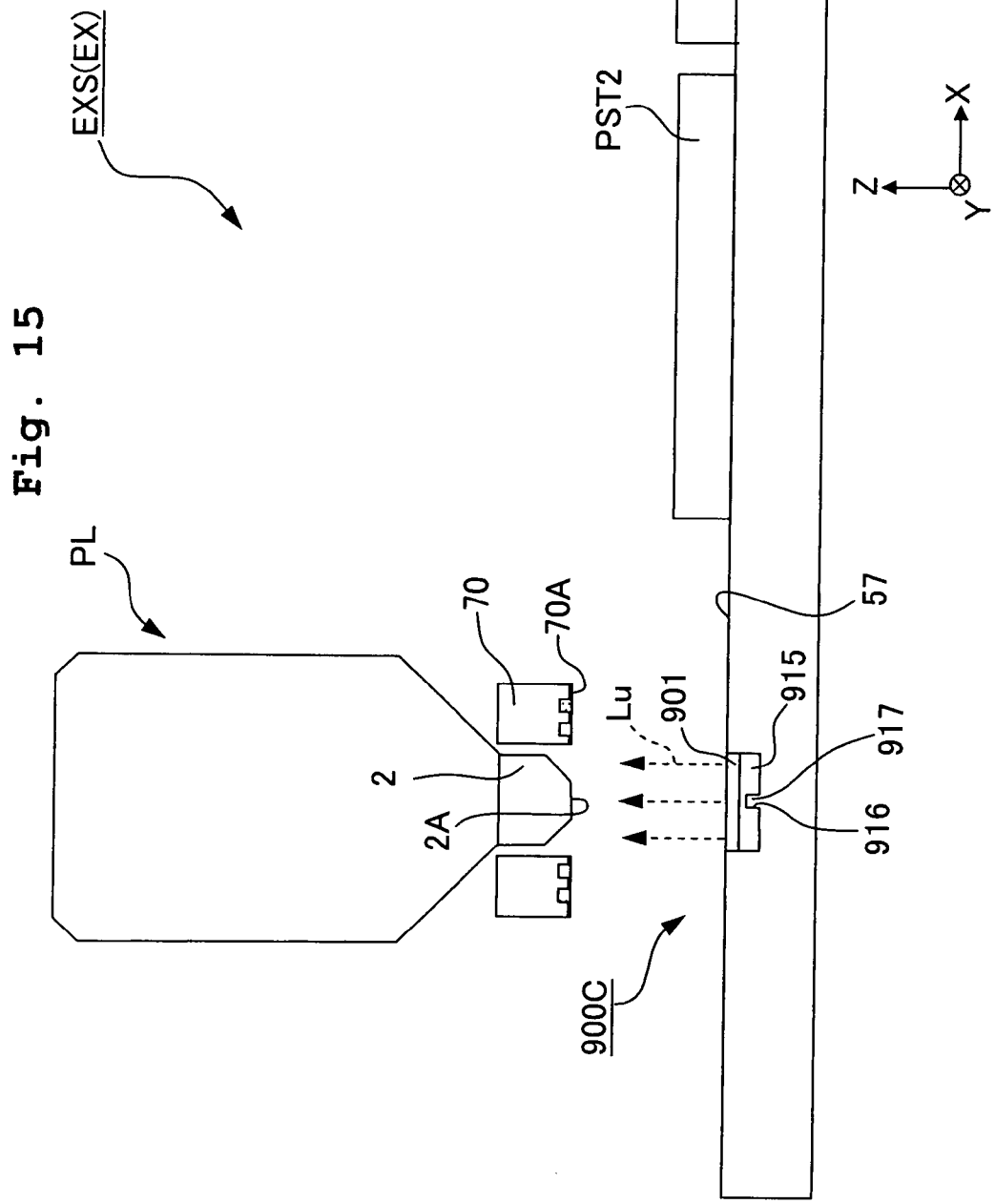
FIG. 15 shows a maintenance device according to a twelfth embodiment.

Next, a twelfth embodiment will be explained with reference to FIG. 15. A maintenance device 900C shown in FIG. 15 includes a light-emitting section 901, and a support member 915 which supports the light-emitting section 901. The support member 915 is provided with a connecting portion 916 which is connectable to a stage base (base member) 57 which movably supports the substrate stage PST1 and the measuring stage PST2. A connection-objective portion 917, which is connectable to the connecting portion 916 of the support member 915, is provided for the stage base 57. When the connecting portion 916 and the connection-objective portion 917 are connected to one another, the support member 915 and the stage base 57 are connected to one another. In this embodiment, the upper surface of the stage base 57 is substantially flush with the surface of the maintenance device 900C (light-emitting section 901) connected to the stage base 57. Accordingly, the substrate stage PST1 and the measuring stage PST2 are movable on the surface of the maintenance device 900C (light-emitting section 901). The movement ranges of the substrate stage PST1 and the measuring stage PST2 on the stage base 57 are not restricted by the provision of the maintenance device 900C in the stage base 57. When the radiation light beam Lu is radiated from the light-emitting section 901 disposed on the support member 915 connected to the stage base 57 by the aid of the connecting portion 916, it is possible to optically clean the lower surface 2A of the optical element 2 of the projection optical system PL and the lower surface 70A of the nozzle member 70.

In this embodiment, the maintenance device 900C may be allowed to always stay in the base member 57. The maintenance device 900C (light-emitting section 901) may be arranged vertically movably with respect to the base member 57, and the optical cleaning treatment can be performed as well while allowing the maintenance device 900 (light-emitting section 901) to approach the optical element 2 and the nozzle member 70.

In the eleventh and twelfth embodiments described above, the description is made about the maintenance device for the exposure apparatus which is provided with the substrate stage PST1 and the measuring stage PST2. However, the maintenance device of each of the eleventh and twelfth embodiments can be also used for the exposure apparatus which is provided with only one substrate stage or a plurality of substrate stages.

Thirteenth Embodiment

Figure 16:
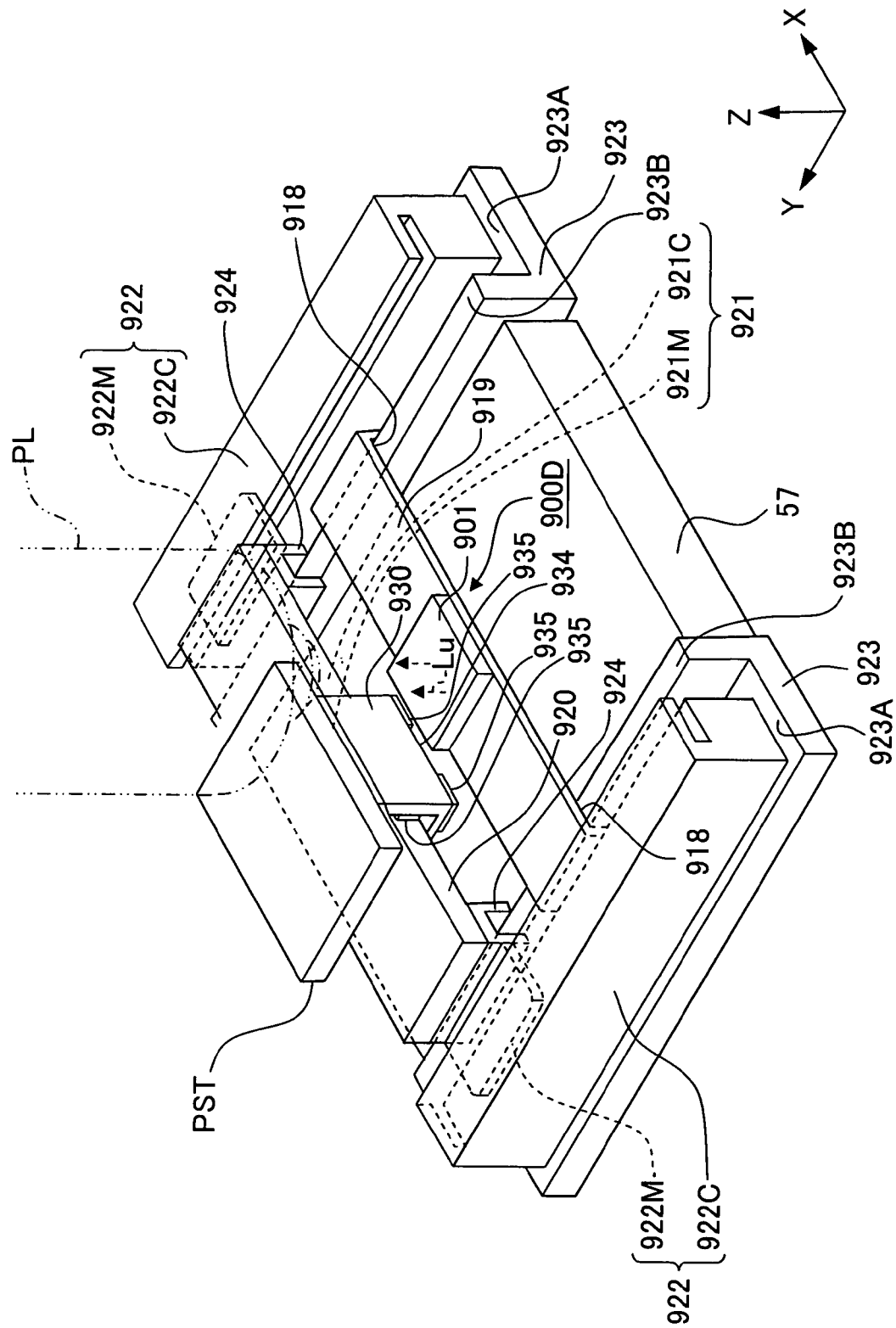
FIG. 16 shows a maintenance device according to a thirteenth embodiment.

Next, a thirteenth embodiment will be explained with reference to FIG. 16. FIG. 16 shows an example of the substrate stage PST. With reference to FIG. 16, the substrate stage PST is guided by an X guide member 920 for the movement in the X axis direction, and the substrate stage PST is moved in the X axis direction by an X linear motor 921. The X linear motor 921 is constructed of a mover 921M which is provided for the substrate stage PST, and a stator 921C which is provided for the X guide member 920. The substrate stage PST has a frame member 930 which is provided to surround the X guide member 920. Air bearings 935, which support the substrate stage PST in a non-contact manner with respect to the upper surface of a stage base 57, are provided on the lower surface 934. The substrate stage PST, which includes the frame member 930, is supported in the non-contact manner with respect to the stage base 57 by the air bearings 935. A gap is maintained in relation to the Z axis direction between the frame member 930 and the X guide member 920. Air bearings 935 are provided on the inner side surface of the frame member 930. A gap is maintained in relation to the Y axis direction between the X guide member 920 and the inner side surface of the frame member 930 by the air bearings 935.

The X guide member 920 is guided for the movement in the Y axis direction by guide portions 923B disposed at upper ends of support members 923 which are substantially L-shaped as viewed in a side view and which are provided on the both sides in the X axis direction of the stage base 57 respectively. The guide portions 923B (support members 923) are provided at the positions corresponding to the both ends of the X guide member 920 respectively. Guide objective portions 924, which correspond to the guide portions 923B, are provided at the both ends of the X guide member 920 respectively. Air bearings are intervened between the guide portions 923B and the guide objective portions 924. The guide objective portions 924 are supported in a non-contact manner with respect to the guide portions 923B. The X guide member 920 is provided movably in the Y axis direction by the aid of Y linear motors 922. The substrate stage PST is movable in the Y axis direction together with the X guide member 920 in accordance with the driving of the Y linear motors 922. The Y linear motors 922 include movers 922M which are provided at the both ends in the longitudinal direction of the X guide member 920 respectively, and stators 922C which are supported in a non-contact manner by the aid of air bearings on flat surface portions 923A of the support members 923 to correspond to the movers 922M. When the movers 922M of the Y linear motors 922 are driven with respect to the stators 922C, the X guide member 920 is moved in the Y axis direction together with the substrate stage PST. The X guide member 920 is also capable of making rotational movement in the θZ direction by adjusting the driving operations of the Y linear motors 922, 922 respectively. Therefore, the substrate stage PST is movable in the Y axis direction and the θZ direction substantially integrally with the X guide member 920 by the Y linear motors 922, 922.

In the embodiment shown in FIG. 16, a light-emitting section 901, which constructs a maintenance device 900D, is supported on a support member 919 connected to the guide portions 923B. The support member 919 has connecting portions 918 which are connectable to the guide portions 923B provided on the both sides in the X axis direction of the stage base 57 respectively. When the maintenance is performed, the substrate stage PST is retracted to a predetermined retraction position other than the position under or below the projection optical system PL. The support member 919 of the maintenance device 900D is supported by the guide portions 923B. In this situation, the support member 919 is supported by the guide portions 923B so that the light-emitting section 901 is arranged at the position under or below the projection optical system PL. When the light-emitting section 901 radiates the radiation light beam Lu in this state, it is possible to optically clean the lower surface 2A of the optical element 2 of the projection optical system PL and the lower surface 70A of the nozzle member 70.

The light-emitting section 901 of the maintenance device 900D may be installed on the X guide member 920. The light-emitting section 901, which is installed on the X guide member 920, may be opposed to the lower surface 2A of the optical element 2 and the lower surface 70A of the nozzle member 70. The radiation light beam Lu may be emitted from the light-emitting section 901, and the radiation light beam Lu may be radiated onto the lower surface 2A of the optical element 2 and the lower surface 70A of the nozzle member 70.

In this embodiment, the description is made about the maintenance for the exposure apparatus which is provided with one substrate stage PST. However, the maintenance device of this embodiment is also applicable to the exposure apparatus which is provided with the measuring stage and the substrate stage as described above and the exposure apparatus which is provided with a plurality of substrate stages.

In the tenth to thirteenth embodiments described above, the maintenance device is connected to the nozzle member, the stage, or the base member. However, as for the connecting position (attachment position) at which the maintenance device is connected to the exposure apparatus EXS, it is also allowable to adopt, for example, those disposed on the main column 4 (see, for example, FIG. 1).

Also in the maintenance devices of the tenth to thirteenth embodiments described above, the radiation light beam Lu, which is radiated from the light-emitting section 901, may be reflected by a reflecting member, and the reflected light beam may be radiated onto the optical element 2, the nozzle member 70, and/or the stage.

Also in the ninth to thirteenth embodiments, it is desirable that the film, which has the photocatalytic function, is formed on the surface of the member to be subjected to the optical cleaning as described in the seventh embodiment.

The maintenance device has been explained above assuming that the light source is built in the light-emitting section 901. However, the light source may be provided at a position separated (away) from the light-emitting section 901 (for example, outside the exposure apparatus EXS). The radiation light beam Lu, which is radiated from the light source, may be transmitted to the light-emitting section 901, for example, by an optical fiber. In the respective embodiments described above, for example, the reference member of the stage, the optical measuring section, the lower surface 2A of the optical element 2, and the lower surface 70A of the nozzle member 70 are optically cleaned. However, it is unnecessary to optically clean all of them. The optical cleaning may be performed for at least a part of them, if necessary.

In the embodiments described above, the explanation has been made about the case in which the member provided to the exposure apparatus EXS is optically cleaned. However, it is also effective that the member, which makes contact with the liquid LQ, is optically cleaned before the member is assembled into the exposure apparatus EXS or when the member is detached form the exposure apparatus EXS.

As described above, in the embodiment of the present invention, pure or purified water is used as the liquid LQ. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the end surface of the projection optical system PL. When the purity of pure water supplied from the factory or the like is low, it is also appropriate that the exposure apparatus is provided with an ultrapure water-producing unit.

It is approved that the refractive index n of pure water (water) with respect to the exposure light beam EL having a wavelength of about 193 nm is approximately in an extent of 1.44. When the ArF excimer laser beam (wavelength: 193 nm) is used as the light source of the exposure light beam EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

When the liquid immersion method is used as described above, the numerical aperture NA of the projection optical system is 0.9 to 1.3 in some cases. When the numerical aperture NA of the projection optical system is increased as described above, the image formation performance is sometimes deteriorated by the polarization effect with the random polarized light beam having been hitherto used as the exposure light beam. Therefore, it is desirable to use the polarized illumination. In this case, the following procedure is preferred. That is, the linear polarized illumination is effected, which is adjusted to the longitudinal direction of the line pattern of the line-and-space pattern of the mask (reticle) so that a large amount of diffracted light of the S-polarized component (TE-polarized component), i.e., the component in the polarization direction along the longitudinal direction of the line pattern is allowed to outgo from the pattern of the mask (reticle). When the space between the projection optical system PL and the resist coated on the surface of the substrate P is filled with the liquid, the diffracted light of the S-polarized component (TE-polarized component), which contributes to the improvement in the contrast, has the transmittance through the resist surface that is raised to be high as compared with a case in which the space between the projection optical system PL and the resist coated on the surface of the substrate P is filled with the air (gas). Therefore, even when the numerical aperture NA of the projection optical system exceeds 1.0, it is possible to obtain the high image formation performance. It is more effective to make appropriate combination, for example, with the phase shift mask and/or the oblique incidence illumination method (especially the dipole illumination method) adjusted to the longitudinal direction of the line pattern as disclosed in Japanese Patent Application Laid-open No. 6-188169.

Further, for example, when the ArF excimer laser beam is used as the exposure light beam, and the substrate P is exposed with a fine line-and-space pattern (for example, line-and-space of about 25 to 50 nm) by using the projection optical system PL having a reduction magnification of about ¼, then the mask M functions as a polarizing plate on account of the Wave Guide effect depending on the structure of the mask M (for example, the pattern fineness and the chromium thickness), and a large amount of the diffracted light beam of the S-polarized component (TE-polarized component) is radiated from the mask M as compared with the diffracted light beam of the P-polarized component (TM-component) which lowers the contrast. In such a situation, it is desirable that the linear polarized illumination is used as described above. However, the high resolution performance can be obtained even when the numerical aperture NA of the projection optical system PL is large, for example, 0.9 to 1.3 even when the mask M is illuminated with the random polarized light beam. When the substrate P is exposed with an extremely fine line-and-space pattern on the mask M, there is also such a possibility that the P-polarized component (TM-polarized component) may be larger than the S-polarized component (TE-polarized component) on account of the Wire Grid effect. However, for example, when the ArF excimer laser beam is used as the exposure light beam, and the substrate P is exposed with a line-and-space pattern larger than 25 nm by using the projection optical system PL having a reduction magnification of about ¼, then a large amount of the diffracted light beam of the S-polarized component (TE-polarized component) is radiated from the mask M as compared with the diffracted light beam of the P-polarized component (TM-polarized component). Therefore, the high resolution performance can be obtained even when the numerical aperture NA of the projection optical system PL is large, for example, 0.9 to 1.3.

Further, it is also effective to use a combination of the oblique incidence illumination method and the polarized illumination method in which the linear polarization is effected in a tangential (circumferential) direction of a circle having a center of the optical axis as disclosed in Japanese Patent Application Laid-open No. 6-53120 as well as the linear polarized illumination (S-polarized illumination) adjusted to the longitudinal direction of the line pattern of the mask (reticle). In particular, when the pattern of the mask (reticle) includes not only the line pattern which extends in a predetermined one direction but the pattern also includes line patterns which extend in a plurality of directions in a mixed manner, then the high image formation performance can be obtained even when the numerical aperture NA of the projection optical system is large, by using, in combination, the zonal illumination method and the polarized illumination method in which the linear polarization is effected in a tangential direction of a circle having a center of the optical axis as disclosed in Japanese Patent Application Laid-open No. 6-53120 as well.

In the embodiment of the present invention, the optical element 2 is attached to the end portion of the projection optical system PL. The lens can be used to adjust the optical characteristics of the projection optical system PL, including, for example, the aberration (for example, spherical aberration and coma aberration). The optical element, which is attached to the end portion of the projection optical system PL, may be an optical plate to be used to adjust the optical characteristic of the projection optical system PL. Alternatively, the optical element may be a plane parallel plate through which the exposure light beam EL is transmissive. In this case, the liquid LQ may be arranged on both of the side of the substrate P and the side of the mask M of the plane parallel plate. In particular, when the numerical aperture NA of the projection optical system PL is not less than 1, the liquid is also required on the side of the mask M of the plane parallel plate.

When the pressure, which is generated by the flow of the liquid LQ, is large between the substrate P and the optical element disposed at the end portion of the projection optical system PL, it is also allowable that the optical element is tightly fixed so that the optical element is not moved by the pressure, instead of allowing the optical element to be exchangeable.

The embodiment of the present invention is constructed such that the space between the projection optical system PL and the surface of the substrate P is filled with the liquid LQ. However, for example, another construction may be adopted such that the space is filled with the liquid LQ in a state in which a cover glass formed of a plane parallel plate is attached to the surface of the substrate P.

The exposure apparatus, to which the liquid immersion method is applied as described above, is constructed such that the optical path space, which is disposed on the light-exit side of the optical element 2 of the projection optical system PL, is filled with the liquid (pure water) to expose the substrate P. However, as disclosed in International Publication No. 2004/019128, it is also allowable that the optical path space, which is disposed on the light-incident side of the optical element 2 of the projection-optical system PL, is filled with the liquid (pure water). In this case, the member, which makes contact with the liquid disposed in the optical path space on the light-incident side of the optical element 2, may be subjected to the optical cleaning treatment as described above. Further, the radiation light beam Lu for the optical cleaning treatment may be used for the sterilization of the liquid disposed on the light-incident side of the optical element 2.

The liquid LQ is water in the embodiment of the present invention. However, the liquid LQ may be any liquid other than water. For example, when the light source of the exposure light beam EL is the $F_2$ laser, the $F_2$ laser beam is not transmitted through water. Therefore, in this case, liquids preferably usable as the liquid LQ may include, for example, a fluorine-based fluid such as fluorine-based oil and perfluoropolyether (PFPE) through which the $F_2$ laser beam is transmissive. In this case, the portion which makes contact with the liquid LQ is subjected to the liquid-attracting treatment by forming a thin film, for example, with a substance having a molecular structure of small polarity including fluorine. Alternatively, other than the above, it is also possible to use, as the liquid LQ, liquids (for example, cedar oil) which have the transmittance with respect to the exposure light beam EL, which have the refractive index as high as possible, and which are stable against the photoresist coated on the surface of the substrate P and the projection optical system PL. Also in this case, the surface treatment is performed depending on the polarity of the liquid LQ to be used. It is also possible to use various fluids having desired refractive indexes, for example, any supercritical fluid or any gas having a high refractive index, in place of pure water for the liquid LQ.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic silica glass, silicon wafer) for the mask or the reticle to be used for the exposure apparatus.

As for the exposure apparatus EXS, the present invention is also applicable to the scanning type exposure apparatus (scanning stepper) based on the step-and-scan system for performing the scanning exposure with the pattern of the mask M by synchronously moving the mask M and the substrate P as well as the projection exposure apparatus (stepper) based on the step-and-repeat system for performing the full field exposure with the pattern of the mask M in a state in which the mask M and the substrate P are allowed to stand still, while successively step-moving the substrate P. The embodiments described above are illustrative of the exposure apparatus provided with the projection optical system PL by way of example. However, the present invention is also applicable to the exposure apparatus provided with no projection optical system PL. The present invention is also applicable to the exposure apparatus (lithography system) in which a line-and-space pattern is formed on a wafer W by forming interference fringes on the wafer W, as disclosed in International Publication No. 2001/035168. In the embodiments described above, the light-transmissive type mask (reticle) is used, in which a predetermined light-shielding pattern (or a phase pattern or a light-reducing or dimming pattern) is formed on the light-transmissive substrate. However, in place of the reticle, for example, as disclosed in U.S. Pat. No. 6,778,257, it is also allowable to use an electronic mask for forming a transmissive pattern, a reflective pattern, or a light-emitting pattern on the basis of the electronic data of the pattern to be subjected to the exposure.

As for the exposure apparatus EXS, the present invention is also applicable to the exposure apparatus of such a system that the substrate P is subjected to the full field exposure with a reduction image of a first pattern in a state in which the first pattern and the substrate P are allowed to substantially stand still by using a projection optical system (for example, a dioptric type projection optical system having a reduction magnification of ⅛ and including no catoptric element). In this case, the present invention is also applicable to the full field exposure apparatus based on the stitch system in which the substrate P is thereafter subjected to the full field exposure with a reduction image of a second pattern while being partially overlaid with the first pattern in a state in which the second pattern and the substrate P are allowed to substantially stand still by using the projection optical system. As for the exposure apparatus based on the stitch system, the present invention is also applicable to the exposure apparatus based on the step-and-stitch system in which at least two patterns are partially overlaid and transferred on the substrate P, and the substrate P is successively moved.

In the embodiments described above, the exposure apparatus is adopted, in which the space between the projection optical system PL and the substrate P is locally filled with the liquid. However, the present invention is also applicable to a liquid immersion exposure apparatus in which the entire surface of the substrate as the exposure objective is covered with the liquid. The structure and the exposure operation of the liquid immersion exposure apparatus in which the entire surface of the substrate as the exposure objective is covered with the liquid are described in detail, for example, in Japanese Patent Application Laid-open Nos. 6-124873 and 10-303114 and U.S. Pat. No. 5,825,043, contents of which are incorporated herein by reference within a range of permission of the domestic laws and ordinances of the state designated or selected in this international application.

As for the type of the exposure apparatus EXS, the present invention is not limited to the exposure apparatus for the semiconductor device production for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor for the stage is disclosed in U.S. Pat. Nos. 5,623,853 and 5,528,118, contents of which are incorporated herein by reference respectively within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this case, any one of the magnet unit and the armature unit is connected to the stage PST, MST, and the other of the magnet unit and the armature unit is provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), contents of which are incorporated herein by reference within a range of permission of the domestic laws and ordinances of the state designated or selected in this international application.

The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), contents of which incorporated herein by reference within a range of permission of the domestic laws and ordinances of the state designated or selected in this international application.

As described above, the exposure apparatus EXS according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 17:
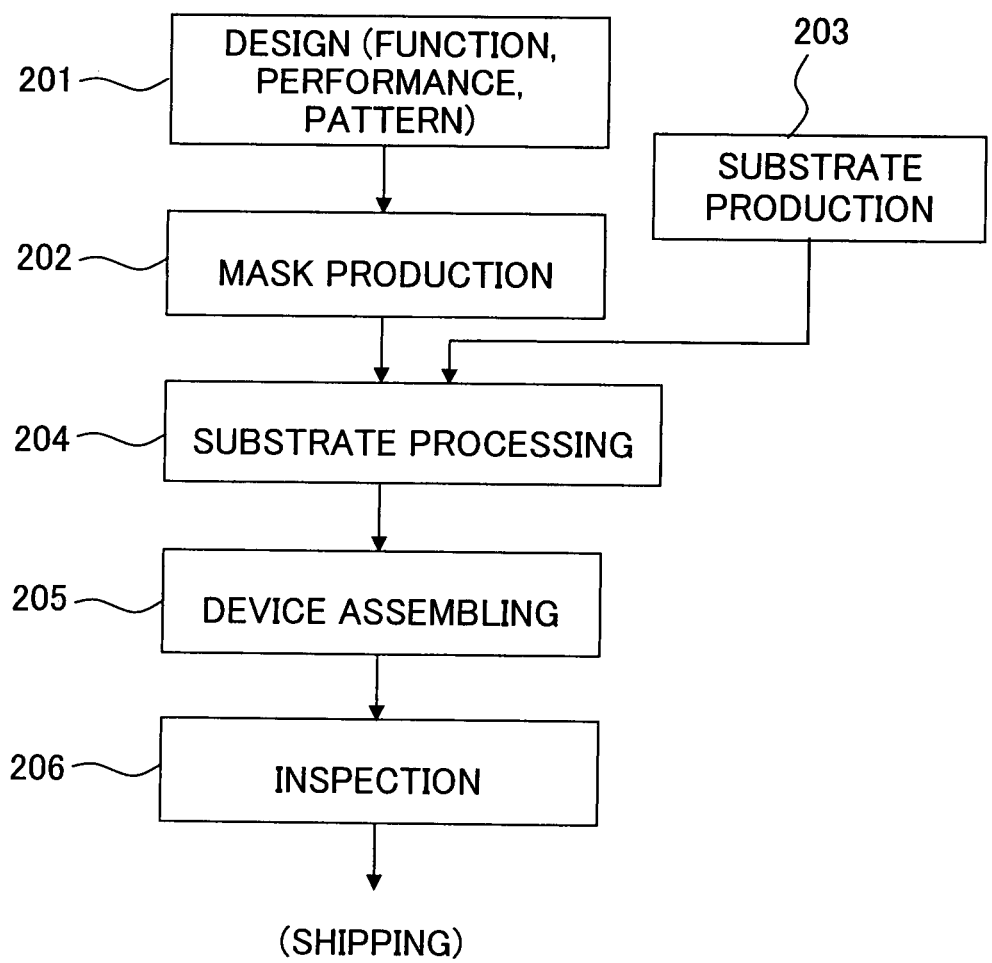
FIG. 17 shows a flow chart illustrating exemplary steps of producing a semiconductor device.

As shown in FIG. 17, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EXS of the embodiment described above, a step 205 of assembling the device (including a dicing step, a bonding step, and a packaging step), and an inspection step 206. The exposure process step includes the optical cleaning process as described above and the development process for the exposed substrate.

INDUSTRIAL APPLICABILITY

According to the present invention, it is possible to avoid the deterioration of the exposure apparatus. In particular, it is possible to avoid the deterioration of the performance of the exposure apparatus which would be otherwise caused by the pollution of the member which makes contact with the liquid to form the liquid immersion area.

The invention claimed is:

1. An exposure apparatus, comprising:
a radiation system that supplies a beam of radiation;
a substrate table that supports a substrate coated with a resist;
a liquid supply system which supplies a liquid from a supply port;
a projection system that projects a patterned beam of radiation onto the substrate through the liquid supplied from the supply port during an exposure process; and
a controller that controls the radiation system and the substrate table to cause the exposure process and a cleaning process to be performed at different times, wherein
at least a part of the substrate table that comprises a sensor is coated with a coating, the coating comprising a metal oxide or a photocatalyst, and the coating is exposed to the liquid supplied from the supply port, and
a cleaning beam is supplied to the substrate table through a liquid when the substrate coated with the resist is not supported by the substrate table in order to clean the substrate table during the cleaning process.

2. The exposure apparatus according to claim 1, wherein the sensor is a radiation dose sensor or a transmission image sensor.

3. The exposure apparatus according to claim 2, wherein the sensor is the transmission image sensor.

4. The exposure apparatus according to claim 1, wherein the coating comprises titanium dioxide.

5. The exposure apparatus according to claim 1, wherein the substrate table has an area which supports the substrate and the sensor is located outside of the area.

6. The exposure apparatus according to claim 5, wherein the sensor has an upper surface that is coated with the coating.

7. The exposure apparatus according to claim 6, wherein the upper surface of the sensor is substantially co-planar with an upper surface of the substrate supported by the substrate table.

8. The exposure apparatus according to claim 1, further comprising an optical cleaning device which cleans the substrate table by supplying the cleaning beam to the substrate table through the liquid.

9. The exposure apparatus according to claim 8, wherein the cleaning device supplies the cleaning beam to the substrate table when the substrate table is moved away from under the projection system.

10. The exposure apparatus according to claim 1, further comprising a member having at least one of the supply port which supplies immersion liquid and a recovery port which recovers the supplied immersion liquid, and further comprising a sonic transducer which cleans the member.

11. The exposure apparatus according to claim 1, wherein the sensor is mounted on the substrate table.

12. The exposure apparatus according to claim 1, wherein the sensor is coated with the coating.

13. The exposure apparatus according to claim 1, wherein the coating comprises the metal oxide.

14. The exposure apparatus according to claim 1, wherein the coating comprises the photocatalyst.

15. The exposure apparatus according to claim 1, wherein the cleaning beam is supplied from the radiation system to the substrate table through the liquid supplied from the supply port of the liquid supply system during the cleaning process.

16. The exposure apparatus according to claim 1, wherein the liquid, through which the cleaning beam is supplied to the substrate table, includes water.

17. A device manufacturing method, comprising:
supplying a liquid from a supply port;
supporting a substrate coated with a resist on a substrate table comprising a sensor, at least a part of the substrate table that comprises the sensor being coated with a coating, the coating comprising a metal oxide or a photocatalyst;

supplying a beam of radiation from a radiation system;
patterning the beam of radiation;
projecting the patterned beam of radiation onto the substrate through the liquid supplied from the supply port during an exposure process; and
cleaning the substrate table when the substrate coated with the resist is not supported by the substrate table by supplying a cleaning beam through the liquid to the substrate table during a cleaning process,
wherein the exposure process and the cleaning process are performed at different times.

18. The device manufacturing method according to claim 17, wherein the sensor is a radiation dose sensor or a transmission image sensor.

19. The device manufacturing method according to claim 17, wherein the coating comprises titanium dioxide.

20. The device manufacturing method according to claim 17, wherein the substrate table has an area which supports the substrate and the sensor is located outside of the area.

21. The device manufacturing method according to claim 20, wherein the sensor has an upper surface that is coated with the coating.

22. The device manufacturing method according to claim 21, wherein the upper surface of the sensor is substantially co-planar with an upper surface of the substrate supported by the substrate table.

23. The device manufacturing method according to claim 17, wherein the coating comprises the metal oxide.

24. The device manufacturing method according to claim 17, wherein the coating comprises the photocatalyst.

25. The device manufacturing method according to claim 17, wherein the sensor is mounted on the substrate table.

26. The device manufacturing method according to claim 17, wherein the sensor is coated with the coating.

27. The device manufacturing method according to claim 17, further comprising:
moving the substrate table away from under a projection system to a position at which the cleaning beam is supplied to the substrate table through the liquid to clean the substrate table.

28. The device manufacturing method according to claim 17, wherein the cleaning beam is supplied from the radiation system to the substrate table through the liquid supplied from the supply port during the cleaning process.

29. The device manufacturing method according to claim 17, wherein the liquid, through which the cleaning beam is supplied to the substrate table, includes water.

* * * * *